United States Patent
Iida et al.

(10) Patent No.: US 8,610,112 B2
(45) Date of Patent: Dec. 17, 2013

(54) CHARGE-TRANSPORTING POLYMER, COMPOSITION FOR ORGANIC ELECTROLUMINESCENT ELEMENT, ORGANIC ELECTROLUMINESCENT ELEMENT, ORGANIC EL DISPLAY, AND ORGANIC EL LIGHTING

(75) Inventors: Koichiro Iida, Kanagawa (JP); Haruhiko Kusaka, Kanagawa (JP); Kyoko Endo, Kanagawa (JP); Yanjun Li, Kanagawa (JP); Kazuki Okabe, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 266 days.

(21) Appl. No.: 13/058,675

(22) PCT Filed: Aug. 10, 2009

(86) PCT No.: PCT/JP2009/064134
§ 371 (c)(1),
(2), (4) Date: May 6, 2011

(87) PCT Pub. No.: WO2010/018813
PCT Pub. Date: Feb. 18, 2010

(65) Prior Publication Data
US 2011/0198573 A1    Aug. 18, 2011

(30) Foreign Application Priority Data

Aug. 11, 2008    (JP) .................................. 2008-207411

(51) Int. Cl.
*H01L 35/24*    (2006.01)

(52) U.S. Cl.
USPC .................................... 257/40; 257/E51.001

(58) Field of Classification Search
USPC ............................................ 257/40, E51.001
See application file for complete search history.

(56) References Cited

U.S. PATENT DOCUMENTS 5,929,194 A    7/1999    Woo et al.
(Continued)

FOREIGN PATENT DOCUMENTS

JP    2006 503167    1/2006
(Continued)

OTHER PUBLICATIONS

Office Action issued Mar. 12, 2012, in Chinese Patent Application No. 200980128784.3 (with English-language translation).
(Continued)

*Primary Examiner* — Anthony Ho
(74) *Attorney, Agent, or Firm* — Oblon, Spivak, McClelland, Maier & Neustadt, L.L.P.

(57) ABSTRACT

A subject for the invention is to provide a charge-transporting polymer having high hole-transporting ability and excellent solubility and film-forming properties and a composition for organic electroluminescent element which contains the charge-transporting polymer. Another subject for the invention is to provide an organic electroluminescent element which has a high current efficiency and high driving stability. The charge-transporting polymer comprises a group represented by the following formula (1) as a side chain:

[Chem. 1]

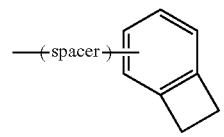

(1)

wherein in formula (1), the benzocyclobutene ring may have one or more substituents. The substituents may be bonded to each other to form a ring. The spacer represents a group which links the benzocyclobutene ring to the main chain of the charge-transporting polymer through three or more single bonds.

17 Claims, 2 Drawing Sheets

(56) References Cited

U.S. PATENT DOCUMENTS

| | | | |
|---|---|---|---|
| 2004/0054152 A1 | 3/2004 | Meerholz et al. |
| 2004/0076911 A1 | 4/2004 | So et al. |
| 2005/0228147 A1 | 10/2005 | So et al. |
| 2009/0212693 A1 | 8/2009 | Yamada |
| 2009/0315453 A1 | 12/2009 | Kobayashi et al. |

FOREIGN PATENT DOCUMENTS

| | | |
|---|---|---|
| JP | 2007 224026 | 9/2007 |
| JP | 2008 106241 | 5/2008 |
| JP | 2009 117800 | 5/2009 |
| JP | 2009 158535 | 7/2009 |
| TW | 200413842 | 8/2004 |
| WO | 02 10129 | 2/2002 |
| WO | 2008 032843 | 3/2008 |
| WO | 2008 038747 | 4/2008 |

OTHER PUBLICATIONS

Office Action issued Oct. 11, 2012 in Japanese Patent Application No. 2009-185119 (with English-language translation).

International Search Report issued Sep. 8, 2009 in PCT/JP09/64134 filed Aug. 10, 2009.

Jungermann, Steffen et al., "Novel Photo-Cross-Linkable Hole-Transporting Polymers: Synthesis, Characterization, and Application in Organic Light Emitting Diodes", Macromolecules, vol. 39, No. 26, pp. 8911-8919, (2006).

Ma, Biwu et al., "New Thermally Cross-Linkable Polymer and Its Application as a Hole-Transporting Layer for Solution Processed Multilayer Organic Light Emitting Diodes", Chem., Mater., vol. 19, No. 19, pp. 4827-4832, (2007).

Supplementary European Search Report issued Jun. 25, 2013 in Application No. EP 09 80 6704.

Taiwanese Office Action in corresponding application No. 098126902 dated Oct. 11, 2013.

CHARGE-TRANSPORTING POLYMER, COMPOSITION FOR ORGANIC ELECTROLUMINESCENT ELEMENT, ORGANIC ELECTROLUMINESCENT ELEMENT, ORGANIC EL DISPLAY, AND ORGANIC EL LIGHTING

TECHNICAL FIELD

The present invention relates to a charge-transporting polymer, a composition for organic electroluminescent element which contains the charge-transporting polymer, and an organic electroluminescent element which has a layer formed by crosslinking the charge-transporting polymer and has a high current efficiency and a long working life.

BACKGROUND ART

Electroluminescent elements (organic electroluminescent elements) employing an organic thin film are being developed in recent years. Examples of methods for forming an organic thin film for use in an organic electroluminescent element include a vacuum deposition method and a wet film formation method.

The vacuum deposition method has an advantage that since superposition of layers by this method is easy, it is easy to improve charge injection from the anode and/or cathode or to confine excitons in the luminescent layer. The wet film formation method has advantages, for example, that no vacuum process is necessary and film formation in a larger area is easy, and that it is easy to mix and incorporate a plurality of materials having various functions into one layer (composition).

However, since superposition of layers by the wet film formation method is difficult, elements produced using the wet film formation method are inferior in driving stability to elements produced using the vacuum deposition method and have not reached a practical level at present except some of these. In particular, in layer superposition by the wet film formation method, it is possible to superpose two layers, for example, by using an organic solvent and an aqueous solvent. However, it has been difficult to superpose three or more layers by the method.

In patent document 1, a polymer having an oxetane group as a crosslinkable group as shown below has been proposed in order to overcome such problems encountered in layer superposition, and a layer obtained by coating this polymer and reacting the oxetane group is disclosed. It is disclosed therein that the layer has been rendered insoluble in organic solvents and it is therefore possible to superpose another layer on that layer. However, the element obtained by this method has had a problem that the element increases in operating voltage during voltage application thereto at a constant current or decreases in luminance stability during voltage application thereto, resulting in a short working life. Furthermore, that method has had a problem that a flat layer is not formed and the luminescent surface of the element obtained is not even.

[Chem. 1]

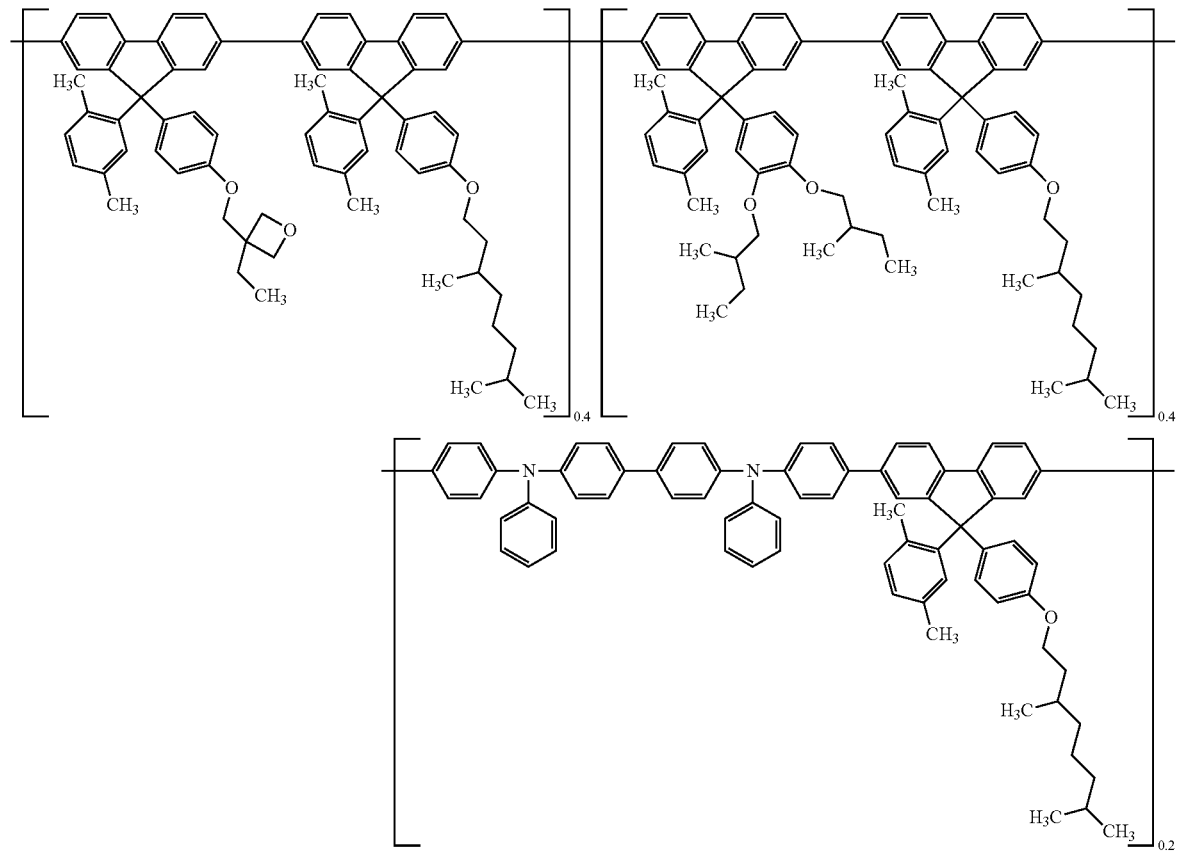

Patent document 1 and non-patent document 1 disclose the charge-transporting polymer represented by the following structure, in which oxetane groups have been bonded to the main chain of the charge-transporting polymer through a spacer group. However, the element formed using the polymer disclosed in these documents has had a problem that the working life thereof is short.

[Chem. 2]

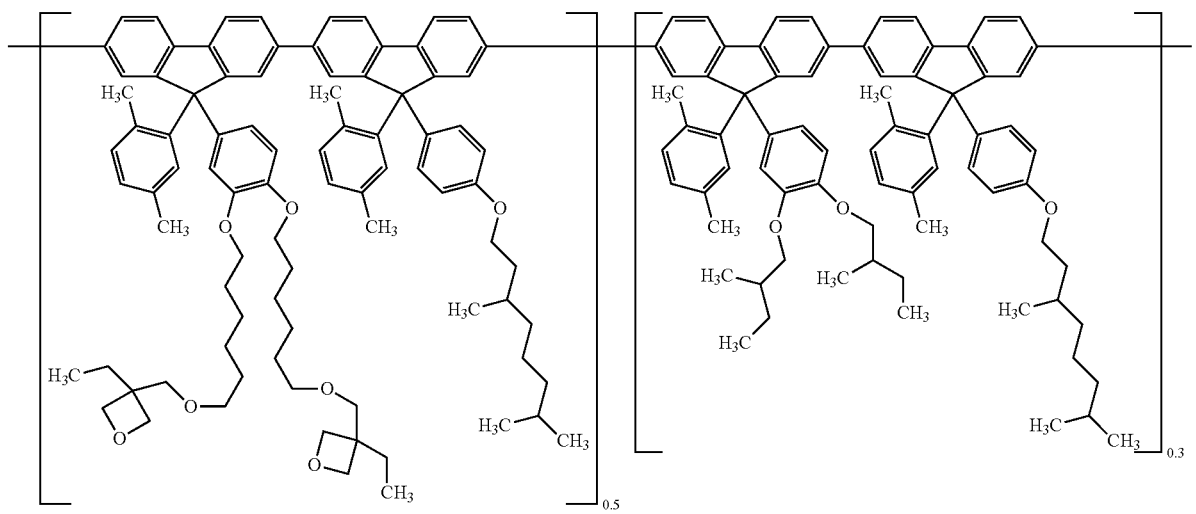

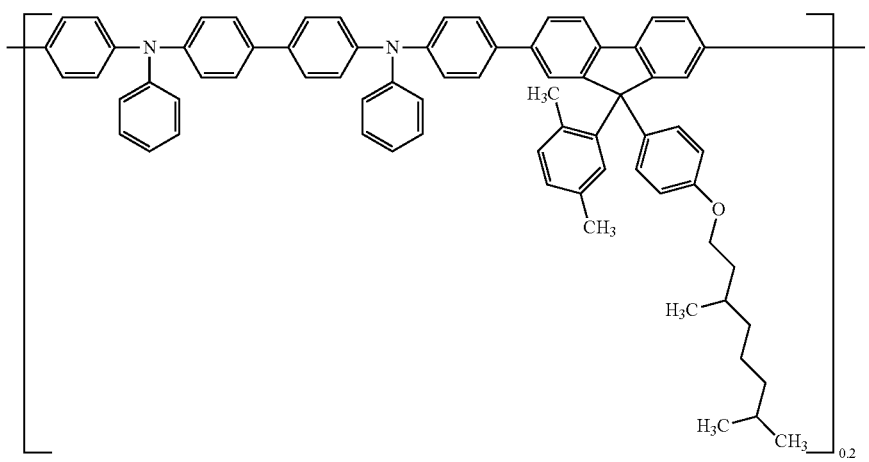

Meanwhile, patent document 2, patent document 3, and non-patent document 2 disclose a polymer having benzocyclobutene-ring-derived groups as crosslinkable groups, as shown below. However, the polymer disclosed in these documents has had a problem that the element obtained has an increased operating voltage and has a short working life. There also has been a problem that the luminescent surface is not even and the element obtained has a reduced current efficiency.

[Chem. 3]

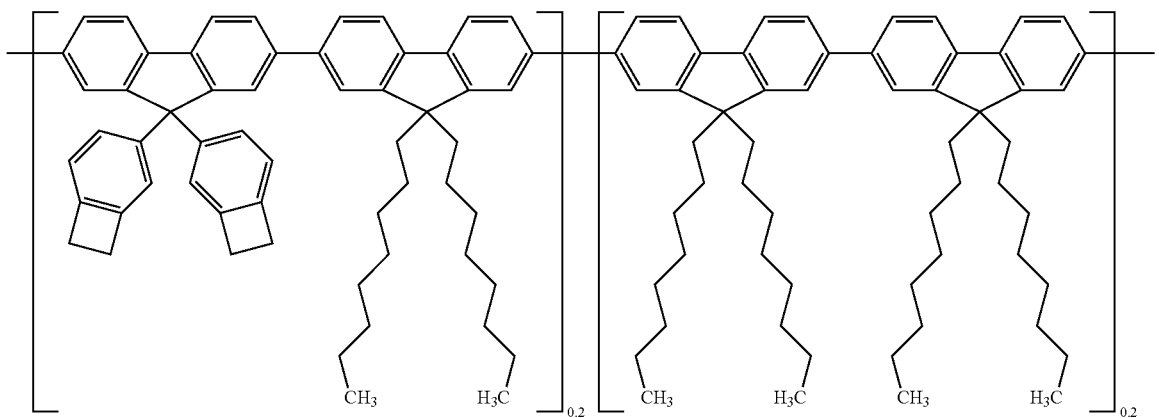

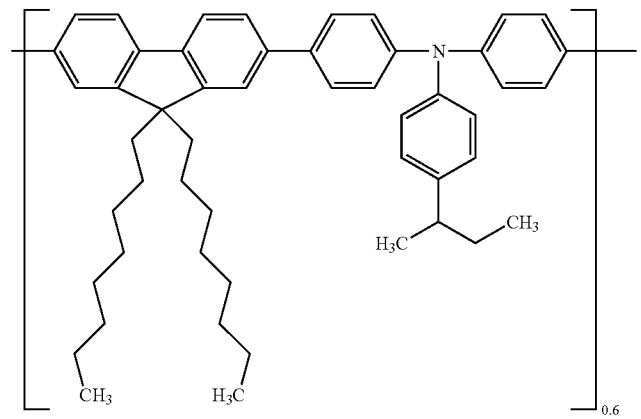

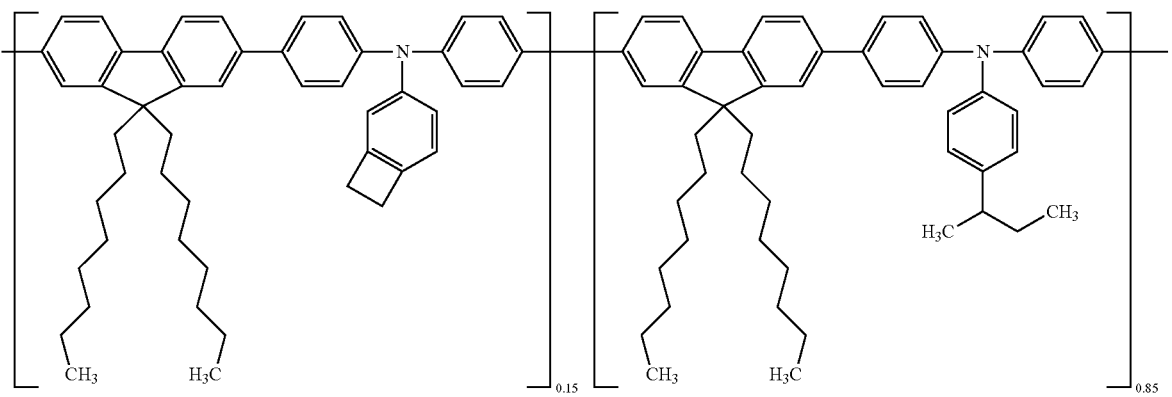

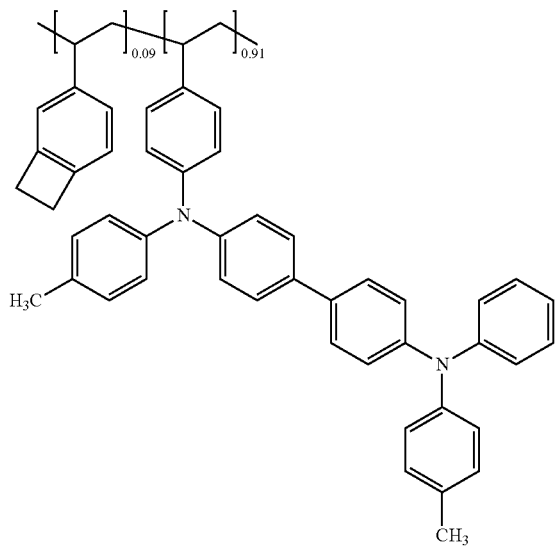

There has hence been a desire for an organic electroluminescent element which has an even luminescent surface and has a high electric-power efficiency, low operating voltage, and long working life.

PRIOR-ART DOCUMENTS

Patent Documents

Patent Document 1: International Publication No. 2002/10129, pamphlet
Patent Document 2: International Publication No. 2008/032843, pamphlet
Patent Document 3: International Publication No. 2008/038747, pamphlet Non-Patent Documents Non-Patent Document 1: *Macromolecules*, Vol. 39, p. 8911, 2006
Non-Patent Document 2: *Chemistry of materials*, Vol. 19, p. 4827, 2007

SUMMARY OF THE INVENTION

Problems that the Invention is to Solve

A subject for the invention is to provide an organic electroluminescent element which had an even luminescent surface and has a high electric-power efficiency, low operating voltage, and long working life.

Means for Solving the Problems

The present inventors diligently made investigations in order to overcome the problems described above. As a result, the inventors found that the layer formed using a compound having a cationically polymerizable group, e.g., an oxetane group, exerts an adverse influence on element characteristics because the cationically polymerizable group and a crosslinking reaction initiator which remain unreacted are decomposed during voltage application.

It was also found that aggregation of polymer main chains occur to affect film-forming properties and the flatness of the film.

Based on these findings, the inventors then attempted to design molecules. As a result, the inventors have found that a charge-transporting polymer having a group represented by the following formula (1) as a side chain does not exert those influences and gives an element having a high electric-power efficiency, low operating voltage, and long working life. The invention has been thus achieved.

Namely, the invention provides: a charge-transporting polymer characterized by having a group represented by the following formula (1) as a side chain; and a composition for organic electroluminescent element, an organic electroluminescent element, and an organic EL display and organic EL lighting which each contain the polymer or have been produced using the polymer.

[Chem. 4]

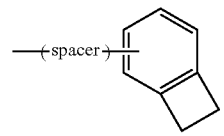

(1)

(In formula (1), the benzocyclobutene ring may have one or more substituents. The substituents may be bonded to each other to form a ring. In the case where the charge-transporting polymer has a plurality of groups represented by formula (1) per molecule, these groups represented by formula (1) may be the same or different.)

Configurations of the invention are shown below.

[1]

A charge-transporting polymer comprising a group represented by the following formula (1) as a side chain.

[Chem. 5]

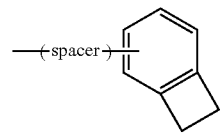

(1)

(The benzocyclobutene ring in formula (1) may have one or more substituents. The substituents may be bonded to each other to form a ring. The spacer represents a group which links the benzocyclobutene ring to the main chain of the charge-transporting polymer through three or more single bonds.)

[2]

The charge-transporting polymer according to [1] above, wherein the group represented by formula (1) is a group represented by the following formula (2).

[Chem. 6]

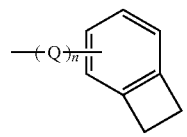

(2)

(In formula (2), the divalent group Q represents a group selected from the group consisting of —CR$^1$R$^2$—, —O—, —CO—, —NR$^3$—, and —S—, and n represents a natural number of 2-30.

R$^1$ to R$^3$ each independently represent a hydrogen atom or an alkyl group which may have a substituent.

The number n of Qs may be the same or different.

The benzocyclobutene ring in formula (2) may have a substituent besides the divalent group Q.)

[3]

The charge-transporting polymer according to [2] above, wherein the group represented by formula (2) is a group represented by the following formula (3).

[Chem. 7]

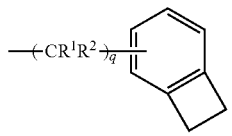

(3)

(In the formula, R$^1$ and R$^2$ each independently represent a hydrogen atom or an alkyl group which may have a substituent, and q represents a natural number of 2-30.

The number q of R$^1$s and the number q of R$^2$s each independently may be the same or different.

The benzocyclobutene ring in formula (3) may have a substituent besides the —(CR$^1$R$^2$)$_q$— group.)

[4]

The charge-transporting polymer according to any one of [1] to [3] above, which comprises, as a partial structure, a group having a monovalence or higher which is derived from a triarylamine structure.

[5]

The charge-transporting polymer according to any one of [1] to [4] above, which comprises, as a partial structure, a group having a monovalence or higher which is derived from a fluorene ring.

[6]

The charge-transporting polymer according to any one of [1] to [5] above, which has a weight-average molecular weight (Mw) of 20,000 or higher and a distribution (Mw/Mn) of 2.5 or less.

(Mn represents the number-average molecular weight.)

[7]

the Charge-Transporting Polymer According to any One of [1] to [6] Above, which comprises a repeating unit represented by the following formula (4).

[Chem. 8]

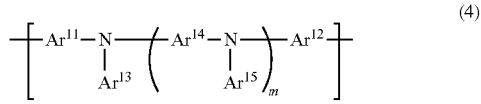

(4)

(In the formula, m represents an integer of 0-3,

Ar$^{11}$ and Ar$^{12}$ each independently represent a direct bond, an aromatic hydrocarbon group which may have a substituent, or an aromatic heterocyclic group which may have a substituent, and Ar$^{13}$ to Ar$^{15}$ each independently represent an aromatic hydrocarbon group which may have a substituent or an aromatic heterocyclic group which may have a substituent.

Ar$^{11}$ and Ar$^{12}$ are not direct bonds simultaneously.)

[8]

The charge-transporting polymer according to any one of [1] to [7] above, wherein the number of groups represented by formula (1) per molecule weight of 1,000 of the polymer is from 0.01 to 3.

(The molecular weight is a value which is calculated from the molar ratio and the structural formula of feed monomers for the charge-transporting polymer excluding the end groups.)

[9]

The charge-transporting polymer according to any one of [1] to [8] above, which comprises a group represented by the following formula (5).

[Chem. 9]

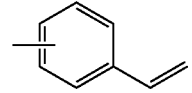

(5)

(In formula (5), the styryl group may have one or more substituents. The substituents may have been bonded to each other to form a ring.)

[10]

A composition for organic electroluminescent element, comprising the charge-transporting polymer according to any one of [1] to [9] above and a solvent.

[11]

The composition for organic electroluminescent element according to [10] above, which further comprises an electron-accepting compound.

[12]

An organic electroluminescent element which comprises a substrate and, provided thereon, an anode, a cathode, and an organic layer interposed between the anode and the cathode, wherein the organic layer comprises a layer formed by using and coating the composition for organic electroluminescent element according to [10] or [11] above and then crosslinking the charge-transporting polymer.

[13]

The organic electroluminescent element according to [12] above, wherein the layer formed by crosslinking of the charge-transporting polymer is at least one of a hole injection layer and a hole transport layer.

[14]

The organic electroluminescent element according to [12] or [13] above, which is an organic electroluminescent element including a hole injection layer, a hole transport layer, and a luminescent layer, in which all of the hole injection layer, the hole transport layer, and the luminescent layer are formed by a wet film formation method.

[15]

An organic EL display comprising the organic electroluminescent element according to any one of [12] to [14] above.

[16]

An organic EL lighting comprising the organic electroluminescent element according to any one of [12] to [14] above.

[17]

A charge-transporting polymer comprising, as a side chain, a group selected from the following <Groups A Represented by Formula (1)>.

<Groups A Represented by Formula (1)>

[Chem. 10]

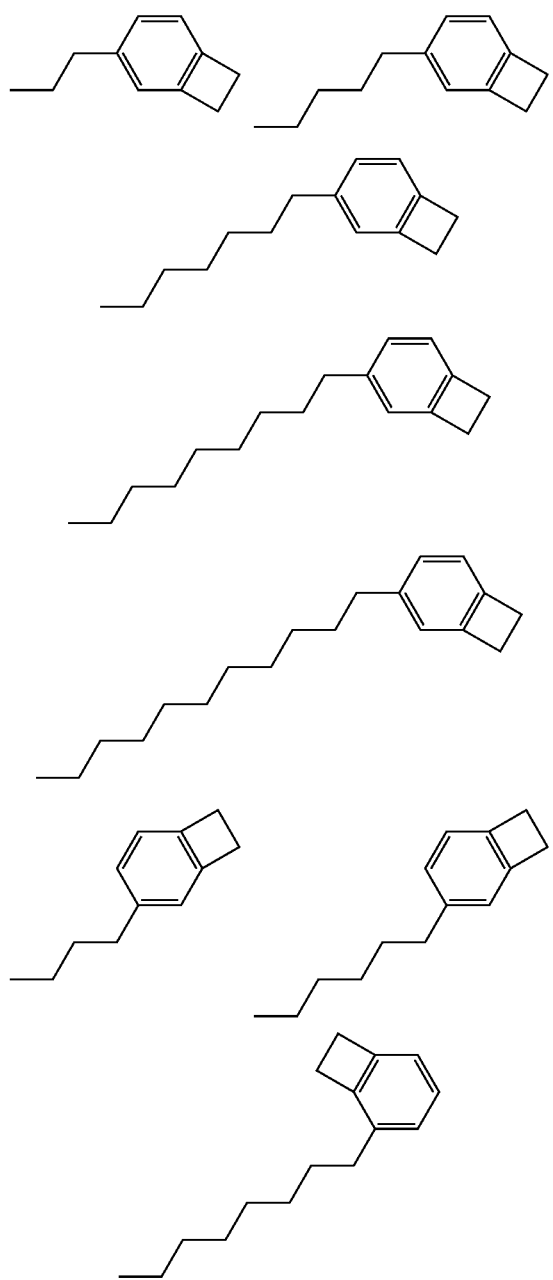
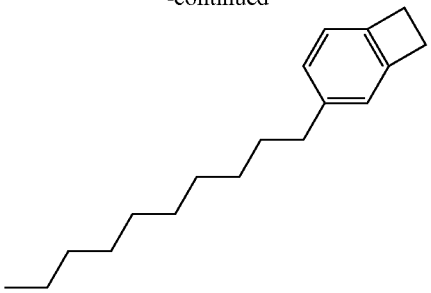

Effects of the Invention

The charge-transporting polymer of the invention has high hole-transporting ability, excellent solubility in organic solvents, and excellent film-forming properties and electrochemical stability and does not necessitate a crosslinking reaction initiator when subjected to crosslinking reaction.

Furthermore, the layer (crosslinked layer) obtained by forming a film by a wet process using the composition for organic electroluminescent element, which contains the charge-transporting polymer of the invention, and then crosslinking the charge-transporting polymer is only sparingly soluble in organic solvents and does not develop cracks or the like, and is obtained as a flat layer.

Consequently, the organic electroluminescent element having the layer obtained by forming a film by a wet process using the composition for organic electroluminescent element, which contains the charge-transporting polymer of the invention, and then crosslinking the charge-transporting polymer can be produced so as to have an increased area.

This organic electroluminescent element having the crosslinked layer according to the invention has a high electric-power efficiency, a low operating voltage, and a long working life.

MODES FOR CARRYING OUT THE INVENTION

Figure 1:
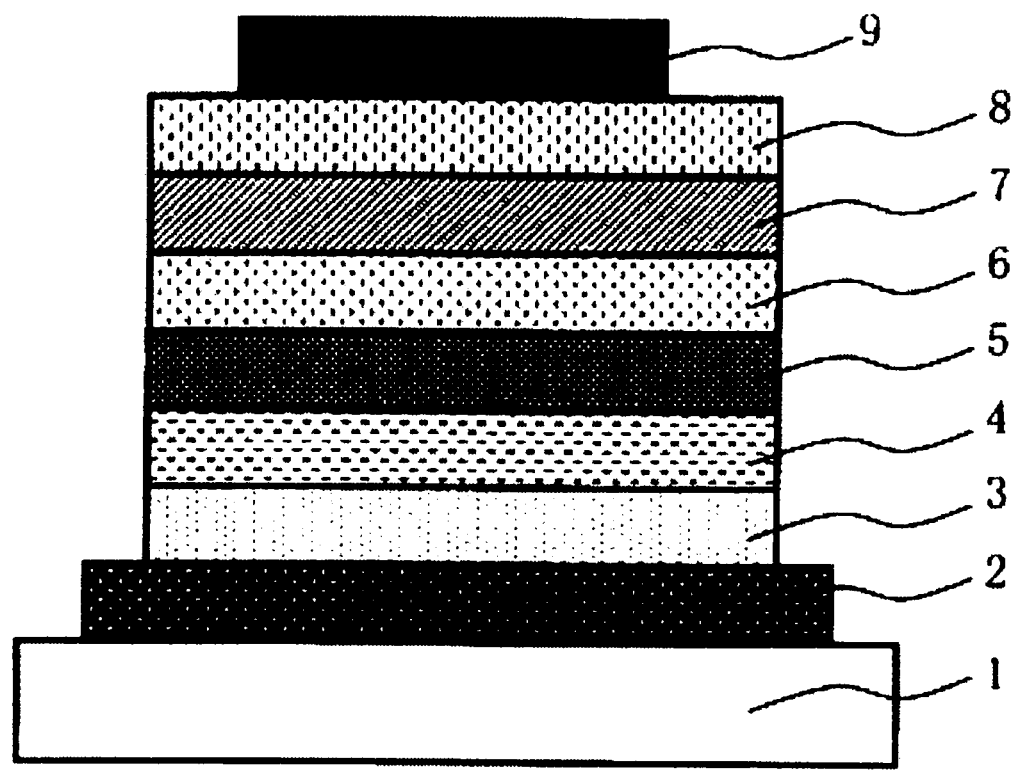
FIG. 1 is a sectional view diagrammatically illustrating an example of the structure of an organic electroluminescent element of the invention.
Figure 2:
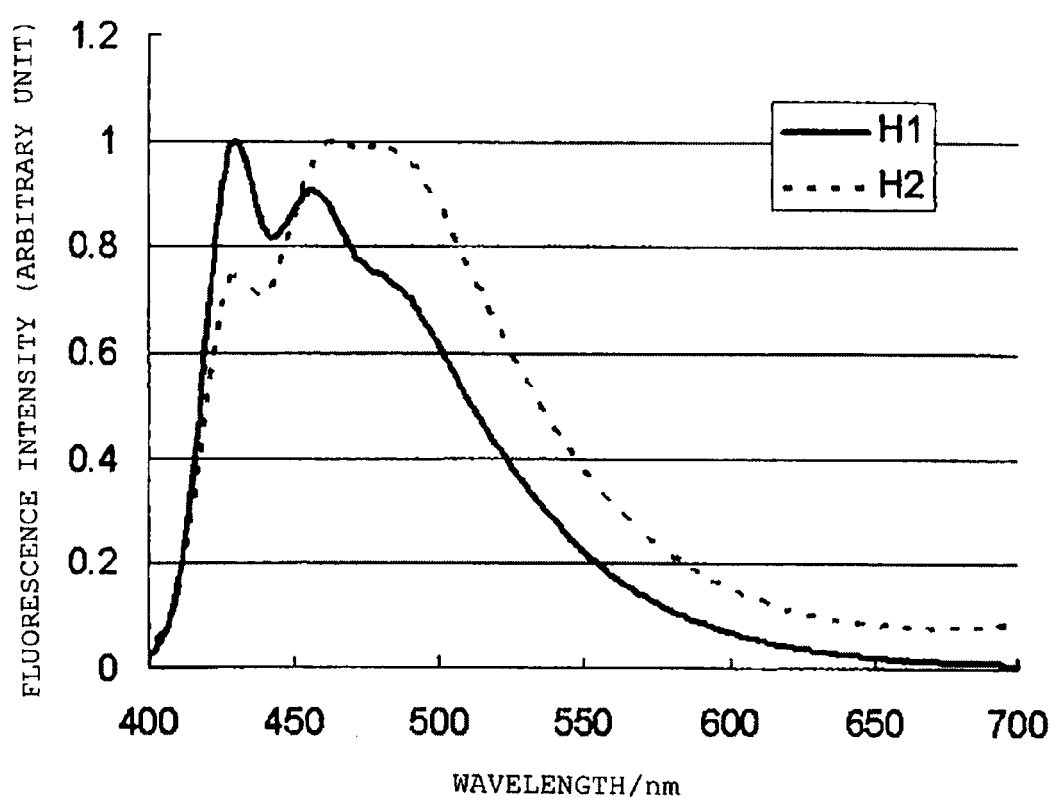
FIG. 2 is fluorescence spectra of the charge-transporting polymer (H1) synthesized in an Example and of comparative polymer 1 (H2). The ordinate indicates fluorescence intensity and the ordinate indicates the wavelength (nm) of absorbed light.

Modes for carrying out the invention will be explained below in detail. However, the following explanations on constituent elements are for embodiments (representative embodiments) of the invention, and the invention should not be construed as being limited to the embodiments unless the invention departs from the spirit thereof.

<Charge-Transporting Polymer>

The charge-transporting polymer of the invention is a charge-transporting polymer having a group represented by the following formula (1) as a side chain.

[Chem. 11]

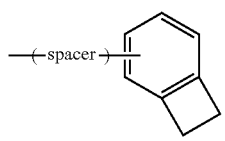

(1)

(The benzocyclobutene ring in formula (1) may have one or more substituents. The substituents may be bonded to each other to form a ring. The spacer represents a group which links the benzocyclobutene ring to the main chain of the charge-transporting polymer through three or more single bonds. In the case where the charge-transporting polymer has a plurality of groups represented by formula (1) per molecule, these groups represented by formula (1) may be the same or different.)

[1. With Respect to the Group Represented by Formula (1)]

The invention relates to a charge-transporting polymer in which a benzocyclobutene-ring-derived group which may have a substituent has been bonded as a side chain through a spacer group. Specifically, the polymer is a charge-transporting polymer having a group represented by the following formula (1) as a side chain.

[Chem. 12]

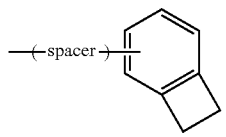

(1)

(The benzocyclobutene ring in formula (1) may have one or more substituents. The substituents may be bonded to each other to form a ring. The spacer represents a group which links the benzocyclobutene ring to the main chain of the charge-transporting polymer through three or more single bonds. In the case where the charge-transporting polymer has a plurality of groups represented by formula (1) per molecule, these groups represented by formula (1) may be the same or different.)

The term "spacer" as used in the invention (hereinafter referred to as "spacer group") means a group which links the benzocyclobutene ring to the main chain of the charge-transporting polymer usually through three or more single bonds.

The number of single bonds possessed by the spacer group is generally 3 or more, preferably 4 or more, and is generally 30 or less, preferably 20 or less.

When the number thereof is within that range, film cracking and aggregation of polymer main chains are less apt to occur and the polymer has satisfactory charge-transporting ability and heat resistance.

(1-1. With Respect to Substituent which may be Possessed by the Benzocyclobutene Ring in Formula (1))

The benzocyclobutene ring in formula (1) may have a substituent besides the spacer group, and examples of the substituent which may be possessed include the substituents shown in the section [Substituents Z], which will be given later.

It is preferred that the benzocyclobutene ring in formula (1) should have no substituent other than the spacer group, from the standpoint that in such benzocyclobutene ring, the influences of steric hindrance due to a substituent and of the electronic effect of a substituent on crosslinking reaction are slight.

In the case where the benzocyclobutene ring has substituents, it is preferred that the substituents should not have formed a ring, because such polymer has higher solubility before crosslinking. On the other hand, the benzocyclobutene ring in which the substituents have formed a ring is preferred because such polymer has higher heat resistance.

(1-2. With Respect to the Molecular Weight of Formula (1))

The molecular weight of the group represented by formula (1), including the substituent(s) thereof, is generally 130 or higher, and is generally 500 or lower, preferably 300 or lower.

When the molecular weight thereof is within that range, crosslinking reaction is less apt to result in film cracking and in aggregation of polymer main chains. Furthermore, that molecular-weight range is preferred also from the standpoint that the group of formula (1) does not affect charge-transporting ability.

(1-3. With Respect to Methods of Crosslinking the Group Represented by Formula (1))

The group represented by formula (1) is used usually as a crosslinkable group. The term "crosslinkable group" herein means a group which reacts with the same or a different group of a nearby molecule to form a new chemical bond. Examples thereof include a group which reacts, upon heating and/or irradiation with actinic energy rays, with the same or a different group of a nearby molecule to form a new chemical bond. Methods for crosslinking the group represented by formula (1) are the same as the methods which will be described later in the section [Methods of Film Formation] under <Organic Electroluminescent Element>.

[2. With Respect to Formula (2)]

It is preferred that the group represented by formula (1) should be a group represented by the following formula (2), from the standpoints that when the charge-transporting polymer of the invention is heated in order to conduct crosslinking reaction, the benzocyclobutene ring, which is a reaction site, can freely move and the crosslinking reaction proceeds efficiently, and that after the crosslinking reaction, the crosslinked main chains are sufficiently apart from one another and, hence, aggregation or cracking is less apt to occur.

[Chem. 13]

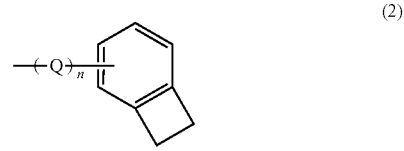

(2)

(In formula (2), the divalent group Q represents a group selected from the group consisting of —$CR^1R^2$—, —O—, —CO—, —$NR^3$—, and —S—, and n represents a natural number of 2-30.

$R^1$ to $R^3$ each independently represent a hydrogen atom or an alkyl group which may have a substituent.

The number n of Qs may be the same or different.

The benzocyclobutene ring in formula (2) may have a substituent besides the divalent group Q.

In the case where the charge-transporting polymer has a plurality of groups represented by formula (2) per molecule, the multiple groups represented by formula (2) may be the same or different.)

(2-1. With Respect to Q)

The divalent group Q in formula (2) represents a group selected from the group consisting of —$CR^1R^2$—, —O—, —CO—, —$NR^3$—, and —S— from the standpoint of enabling the benzocyclobutene ring to move freely upon heating and the standpoint that after crosslinking reaction, the crosslinked main chains can be sufficiently apart from one another. It is preferred that the Qs include —$CR^1R^2$— among those groups from the standpoint of attaining excellent electrical durability.

The number n of Qs may be the same or different.

(2-2. With Respect to $R^1$ to $R^3$)

$R^1$ to $R^3$ in formula (2) each are a hydrogen atom or an alkyl group which may have a substituent, and the alkyl group may be linear, branched, or cyclic.

In the case where any of $R^1$ to $R^3$ is an alkyl group which may have a substituent, examples of the alkyl group include alkyl groups in which the number of carbon atoms is generally 1 or more and is generally 20 or less, preferably 10 or less, including the carbon atoms of the substituent. Specific examples thereof include methyl, ethyl, n-propyl, 2-propyl, n-butyl, isobutyl, tert-butyl, and cyclohexyl. Preferred of these are methyl and ethyl.

It is preferred that $R^1$ to $R^3$ should be hydrogen atoms, from the standpoint of further improving charge-transporting ability and the standpoint that crosslinking reaction is less apt to result in film cracking or aggregating of polymer main chains.

In the case where $R^1$ to $R^3$ are alkyl groups, examples of the substituents which may be possessed by the alkyl groups include alkyl groups, alkoxy groups, and groups derived from a benzocyclobutene ring.

(2-3. With Respect to n)

Symbol n represents a natural number which is generally 2 or larger, preferably 4 or larger, and is generally 30 or smaller, preferably 20 or smaller.

In case where n is smaller than the lower limit, there is a possibility that crosslinking reaction might be apt to result in film cracking or aggregation of polymer main chains. When n is larger than the upper limit, there are cases where the polymer has reduced charge-transporting ability or reduced heat resistance.

(2-4. With Respect to Substituent which may be Possessed by the Benzocyclobutene Ring in Formula (2) besides the Divalent Group Q)

The benzocyclobutene ring in formula (2) may have a substituent besides the divalent group Q, and examples of the substituent which may be possessed are the same as the substituents shown above under (1-1. With Respect to Substituent which may be Possessed by the Benzocyclobutene Ring in Formula (1)). Preferred embodiments also are the same.

(2-5. With Respect to the Molecular Weight of Formula (2))

The molecular weight of formula (2) is the same as described above in the section (1-2. With Respect to the Molecular Weight of Formula (1)). Preferred embodiments also are the same.

[3. With Respect to Formula (3)]

It is preferred that the group represented by formula (2) should be a group represented by the following formula (3), from the standpoint that this polymer has excellent electrical durability.

[Chem. 14]

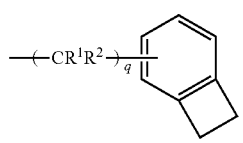

(3)

(In formula (3), $R^1$ and $R^2$ each independently represent a hydrogen atom or an alkyl group which may have a substituent, and q represents a natural number of 2-30.

The number q of $R^1$s and the number q of $R^2$s each independently may be the same or different.

In the case where the charge-transporting polymer has a plurality of groups represented by formula (3) per molecule, the multiple groups represented by formula (3) may be the same or different.

The benzocyclobutene ring in formula (3) may have a substituent besides the —$(CR^1R^2)_q$— group.)

(3-1. With Respect to $R^1$ and $R^2$)

$R^1$ and $R^2$ in formula (3) are the same as the $R^1$ and $R^2$ described above in the section (2-2. With Respect to $R^1$ to $R^3$). Preferred embodiments also are the same.

(3-2. With Respect to q)

Symbol q represents a natural number of 2-30.

Symbol q is the same as the n described above in the section (2-3. With Respect to n). Preferred embodiments also are the same.

(3-3. With Respect to Substituent which may be Possessed by the Benzocyclobutene Ring in Formula (3) besides —$(CR^1R^2)_q$— Group)

The benzocyclobutene ring in formula (3) may have a substituent besides the —$(CR^1R^2)_q$— group, and examples of the substituent which may be possessed are the same as the substituents shown above in the section (2-4. With Respect to Substituent which may be Possessed by the Benzocyclobutene Ring in Formula (2) besides the Divalent Group Q). Preferred embodiments also are the same.

(3-4. With Respect to the Molecular Weight of the Group Represented by Formula (3))

The molecular weight of the group represented by formula (3) is the same as described above in the section (2-5. With Respect to the Molecular Weight of Formula (2)). Preferred embodiments also are the same.

The group represented by formula (3) may be bonded to the partial structure suitable for charge transport, which will be described later, within the charge-transporting polymer or to a part other than the partial structure suitable for charge transport.

Specific examples of the group represented by formula (1) are shown below. However, the group in the invention should not be construed as being limited to the following examples.

Examples of the Group Represented by Formula (1)

[Chem. 15]

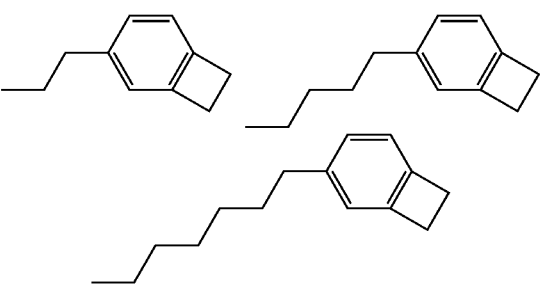

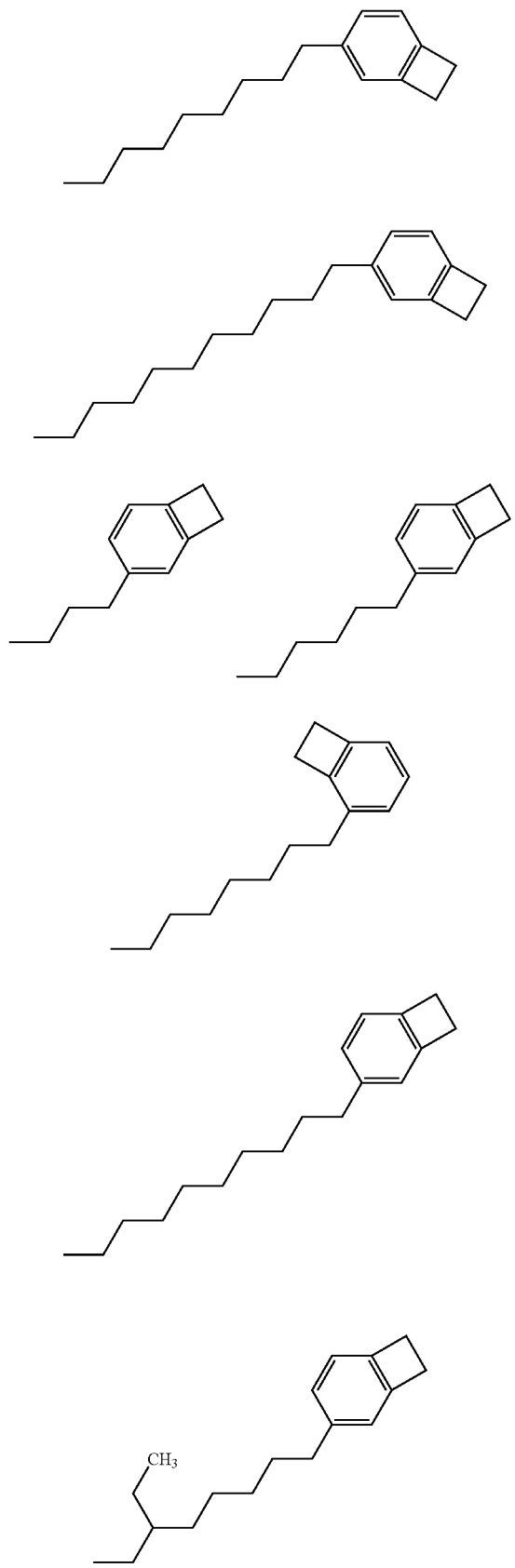
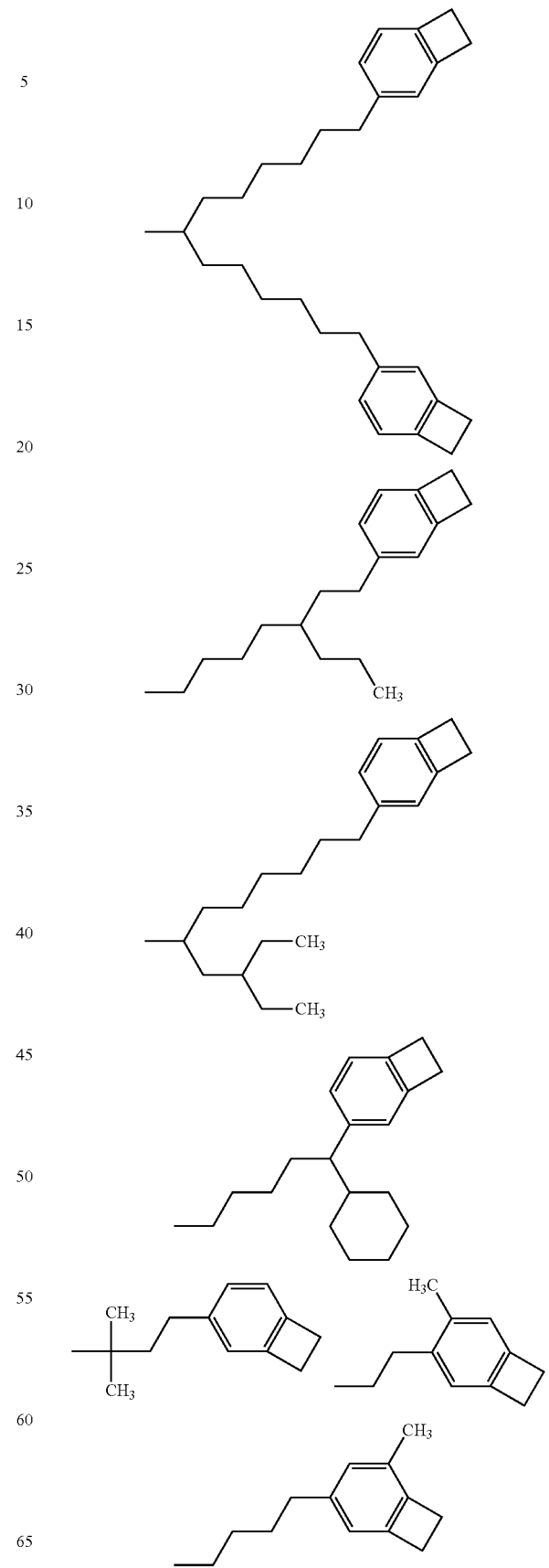

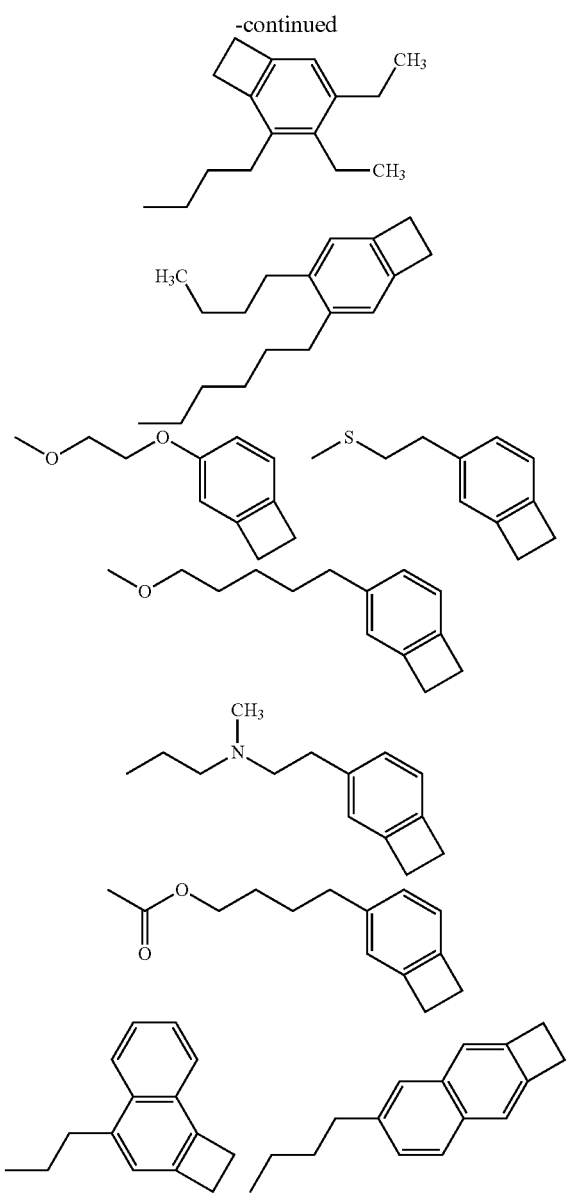

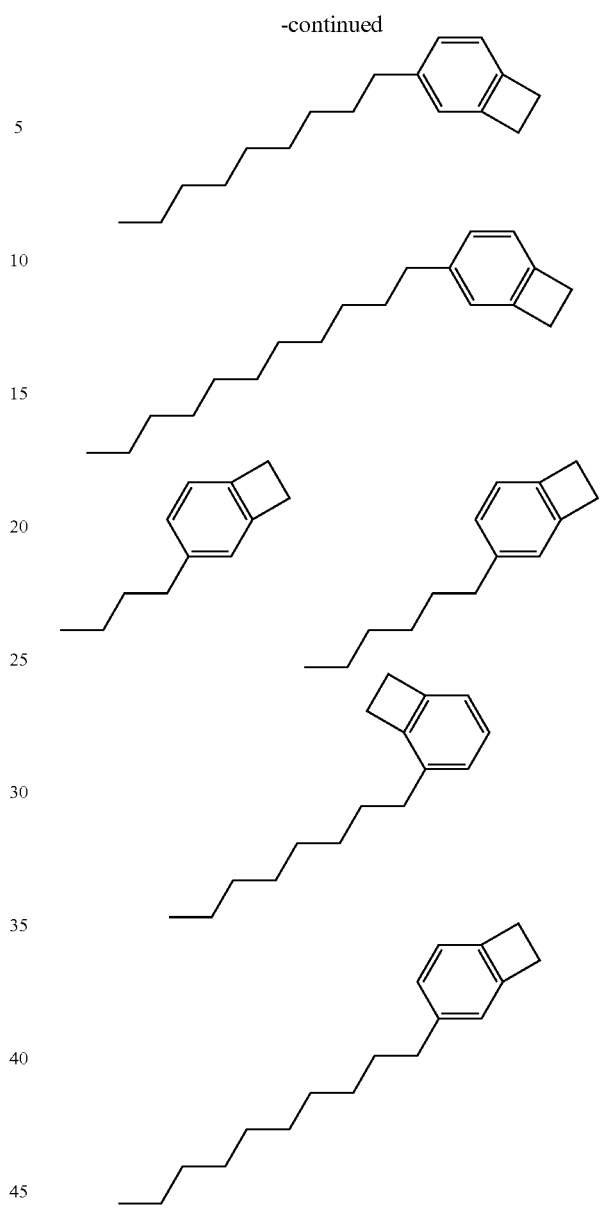

Of the specific examples of formula (1), the following <Groups A represented by Formula (1)> are especially preferred from the standpoint that these groups have excellent thermal and electrochemical stability.

<Groups A represented by Formula (1)>

[Chem. 16]

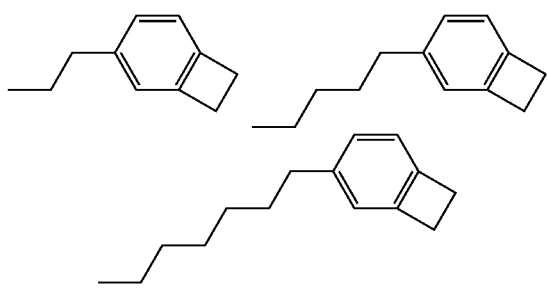

[4. With Respect to the Charge-Transporting Polymer]

The weight-average molecular weight (Mw) of the charge-transporting polymer of the invention is generally 3,000,000 or lower, preferably 1,000,000 or lower, more preferably 500,000 or lower, even more preferably 200,000 or lower, and is generally 1,000 or higher, preferably 2,500 or higher, more preferably 5,000 or higher, even more preferably 20,000 or higher.

In case where the weight-average molecular weight thereof exceeds the upper limit, there is a possibility that this polymer might have reduced solubility in solvents and hence have impaired film-forming properties. When the weight-average molecular weight thereof is lower than the lower limit, this charge-transporting polymer has a lowered glass transition temperature, lowered melting point, and lowered vaporization temperature and, hence, there are cases where the polymer has reduced heat resistance.

The number-average molecular weight (Mn) of the charge-transporting polymer of the invention is generally 2,500,000 or lower, preferably 750,000 or lower, more preferably 400, 000 or lower, and is generally 500 or higher, preferably 1,500 or higher, more preferably 3,000 or higher.

Furthermore, the distribution (Mw/Mn) of the charge-transporting polymer of the invention is preferably 3.5 or less, more preferably 2.5 or less, especially preferably 2.0 or less. The smaller the value of distribution, the better the polymer. Consequently, an ideal lower limit of the distribution is 1. When the distribution the charge-transporting polymer is within that range, this polymer is easy to purify and has satisfactory solubility in solvents and satisfactory charge-transporting ability.

Usually, the weight-average molecular weight is determined by SEC (size exclusion chromatography) analysis. In SEC analysis, components having higher molecular weights are eluted in shorter time periods, while components having lower molecular weights necessitate longer elution times. Elution times for a sample are converted to molecular weights using a calibration curve calculated from elution times for polystyrene having known molecular weights (reference samples), and a weight-average molecular weight is thus calculated.

[5. Structure of the Charge-Transporting Polymer]

The charge-transporting polymer of the invention is a polymer which transports charges (electrons and/or holes). The charge transport layer obtained through film formation from the charge-transporting polymer is a layer which performs one or more of the following functions: (A) to receive charges (electrons and/or holes) from an adjoining layer, (B) to move charges (electrons and/or holes) within the layer, and (C) to donate charges (electrons and/or holes) to an adjoining layer.

More specifically, the charge-transporting polymer in the invention is a polymer which has one or more kinds of repeating units and has at least a partial structure suitable for charge transport. Incidentally, the group represented by formula (1) may be bonded to the partial structure suitable for charge transport or may be bonded to a part other than the partial structure suitable for charge transport. It is preferred that the charge-transporting polymer of the invention should be a polymer in which at least some of the partial structure suitable for charge transport has a group represented by formula (1) as a side chain.

Examples of the partial structure suitable for charge transport include groups having a monovalence or higher and derived from: triarylamine structures; aromatic ring structures including three or more rings, such as a carbazole ring, dibenzothiophene ring, thiophene ring, anthracene ring, fluorene ring, dibenzofuran ring, pyrene ring, phenoxazine ring, and phenanthroline ring; aromatic heterocyclic structures such as a pyridine ring, pyrazine ring, triazine ring, quinoline ring, thiophene ring, silole ring, imidazole ring, pyrazole ring, oxadiazole ring, and benzothiazole ring; and metal complex structures.

In the case where the charge-transporting polymer of the invention is used as a hole-transporting polymer, it is preferred that the charge-transporting polymer should be a polymer which includes, in particular, a triarylamine structure, an aromatic ring structure including three or more rings, such as a carbazole ring, dibenzothiophene ring, thiophene ring, anthracene ring, fluorene ring, pyrene ring, phenoxazine ring, or phenanthroline ring, or the like, among those partial structures suitable for charge transport.

Furthermore, it is preferred that the charge-transporting polymer of the invention should contain groups having a monovalence or higher and derived from a triarylamine structure and/or fluorene ring, from the standpoint that HOMO and/or LUMO is moderately delocalized in the charge-transporting polymer to improve the electrochemical stability and charge-transporting ability thereof.

This is because when the main chain of the charge-transporting polymer of the invention is wholly or partly conjugated, this leads to an improvement in charge-transporting ability.

(5-1. With Respect to Formula (4))

It is preferred that the charge-transporting polymer of the invention should contain a triarylamine structure, more specifically, a repeating unit represented by the following formula (4). Incidentally, the group represented by formula (1) may have been bonded to any of the $Ar^{11}$ to $Ar^{15}$ in formula (4), or may have been bonded to a part other than formula (4) within the charge-transporting polymer.

[Chem. 17]

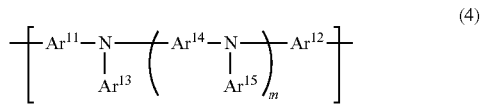

(4)

(In the formula, m represents an integer of 0-3;

$Ar^{11}$ and $Ar^{12}$ each independently represent a direct bond, a divalent aromatic hydrocarbon group which may have a substituent, or a divalent aromatic heterocyclic group which may have a substituent; and $Ar^{13}$ to $Ar^{15}$ each independently represent an aromatic hydrocarbon group which may have a substituent or an aromatic heterocyclic group which may have a substituent. $Ar^{13}$ and $Ar^{15}$ each represent a monovalent group, and $Ar^{14}$ represents a divalent group.

$Ar^{11}$ and $Ar^{12}$ are not direct bonds simultaneously.)

(5-1-1. With Respect to $Ar^{11}$ to $Ar^{15}$)

In formula (4), $Ar^{11}$ and $Ar^{12}$ each independently represent a direct bond, an aromatic hydrocarbon group which may have a substituent, or an aromatic heterocyclic group which may have a substituent, and $Ar^{13}$ to $Ar^{15}$ each independently represent an aromatic hydrocarbon group which may have a substituent or an aromatic heterocyclic group which may have a substituent.

Examples of the aromatic hydrocarbon group which may have a substituent include groups derived from a six-membered monocycle or a di- to pentacyclic fused ring, such as a benzene ring, naphthalene ring, anthracene ring, phenanthrene ring, perylene ring, tetracene ring, pyrene ring, benzpyrene ring, chrysene ring, triphenylene ring, acenaphthene ring, fluoranthene ring, or fluorene ring.

Examples of the aromatic heterocyclic group which may have a substituent include groups derived from a five- or six-membered monocycle or a di- to tetracyclic fused ring, such as a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring, or azulene ring.

From the standpoints of solubility in solvents and heat resistance, it is preferred that $Ar^{11}$ to $Ar^{15}$ should each independently be a group derived from a ring selected from the group consisting of a benzene ring, naphthalene ring, anthracene ring, phenanthrene ring, triphenylene ring, pyrene ring, thiophene ring, pyridine ring, and fluorene ring.

Also preferred as $Ar^{11}$ to $Ar^{15}$ are groups each made up of rings of one or more kinds selected from that group and bonded to each other either directly or through a —CH═CH— group. More preferred are a biphenyl group and a terphenyl-derived group.

Examples of the substituents that may be possessed by the aromatic hydrocarbon group which may have a substituent and by the aromatic heterocyclic group which may have a substituent include the groups shown under [Substituents Z] below.

[Substituents Z]

Alkyl groups having preferably 1-24 carbon atoms, more preferably 1-12 carbon atoms, such as methyl and ethyl;

alkenyl groups having preferably 2-24 carbon atoms, more preferably 2-12 carbon atoms, such as vinyl;

alkynyl groups having preferably 2-24 carbon atoms, more preferably 2-12 carbon atoms, such as ethynyl;

alkoxy groups having preferably 1-24 carbon atoms, more preferably 1-12 carbon atoms, such as methoxy and ethoxy;

aryloxy groups having preferably 4-36 carbon atoms, more preferably 5-24 carbon atoms, such as phenoxy, naphthoxy, and pyridyloxy;

alkoxycarbonyl groups having preferably 2-24 carbon atoms, more preferably 2-12 carbon atoms, such as methoxycarbonyl and ethoxycarbonyl;

dialkylamino groups having preferably 2-24 carbon atoms, more preferably 2-12 carbon atoms, such as dimethylamino and diethylamino;

diarylamino groups having preferably 10-36 carbon atoms, more preferably 12-24 carbon atoms, such as diphenylamino, ditolylamino, and N-carbazolyl;

arylalkylamino groups having preferably 6-36 carbon atoms, more preferably 7-24 carbon atoms, such as phenylmethylamino;

acyl groups having desirably 2-24 carbon atoms, preferably 2-12 carbon atoms, such as acetyl and benzoyl;

halogen atoms such as a fluorine atom and a chlorine atom;

haloalkyl groups having preferably 1-12 carbon atoms, more preferably 1-6 carbon atoms, such as trifluoromethyl;

alkylthio groups having preferably 1-24 carbon atoms, more preferably 1-12 carbon atoms, such as methylthio and ethylthio;

arylthio groups having preferably 4-36 carbon atoms, more preferably 5-24 carbon atoms, such as phenylthio, naphthylthio, and pyridylthio;

silyl groups having preferably 2-36 carbon atoms, more preferably 3-24 carbon atoms, such as trimethylsilyl and diphenylsilyl;

siloxy groups having preferably 2-36 carbon atoms, more preferably 3-24 carbon atoms, such as trimethylsiloxy and triphenylsiloxy;

cyano;

aromatic hydrocarbon groups having preferably 6-36 carbon atoms, more preferably 6-24 carbon atoms, such as phenyl and naphthyl; and aromatic heterocyclic groups having preferably 3-36 carbon atoms, more preferably 4-24 carbon atoms, such as thienyl and pyridyl.

Those substituents may have further substituents, examples of which include the groups shown above as examples under Substituents Z.

The molecular weight of each of the substituents which may be possessed, besides the insolubilizing group that will be described later, by the aromatic hydrocarbon groups and aromatic heterocyclic groups represented by $Ar^{11}$ to $Ar^{15}$ is preferably 500 or lower, more preferably 250 or lower, including the molecular weight of any further substituent thereof.

From the standpoint of solubility in solvents, it is preferred that the substituents which may be possessed by the aromatic hydrocarbon groups and aromatic heterocyclic groups represented by $Ar^{11}$ to $Ar^{15}$ should independently be an alkyl group having 1-12 carbon atoms and an alkoxy group having 1-12 carbon atoms.

Incidentally, when m is 2 or larger, the repeating unit represented by formula (4) has two or more $Ar^{14}$s and two or more $Ar^{15}$s. In this case, the $Ar^{14}$s may be the same or different, and the $Ar^{15}$s may be the same or different. Furthermore, the $Ar^{14}$s and the $Ar^{15}$s each may have been bonded to each other directly or through a linking group to form a cyclic structure.

The substituents which may be possessed by $Ar^{11}$ to $Ar^{15}$ may be the crosslinkable groups which will be described later under (5-3. Crosslinkable Group which may be Possessed besides the Group Represented by Formula (1)).

(5-1-2. With Respect to m)

Symbol m in formula (4) represents an integer of 0-3.

It is preferred that m should be 0, from the standpoint that this repeating unit enhances the solubility in organic solvents and the film-forming properties of the crosslinkable polymer.

On the other hand, it is preferred that m should be 1-3, from the standpoint that this repeating unit improves the hole-transporting ability of the polymer.

(5-2. With Respect to Formula (4'))

In the case where the group represented by formula (1) is contained in the repeating unit represented by formula (4), it is preferred that this repeating unit represented by formula (4) should be a repeating unit represented by the following formula (4'). This is because the partial structure represented by formula (4'), in which the group represented by formula (1) is possessed at $Ar^{23}$, has better oxidative/reductional stability than cases where the group is bonded in another position, and prevents the charge-transporting polymer from aggregating.

[Chem. 18]

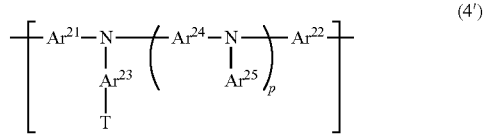

(4')

(In the formula, p represents an integer of 0-3, $Ar^{21}$ and $Ar^{22}$ each independently represent a direct bond, an aromatic hydrocarbon group which may have a substituent, or an aromatic heterocyclic group which may have a substituent, $Ar^{23}$ to $Ar^{25}$ each independently represent an aromatic hydrocarbon group which may have a substituent or an aromatic heterocyclic group which may have a substituent, and T represents a group represented by formula (1), $Ar^{21}$ and $Ar^{22}$ being not direct bonds simultaneously.)

(5-2-1. With Respect to $Ar^{21}$ to $Ar^5$)

$Ar^{21}$ and $Ar^{22}$ each independently represent a direct bond, an aromatic hydrocarbon group which may have a substituent, or an aromatic heterocyclic group which may have a substituent, and $Ar^{23}$ to $Ar^{25}$ each independently represent an aromatic hydrocarbon group which may have a substituent or an aromatic heterocyclic group which may have a substituent.

Examples of the optionally substituted aromatic hydrocarbon groups and optionally substituted aromatic heterocyclic groups which are represented by $Ar^{21}$ to $Ar^{25}$ are the same as the examples shown above in the section (5-1-1. With Respect to $Ar^{11}$ to $Ar^{15}$). Preferred embodiments also are the same.

Furthermore, the substituents which may be possessed are also the same.

(5-2-2. With Respect to p)

Symbol p is the same as the m described in the section (5-1-2. With Respect to m). Preferred embodiments also are the same.

(5-2-3. With Respect to T)

T in formula (4') represents a group represented by formula (1), and examples thereof and preferred groups also are the same as those shown above in the section [1. With Respect to the Group Represented by Formula (1)].

(5-3. Crosslinkable Group which may be Possessed besides the Group Represented by Formula (1))

The charge-transporting polymer of the invention may have a crosslinkable group other than the group represented by formula (1).

Examples of the crosslinkable group other than the group represented by formula (1) include radical-polymerizable groups, cationically polymerizable groups, anionically polymerizable groups, and groups which undergo cycloaddition. Preferred of these are cationically polymerizable groups. Examples of the cationically polymerizable groups include cyclic ether groups, such as an epoxy group and an oxetane group, a vinyl ether group, and a styryl group.

Especially preferred of these is styryl from the standpoint that this group is capable of reacting with the benzocyclobutene ring contained in the group represented by formula (1) and thereby forming a stable six-membered ring.

(5-3-1. With Respect to the Group Represented by Formula (5))

Specifically, it is preferred that the optional crosslinkable group should be a group including the group represented by the following formula (5).

[Chem. 19]

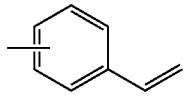

(5)

(In formula (5), the styryl group may have one or more substituents. The substituents may have been bonded to each other to form a ring.)

Although the styryl group in formula (5) may have one or more substituents, the group preferably is unsubstituted. The substituents which may be possessed are the same as the substituent described above in the section (2-4. With Respect to Substituent which may be Possessed by the Benzocyclobutene Ring in Formula (2) besides the Divalent Group Q).

It is preferred that the group represented by formula (5) should have been directly bonded in the charge-transporting polymer, from the standpoint of ease of synthesis. The group represented by formula (5) may be contained as a side chain bonded through a spacer group, from the standpoint that this styryl group has enhanced reactivity. In the case where the group represented by formula (5) is contained through a spacer group, this spacer group can be the same as the spacer group according to the invention.

Incidentally, those crosslinkable groups other than the group represented by formula (1) may be bonded to any part of the charge-transporting polymer of the invention like the group represented by formula (1), unless the performance of the polymer is impaired thereby. For example, those crosslinkable groups may be bonded to the partial structure suitable for charge transport or to a part other than the partial structure.

In the case where the charge-transporting polymer of the invention has one or more crosslinkable groups other than the group represented by formula (1), the number of such crosslinkable groups per group represented by formula (1) is generally 3 or less, preferably 1 or less. It is more preferred that the charge-transporting polymer should contain no crosslinkable group except the group represented by formula (1).

[6. Number of Groups Represented by Formula (1)]

In the invention, the number of groups represented by formula (1) which are possessed by the charge-transporting polymer of the invention is expressed in terms of the number thereof per molecular weight of 1,000. Here, the number of groups represented by formula (1) per molecular weight of 1,000 for the charge-transporting polymer can be calculated from the molar ratio of the feed monomers for synthesizing the charge-transporting polymer excluding the end groups and from the structural formula.

An explanation is given on the case of, for example, the charge-transporting polymer (H1) used in Example 1, which will be given later.

[Chem. 20]

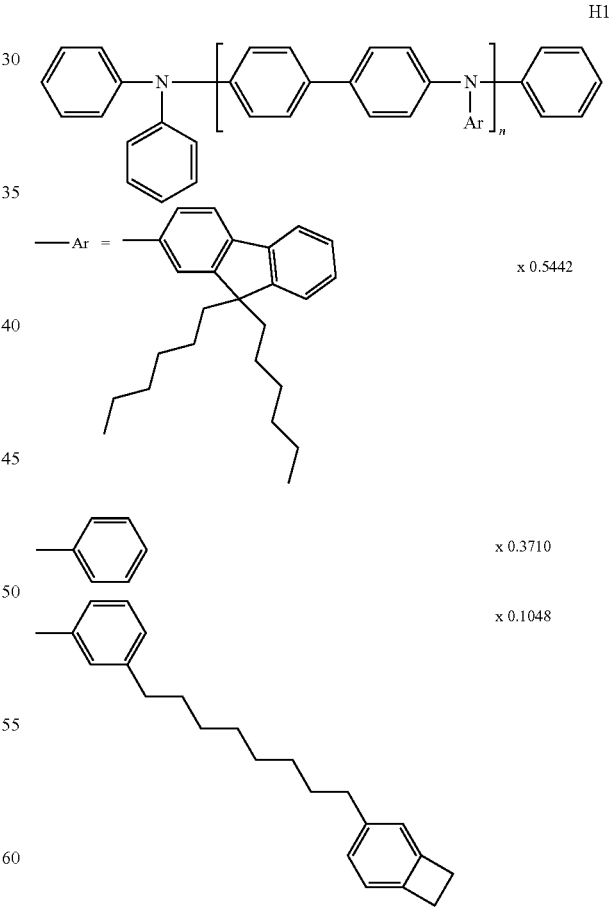

In the charge-transporting polymer (H1), the molecular weight of the polymer excluding the end groups is 410.3, and the number of groups represented by formula (1) is 0.1408 per molecule on average. When the number of groups represented by formula (1) per molecular weight of 1,000 is calculated from those values based on simple proportion, then the number thereof is found to be 0.255.

The number of groups represented by formula (1) which are possessed by the charge-transporting polymer of the invention per molecular weight of 1,000 is generally 3.0 or less, preferably 2.0 or less, more preferably 1.0 or less, and is generally 0.01 or more, preferably 0.05 or more.

In case where the number thereof exceeds the upper limit, there is a possibility that cracking might occur to make it impossible to obtain a flat film or that the polymer might come to have too high a crosslink density and give a crosslinked layer containing a larger amount of unreacted groups represented by formula (1), thereby affecting the life of the element to be obtained. On the other hand, in case where the number thereof is smaller than the lower limit, insolubilization of the crosslinked layer is insufficient and there is a possibility that a multilayer structure cannot be formed by a wet film formation method.

[7. With Respect to Specific Examples]

Preferred examples of the repeating units of the charge-transporting polymer of the invention are shown below. However, the repeating units in the invention should not be construed as being limited to the following examples.

(Repeating Units Containing Group Represented by Formula (1))

[Chem. 21]

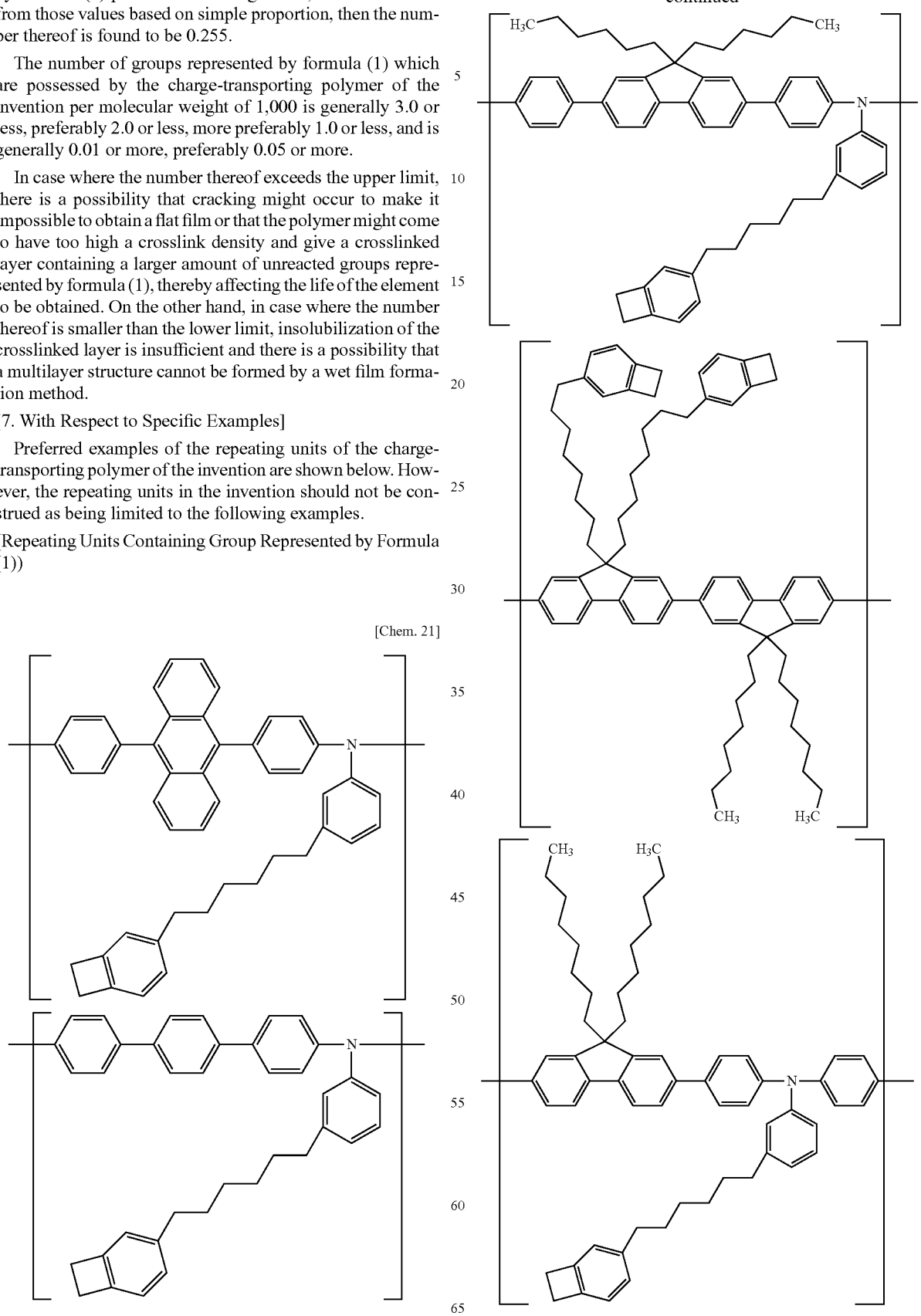

-continued
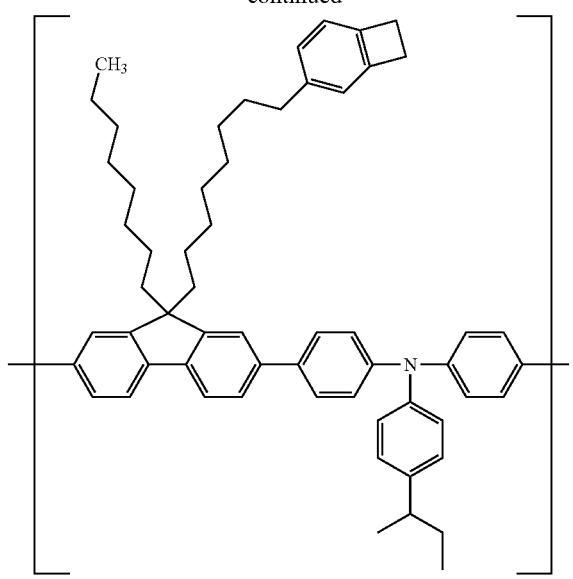
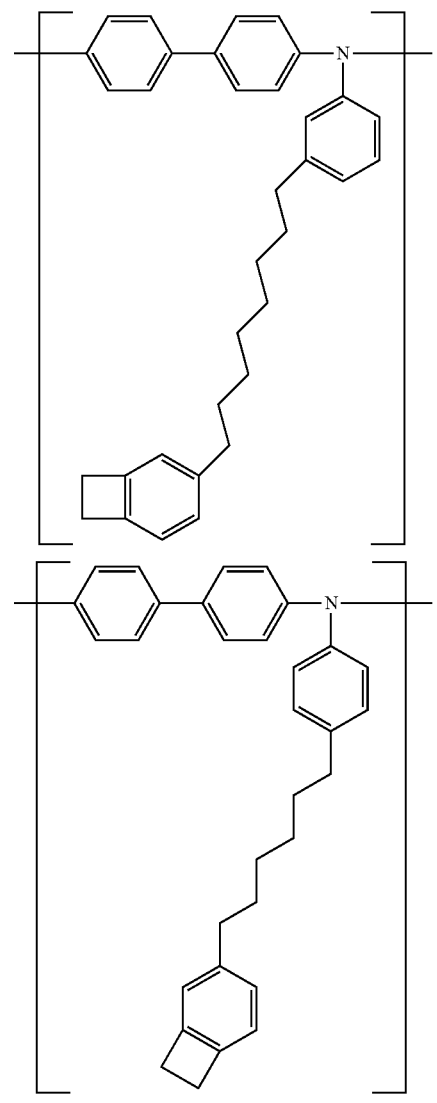
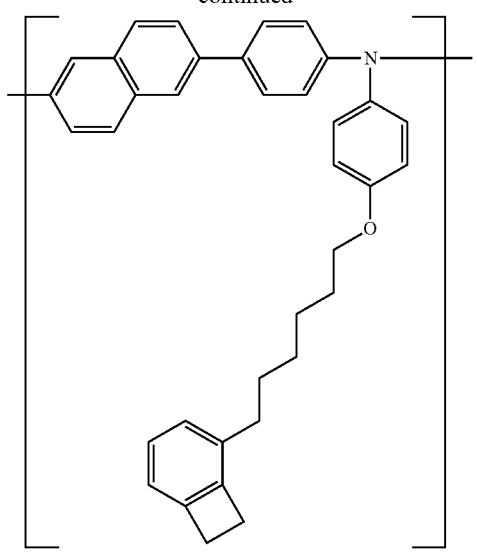
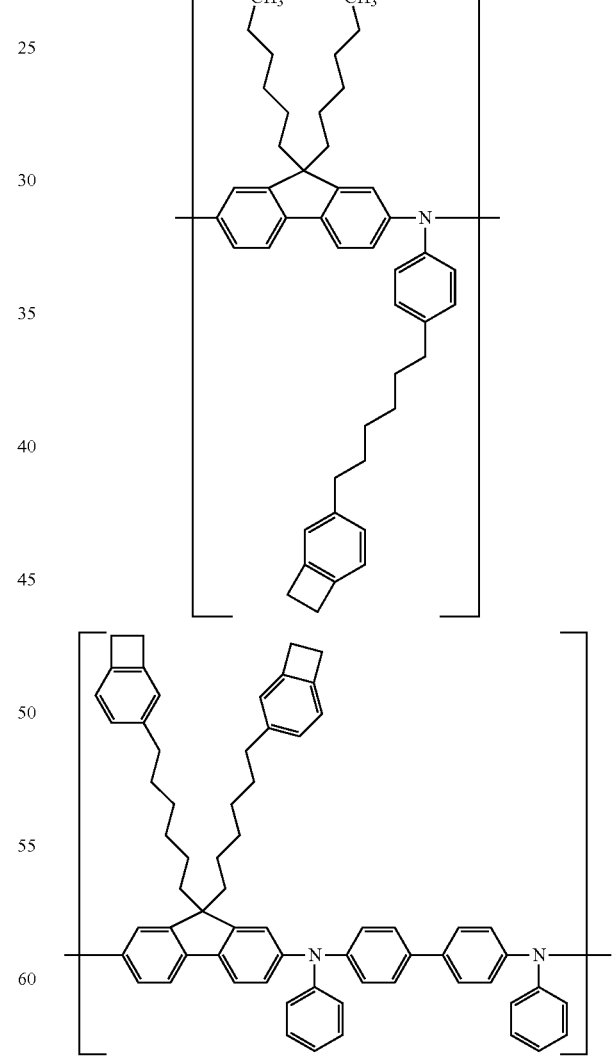

31
-continued
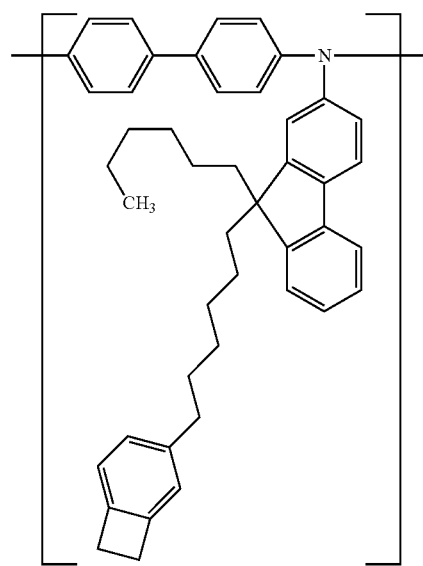
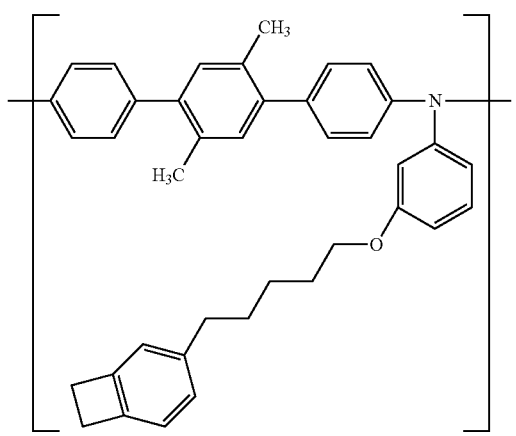
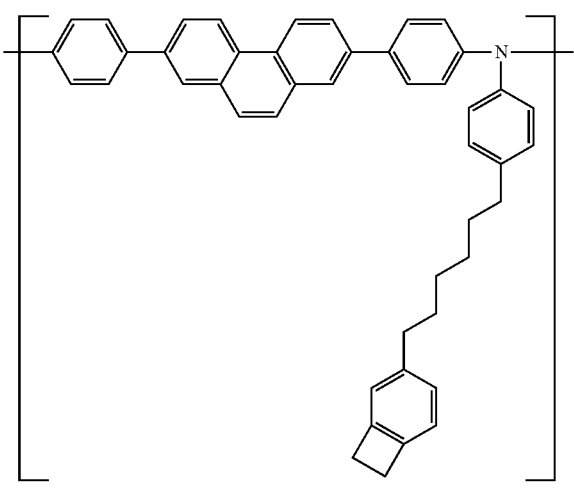
32
-continued
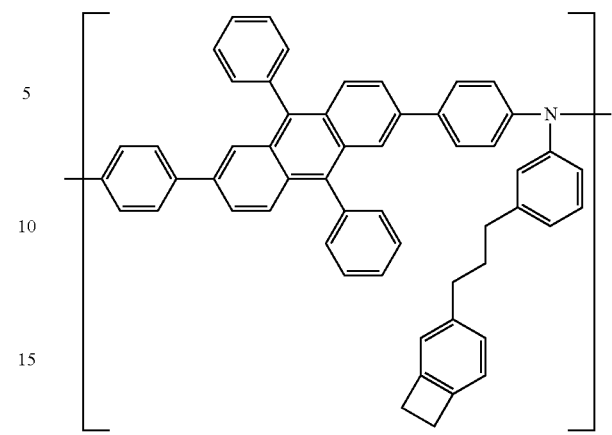
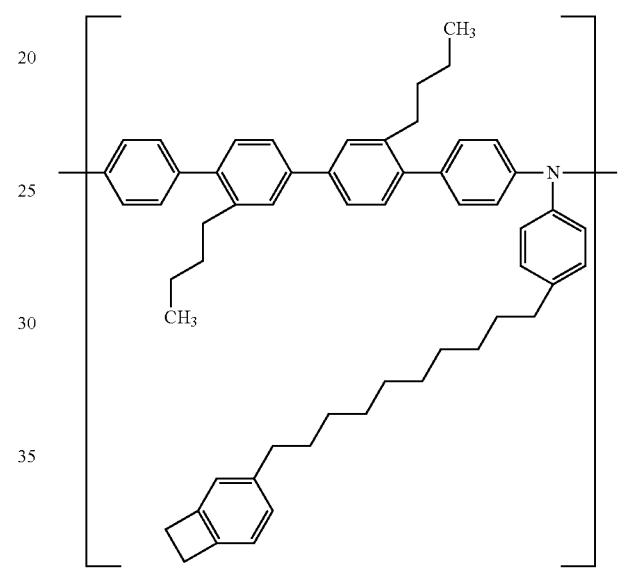
(Repeating Units Containing Group Represented by Formula (1))
[Chem. 22]
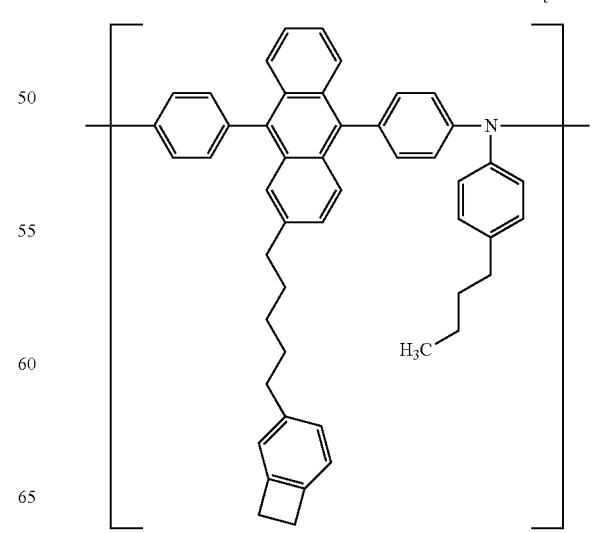

33
-continued
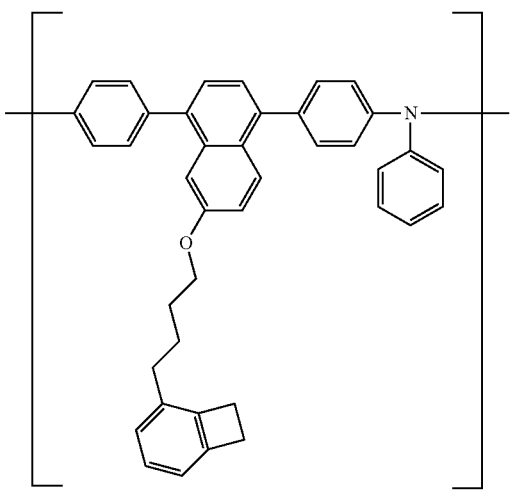
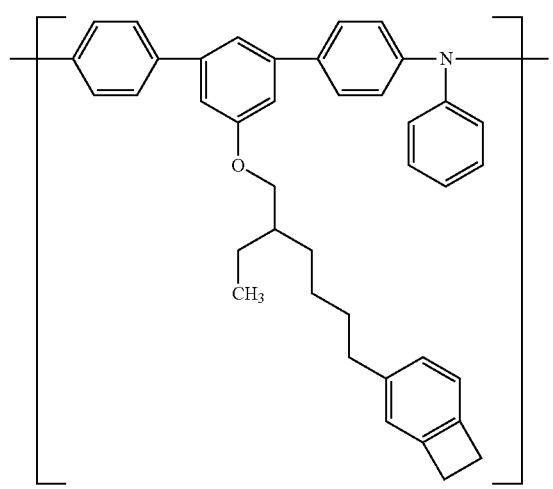
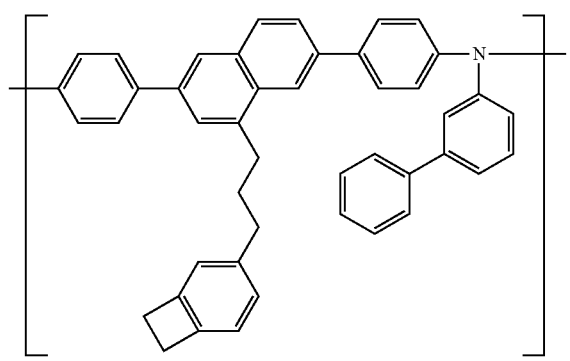
34
-continued
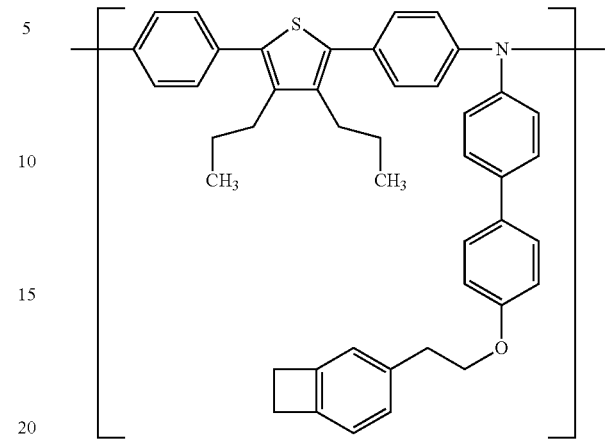
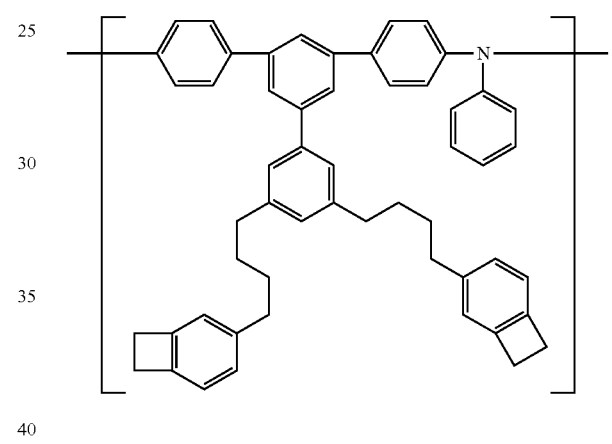
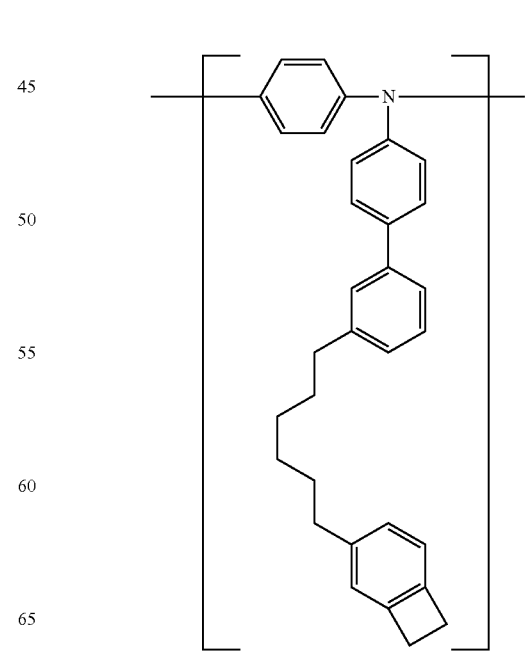

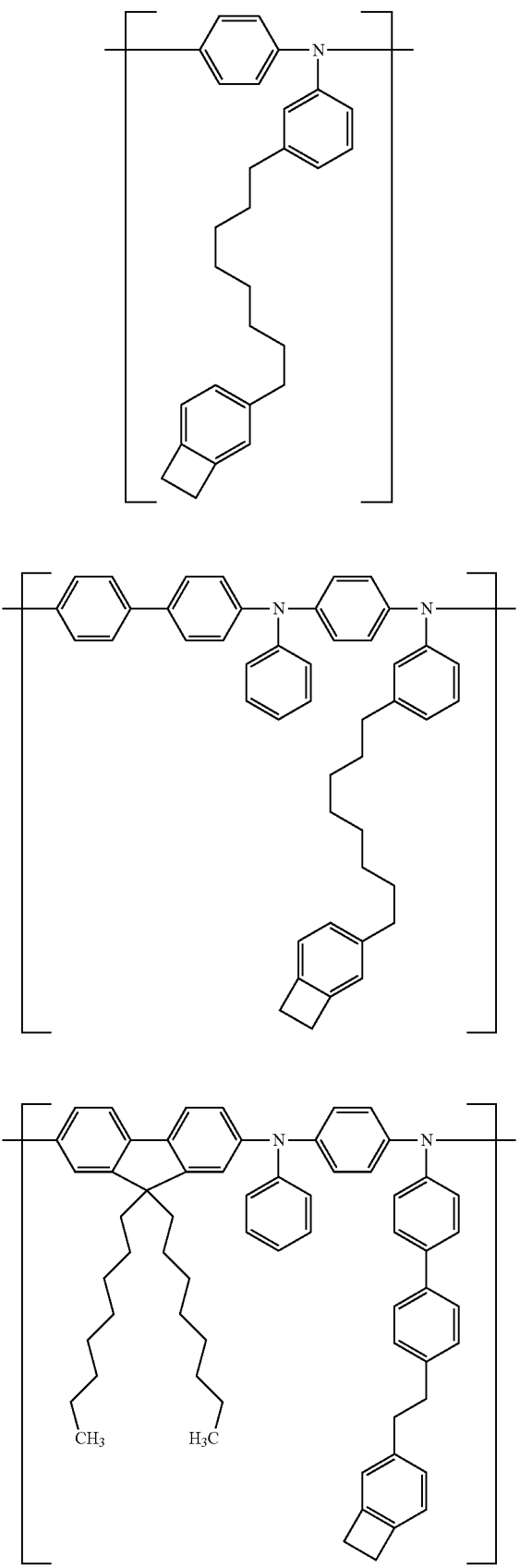
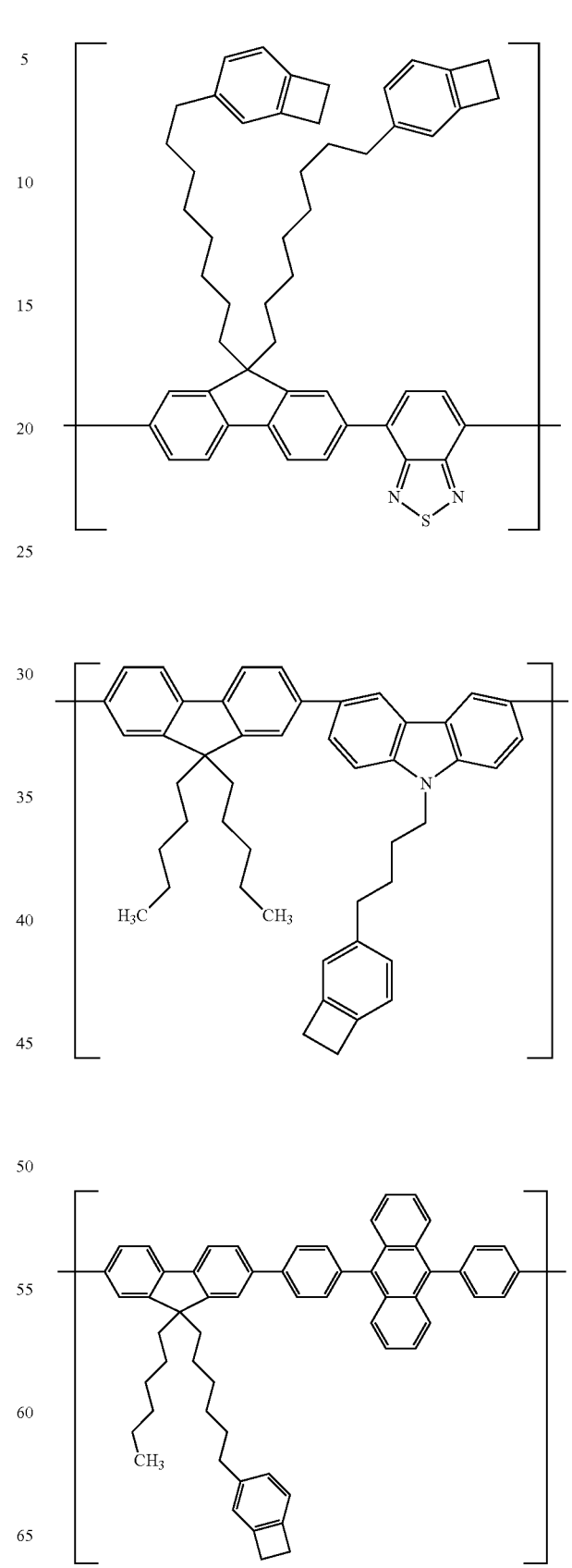

[Chem. 23]
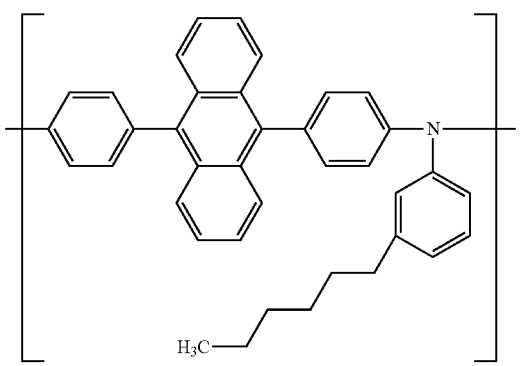
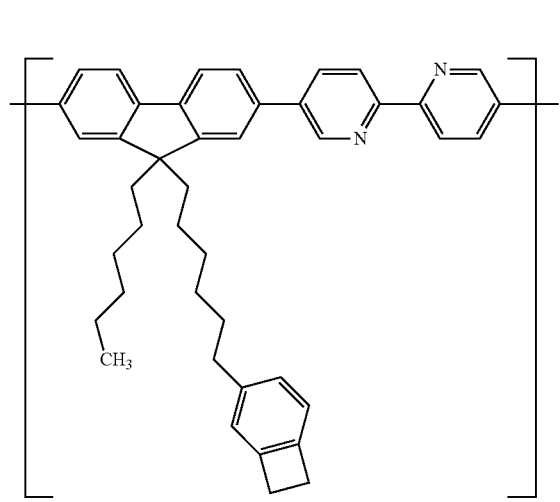
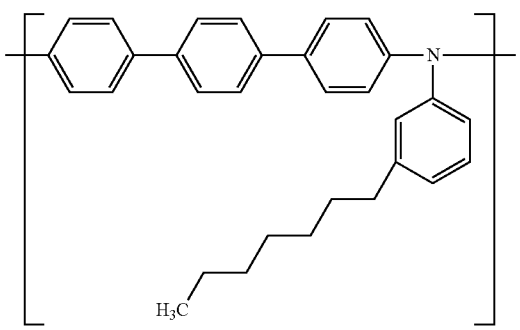
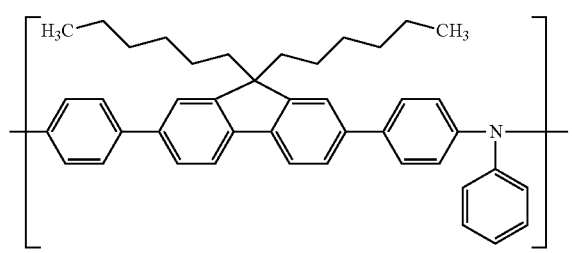
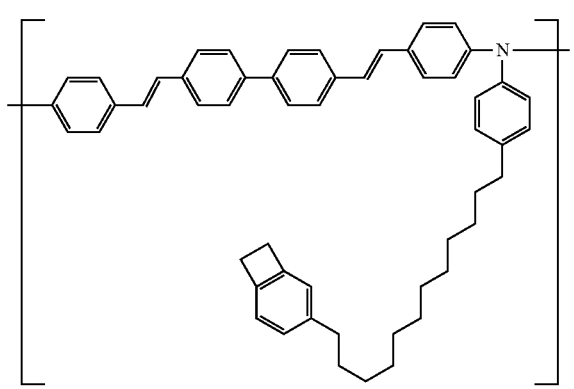
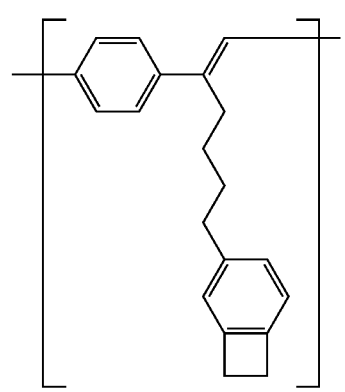
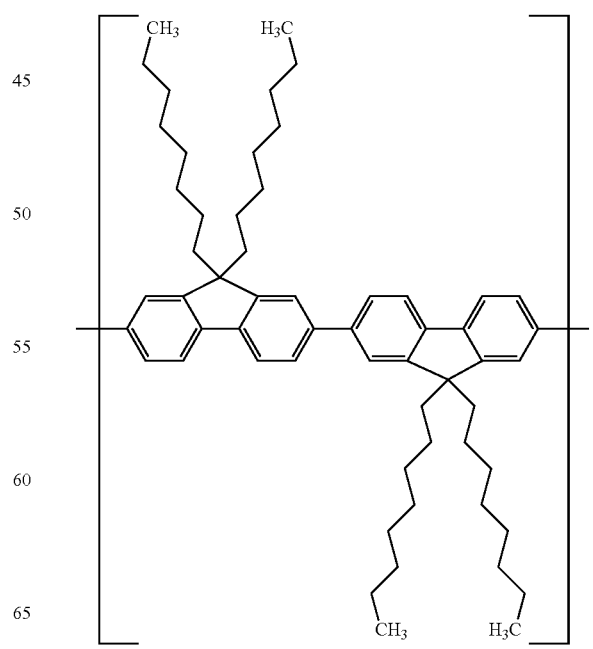
Preferred examples of repeating units containing no group represented by formula (1) are shown below. However, the repeating units in the invention should not be construed as being limited to the following examples.

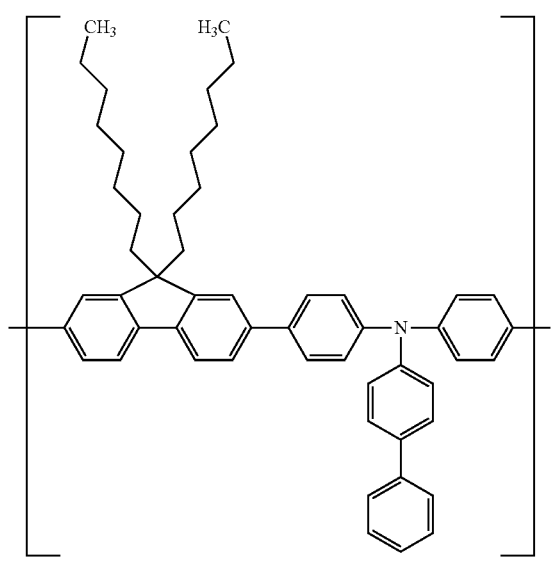
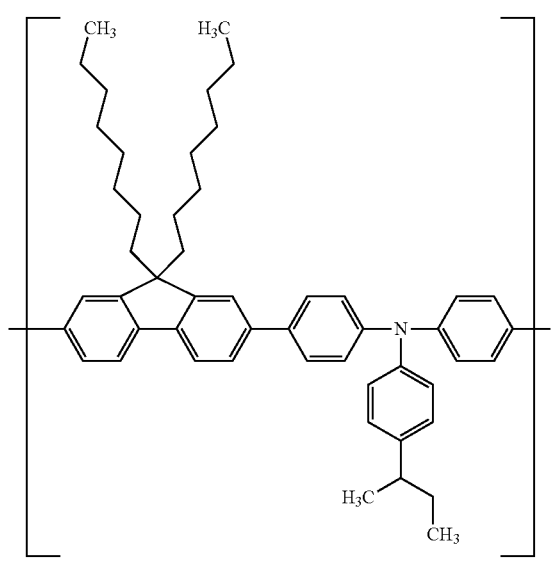
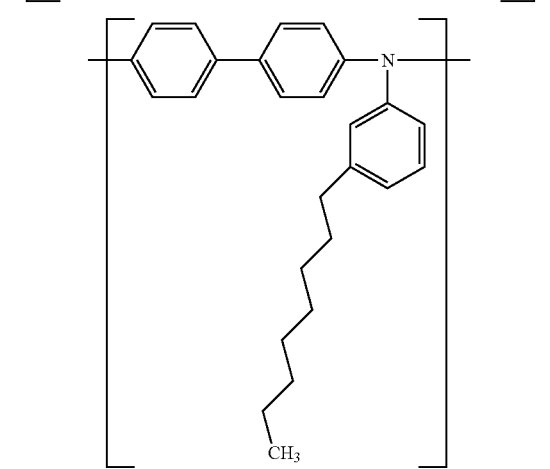
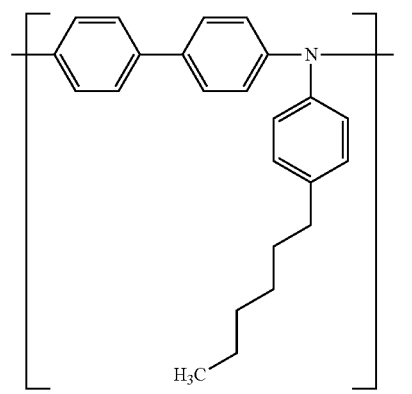
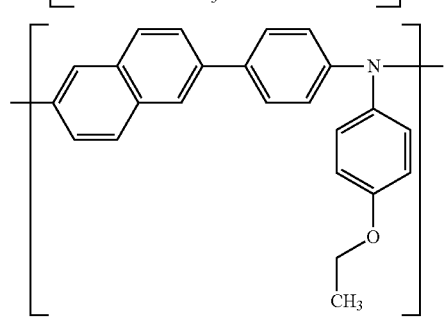
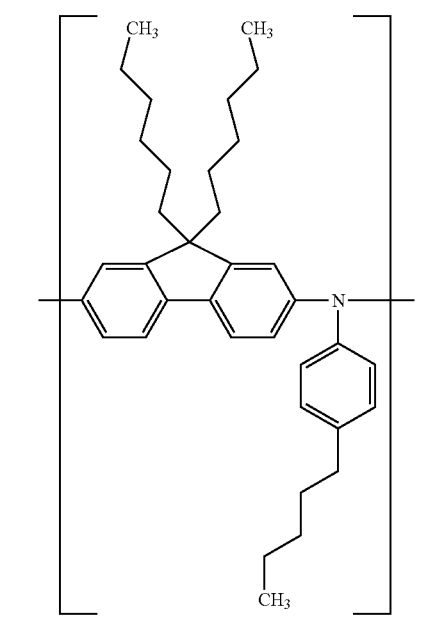
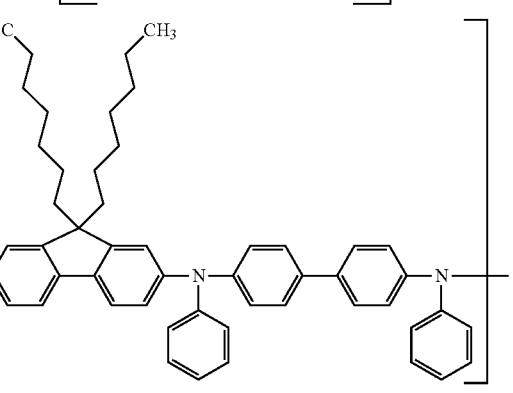

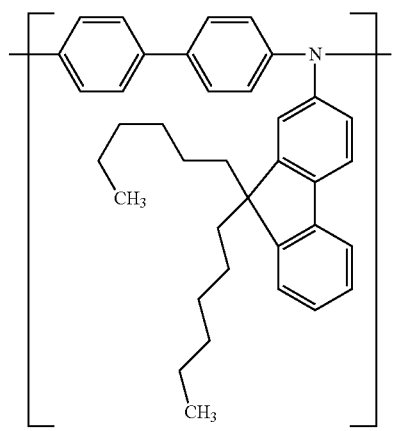
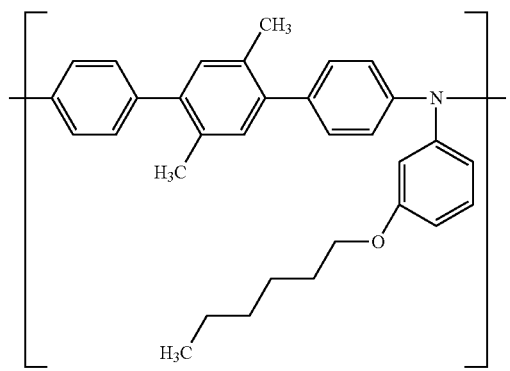
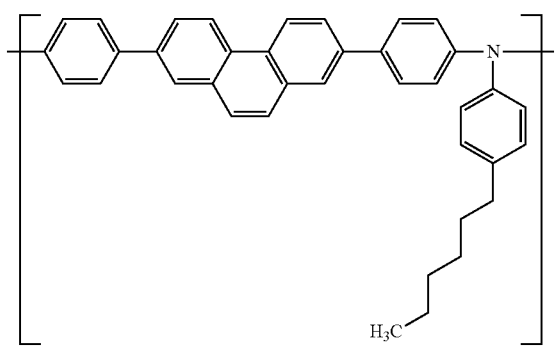
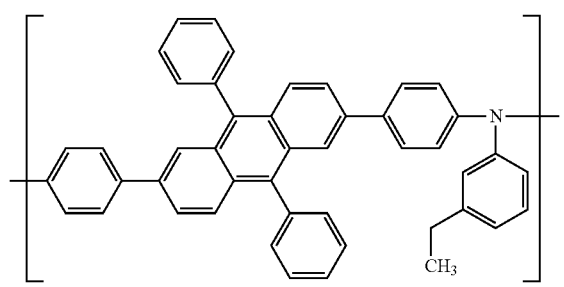
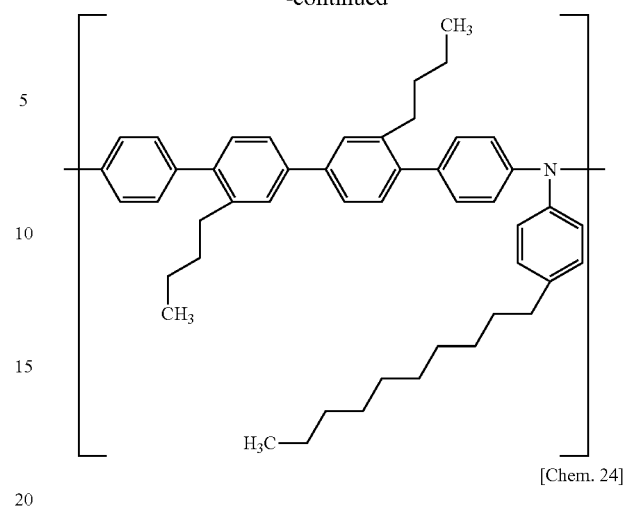
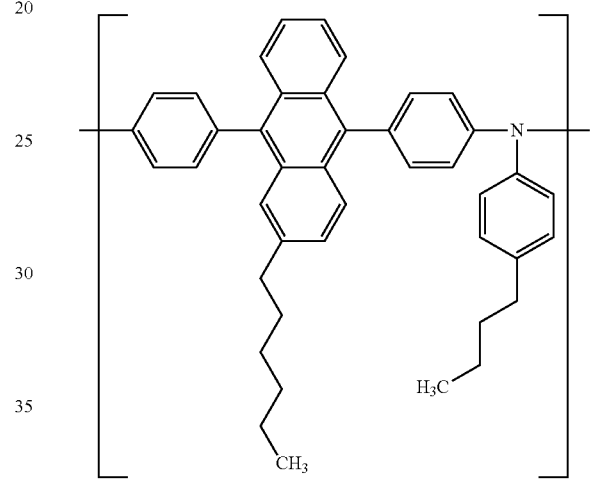
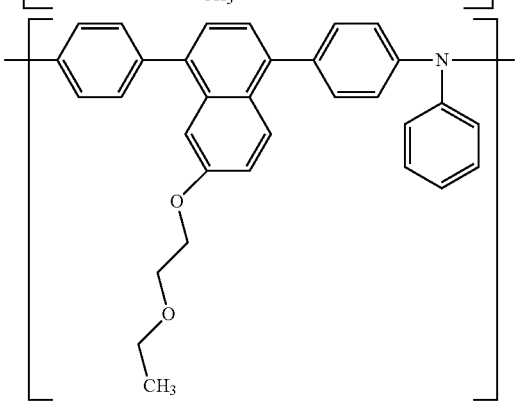
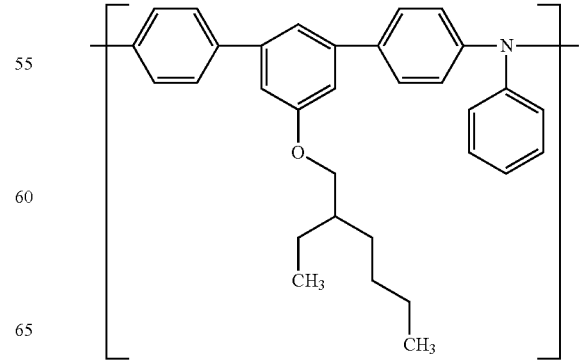
[Chem. 24]

-continued
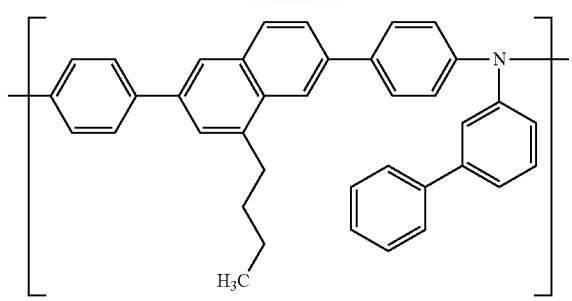
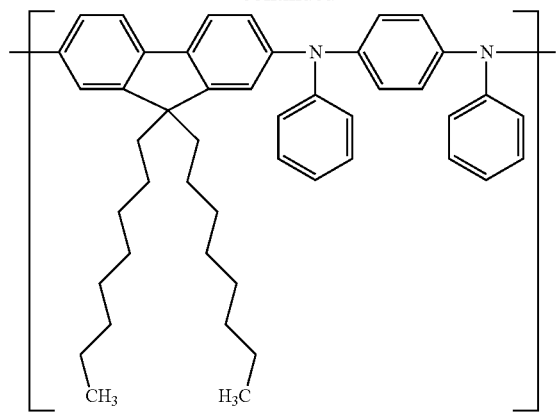
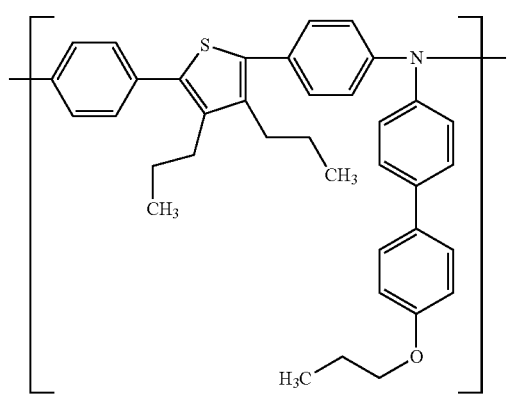
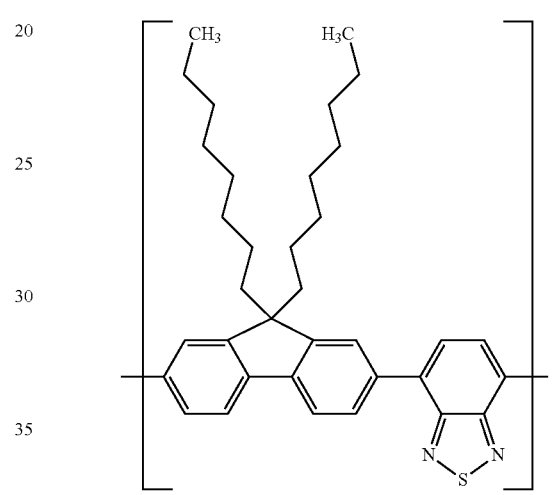
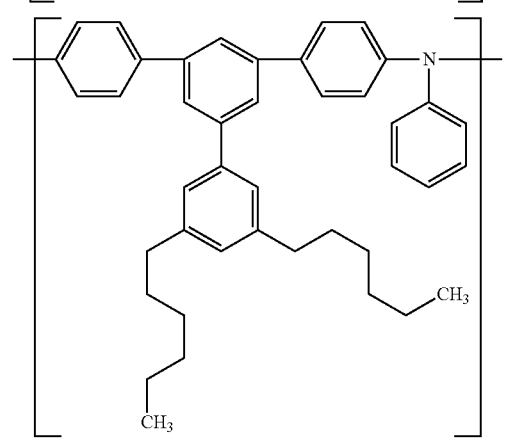
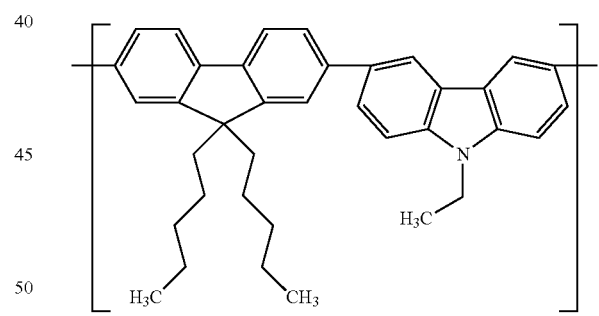
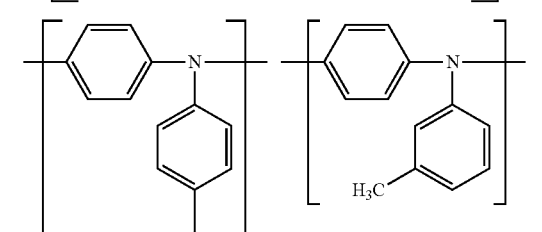
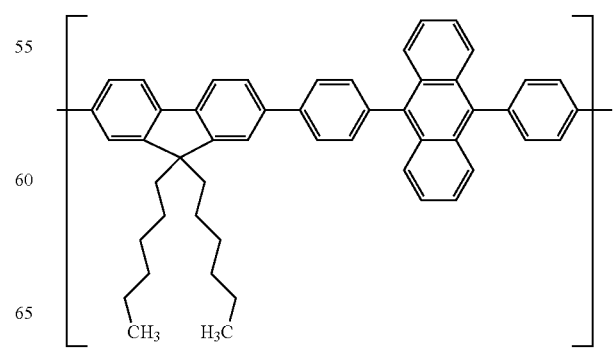
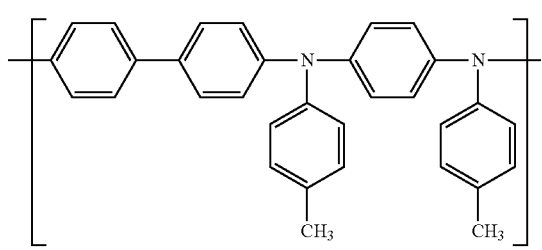

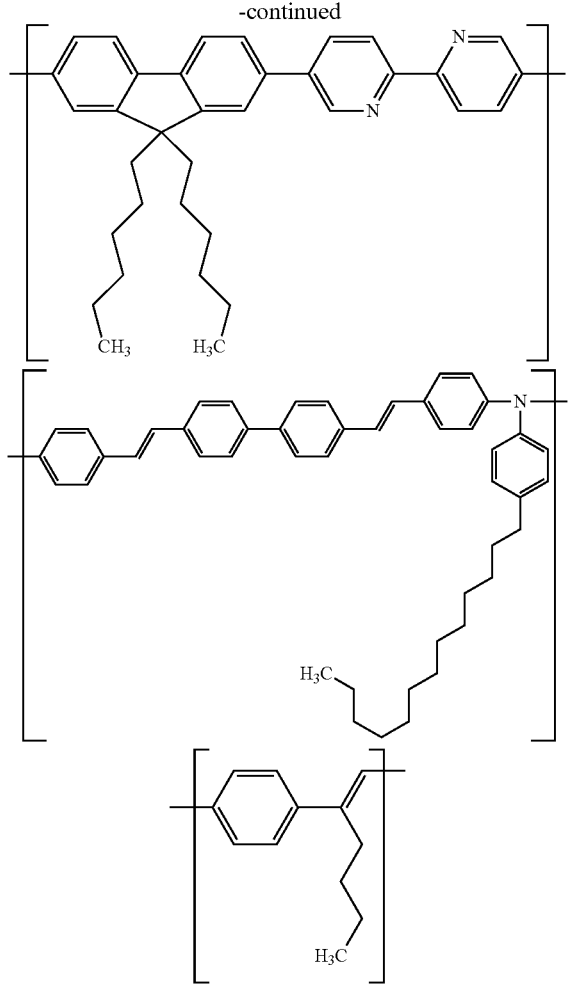

[8. Reasons for Preference for the Group Represented by Formula (1)]

The present inventors presume that the reasons why the group represented by formula (1) is preferred among crosslinkable groups are as follows.

When the group represented by formula (1) is crosslinked, the group forms a ring as a new chemical bond. Because of this, the layer (crosslinked layer) formed by crosslinking the charge-transporting polymer of the invention is electrochemically stable. It is therefore presumed that organic electroluminescent elements having the crosslinked layer according to the invention have a high current efficiency and a long working life.

Since the group represented by formula (1) has a spacer group, the benzocyclobutene ring contained in the group represented by formula (1) has a higher degree of freedom. Consequently, the probability of combining with another group represented by formula (1) present in the same system is heightened. As a result, a smaller amount of groups represented by formula (1) remain in the crosslinked layer and this layer is less apt to crack. In addition, since the proportion of main chain structures which are present near to one another is small, aggregation of main chains is less apt to occur and the film has excellent flatness.

Furthermore, the group represented by formula (1) does not always necessitate a crosslinking reaction initiator. Consequently, even when the charge-transporting polymer of the invention is used to form an organic layer, the adverse influence exerted by the decomposition of a crosslinking reaction initiator which occurs upon voltage application can be avoided.

In addition, in case where crosslinkable groups remain in an organic layer formed, other crosslinkable groups such as, for example, highly polar cationically polymerizable groups are apt to be causative of charge trapping and deterioration. However, the benzocyclobutene ring contained in the group represented by formula (1) has low porosity and, hence, produces little adverse influence on element characteristics even when remains in the organic layer.

<Synthesis Methods>

The charge-transporting polymer of the invention can be synthesized by known techniques from starting materials selected according to the structure of the target compound.

As a method for combining a spacer group with a benzocyclobutene ring, a known technique of coupling can be applied.

Examples thereof include: a method in which lithium or magnesium is caused to act on bromobenzocyclobutene to prepare an organolithium reagent or organomagnesium reagent (Grignard reagent) and this reagent is then reacted with an alkyl bromide (however, the Br should have been bonded to $-CR^1R^2-$, as shown in the reaction scheme)

[Chem. 25]

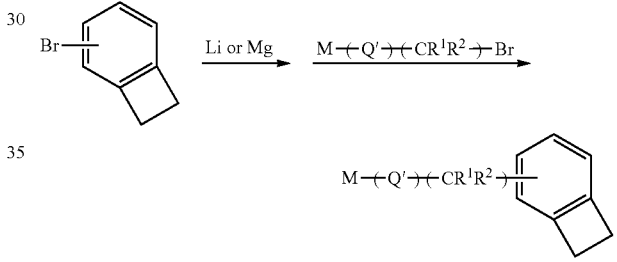

(In the scheme, M represents a polymer structure, a monomer structure to be polymerized, or a group to be combined with a polymer structure in a later step.);

a method in which bromobenzocyclobutene is reacted with an alkyne in the presence of a palladium catalyst or copper catalyst and a base (Sonogashira reaction) and the resultant yne compound is hydrogenated with hydrogen molecules, hydrazine monohydrate, or the like in the presence of a catalyst such as reduced iron or palladium/carbon;

a method in which bromobenzocyclobutene is reacted with an alkene in the presence of a palladium catalyst and a base (Heck reaction) and the resultant ene compound is hydrogenated with hydrogen molecules, hydrazine monohydrate, or the like in the presence of a catalyst such as reduced iron or palladium/carbon

[Chem. 26]

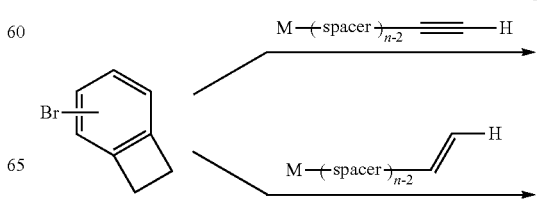

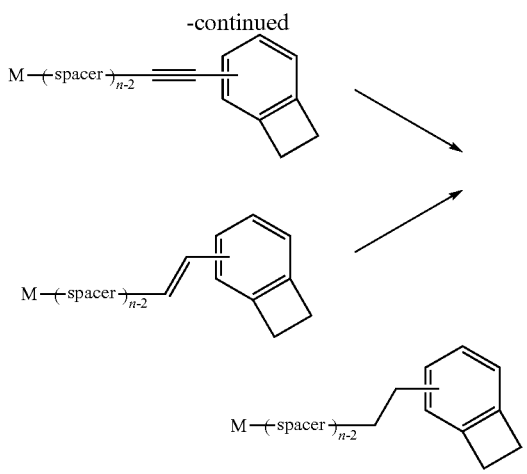

(In the scheme, M represents a polymer structure, a monomer structure to be polymerized, or a group to be combined with a polymer structure in a later step. Symbol n represents a natural number of 2 or larger, and "spacer" represents a group which links the benzocyclobutene ring to the main chain of a charge-transporting polymer through three or more single bonds.);

a method in which bromobenzocyclobutene is reacted with an alkenylboron compound or an alkynylboron compound in the presence of a palladium catalyst and a base (Suzuki reaction) and the resultant ene compound or yne compound is hydrogenated with hydrogen molecules, hydrazine monohydrate, or the like in the presence of a catalyst such as reduced iron or palladium/carbon; and a method in which bromobenzocyclobutene is reacted with an alkenyltin compound in the presence of a palladium catalyst (Stille reaction) and the resultant ene compound is hydrogenated with hydrogen molecules, hydrazine monohydrate, or the like in the presence of a catalyst such as reduced iron or palladium/carbon.

[Chem. 27]

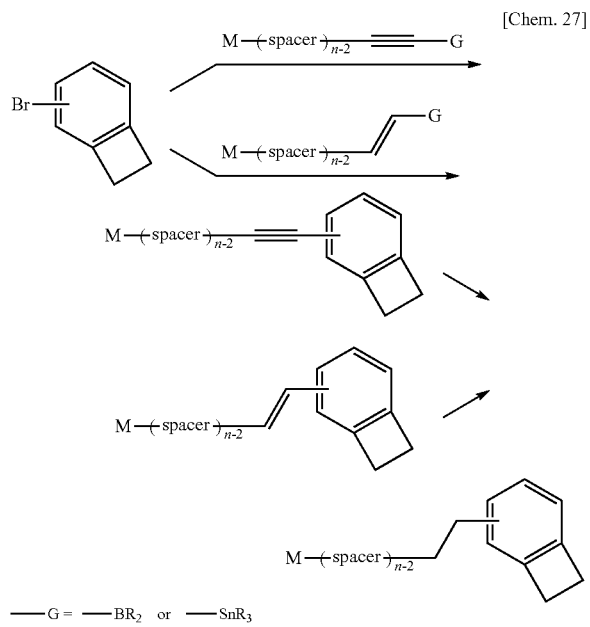

(In the scheme, M represents a polymer structure, a monomer structure to be polymerized, or a group to be combined with a polymer structure in a later step, and G represents a boron atom having two substituents, $BR_2$, or a tin atom having three substituents, $SnR_3$. R represents any substituent. Symbol n represents a natural number of 2 or larger, and "spacer" represents a group which links the benzocyclobutene ring to the main chain of a charge-transporting polymer through three or more single bonds. Examples of the Rs possessed by the boron atom having two substituents, $BR_2$, in the scheme include hydroxyl and alkoxy groups. Examples of the Rs possessed by the tin atom having three substituents, $SnR_3$, include alkyl groups.)

With respect to methods for synthesizing the charge-transporting polymer of the invention, the polymer can be obtained, for example, by subjecting a halide represented by formula (IIIa) alone to successive polymerization based on a reaction for forming an Ar—Ar bond, as shown by the following scheme. The reaction is usually conducted in the presence of a transition metal catalyst such as copper, palladium, or a nickel complex.

[Chem. 28]

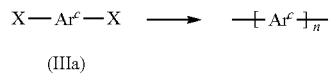

(IIIa)

(In the scheme, X represents a halogen atom or a sulfonic ester group such as a $CF_3SO_2O$— group, and $Ar^c$ represents a divalent aromatic hydrocarbon group which may have a substituent or a divalent aromatic heterocyclic group which may have a substituent. Symbol n represents a natural number of 1 or larger.)

Alternatively, the polymer is obtained, for example, by subjecting a halide represented by formula (IIIa) and a secondary amine compound represented by general formula (IIIb) to successive polymerization based on a reaction for forming an N—Ar bond (e.g., Buchwald-Hartwing coupling or Ullmann coupling). The reaction for forming an N—Ar bond is conducted in the presence of a base such as potassium carbonate, tert-butoxysodium, or triethylamine, and can be conducted, according to need, in the presence of a transition metal catalyst such as copper or a palladium complex.

[Chem. 29]

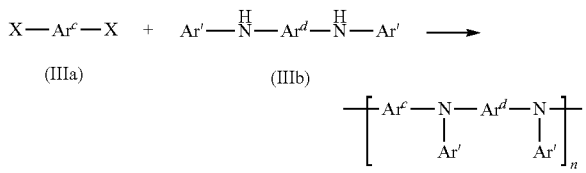

(In the scheme, X represents a halogen atom or a sulfonic ester group such as a $CF_3SO_2O$— group, Ar' represents a monovalent aromatic hydrocarbon group which may have a substituent or a monovalent aromatic heterocyclic group which may have a substituent, and $Ar^c$ and $Ar^d$ each independently represent a divalent aromatic hydrocarbon group which may have a substituent or a divalent aromatic heterocyclic group which may have a substituent. Symbol n represents a natural number of 1 or larger.)

The polymer is also obtained, for example, by subjecting a halide represented by formula (Ma) and a boron compound represented by general formula (IIIc) to successive polymerization based on a reaction for forming an Ar—Ar bond (e.g., Suzuki coupling). The reaction for forming an Ar—Ar bond is conducted in the presence of a base such as potassium carbonate, tert-butoxysodium, or triethylamine, and can be conducted, according to need, in the presence of a transition metal catalyst such as copper or a palladium complex.

[Chem. 30]

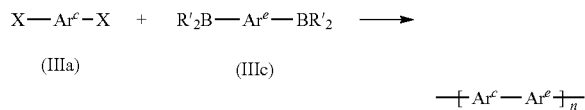

(In the scheme, X represents a halogen atom or a sulfonic ester group such as a $CF_3SO_2O$— group, and the R's represent hydroxy groups or represent alkoxy groups, which may be bonded to each other to form a ring.

$Ar^c$ and $Ar^e$ each independently represent a divalent aromatic hydrocarbon group which may have a substituent or a divalent aromatic heterocyclic group which may have a substituent. Symbol n represents a natural number of 1 or larger.)

Besides being produced by the polymerization methods described above, the charge-transporting polymer of the invention can be produced using, for example, the polymerization method described in JP-A-2001-223084, the polymerization method described in JP-A-2003-213002, or the polymerization method described in JP-A-2004-2740 or using the radical polymerization of a compound having an unsaturated double bond or successive polymerization based on a reaction for forming an ester bond or amide bond.

Moreover, known coupling reactions can be used. Specifically, as known techniques of coupling, use can be made of the combining between rings (coupling reactions), such as the coupling reaction of an aryl halide with an aryl borate, which is described or cited in *Palladium in Heterocyclic Chemistry: A guide for the Synthetic Chemist* (2nd ed., 2002, Jie Jack Li and Gordon W. Gribble, Pergamon Press Ltd.), *Sen-i Kinzoku Ga Hiraku Yūki Gōsei, Sono Tasaina Hannō Keishiki To Saishin No Seika* (1997, TUJI Jiro, Kagaku-Dojin Publishing Company Inc.), *Vollhardt-Schore Gendai Yūki Kagaku, Ge* (2004, K.P.C. Vollhardt, Kagaku-Dojin Publishing Company Inc.), etc.

With respect to a group represented by formula (1), use may be made of a method in which the group is combined beforehand with a monomer which is a starting material for a charge-transporting polymer of the invention and this monomer is polymerized to obtain the charge-transporting polymer of the invention, as described above. Alternatively, use may be made of a method in which a portion corresponding to the main chain of a charge-transporting polymer of the invention is synthesized and a group represented by formula (1) is then combined with a desired part.

As methods for purifying compounds, use can be made of known techniques including the methods described in *Bunri Seisei Gijutsu Handobukku* (1993, The Chemical Society of Japan, ed.), *Kagaku Henkan Hō Niyoru Biryōseibun Oyobi Nan-Seisei Busshitsu No Kōdo-Bunri* (1988, published by Industrial Publishing & Consulting, Inc.), or *Jikken Kagaku K ōza* (4th edition) 1, section "*Bunri To Seisei*" (1990, The Chemical Society of Japan, ed.). Specific examples thereof include extraction (including suspension washing, washing with boiling, ultrasonic cleaning, and acid/base cleaning), adsorption, occlusion, fusion, crystallization (including recrystallization or reprecipitation from solvent), distillation (atmospheric distillation, vacuum distillation), vaporization, sublimation (atmospheric sublimation, vacuum sublimation), ion exchange, dialysis, filtration, ultrafiltration, reverse osmosis, pressure osmosis, zone melting, electrophoresis, centrifugal separation, floatation, sedimentation, magnetic separation, and various chromatographic techniques (Sorting by shape; column, paper, thin film, capillary: sorting by mobile phase; gas, liquid, micelles, supercritical fluid. Separation mechanism; adsorption, distribution, ion exchange, molecular sieve, chelate, gel filtration, exclusion, affinity).

As methods for ascertaining products or determining the purity thereof, the following techniques can, for example, be applied according to need: a gas chromatograph (GC), high-performance liquid chromatograph (HPLC), high-speed amino acid analyzer (organic compounds), capillary electrophoresis (CE), size exclusion chromatograph (SEC), gel permeation chromatograph (GPC), cross fraction chromatograph (CFC), mass spectrometry (MS, LC/MS, GC/MS, MS/MS), nuclear magnetic resonance apparatus (NMR (1HNMR, 13CNMR)), Fourier transform infrared spectrophotometer (FT-IR), spectrophotometer for ultraviolet, visible, and near infrared regions (UV, VIS, NIR), electron spin resonance apparatus (ESR), transmission electron microscope (TEM-EDX), electron probe microanalyzer (EPMA), metallic-element analysis (ion chromatograph, inductively coupled plasma emission spectrometry (ICP-AES), atomic absorption spectrophotometry (AAS), fluorescent X-ray spectrometer (XRF)), non-metallic-element analysis, trace analysis (ICP-MS, GF-AAS, GD-MS), and the like.

<Applications of the Charge-Transporting Polymer>

It is preferred that the charge-transporting polymer of the invention should be used as a charge transport material, and it is especially preferred to use the polymer as a material for organic electroluminescent elements. In the case where the charge-transporting polymer is to be used as a material for an organic electroluminescent element, it is preferred to use the polymer as a charge transport material in the hole injection layer and/or hole transport layer of the organic electroluminescent element.

It is also preferred that the charge-transporting polymer of the invention should be used for organic layers formed by a wet film formation method, because an organic electroluminescent element can be easily produced by this technique.

<Network High-Molecular Compound>

The charge-transporting polymer of the invention can undergo crosslinking reaction upon heating and/or irradiation with actinic energy, e.g., light, to form a network high-molecular compound, as will be described later in the section [Methods of Film Formation] under <Composition for organic electroluminescent element>. It is preferred that the layer containing the network high-molecular compound should be the hole injection layer and/or hole transport layer which will be described later in detail.

<Composition for Organic Electroluminescent Element>

The composition for organic electroluminescent element of the invention is a composition containing at least one charge-transporting polymer of the invention.

The composition for organic electroluminescent element of the invention is used for producing an organic electroluminescent element including an anode, a cathode, and one or more organic layers disposed between the anode and the cathode, usually as a coating fluid for forming any of the organic layers by a wet film formation method. It is preferred that the composition for organic electroluminescent element of the invention should be used for forming a hole transport layer among such organic layers.

Incidentally, when the organic electroluminescent element includes one layer between the anode and the luminescent layer, this one layer is referred to as "hole transport layer". When there are two or more layers therebetween, the layer which is in contact with the anode is referred to as "hole injection layer" and the other layer(s) are inclusively referred to as "hole transport layer". There are also cases where the layers disposed between the anode and the luminescent layer are inclusively referred to as "hole injection/transport layers".

Although the composition for organic electroluminescent element of the invention is characterized by containing the charge-transporting polymer of the invention, the composition usually further contains a solvent.

The solvent preferably is one in which the charge-transporting polymer of the invention dissolves. Usually, the solvent is a solvent in which the high-molecular compound can dissolve in an amount of 0.05% by weight or more, preferably 0.5% by weight or more, more preferably 1% by weight or more, at ordinary temperature.

The composition for organic electroluminescent element of the invention may contain only one charge-transporting polymer of the invention or may contain two or more charge-transporting polymers of the invention.

The composition for organic electroluminescent element of the invention contains the charge-transporting polymer(s) of the invention in an amount which is generally 0.01% by weight or more, preferably 0.05% by weight or more, more preferably 0.1% by weight or more, and is generally 50% by weight or less, preferably 20% by weight or less, more preferably 10% by weight or less.

The composition may contain additives such as various additives. In this case, it is preferred to use a solvent in which the charge-transporting polymer(s) of the invention and the additives can dissolve each in a concentration of 0.05% by weight or higher, preferably 0.5% by weight or higher, more preferably 1% by weight or higher.

Examples of additives usable in the composition for organic electroluminescent element of the invention in order to accelerate the crosslinking reaction of the charge-transporting polymer of the invention include polymerization initiators or polymerization accelerators, such as alkylphenone compounds, acylphosphine oxide compounds, metallocene compounds, oxime ester compounds, azo compounds, and onium salts, and photosensitizers such as fused-ring hydrocarbons, porphyrin compounds, and diaryl ketone compounds. One of these compounds may be used alone, or two or more thereof may be used in combination.

In the case where the composition for organic electroluminescent element of the invention is to be used for forming a hole injection layer, it is preferred that the composition should further contain an electron-accepting compound from the standpoint of forming a layer having a reduced resistance value.

The electron-accepting compound preferably is a compound which has oxidizing ability and has the ability to accept one electron from the hole-transporting compound described above. Specifically, compounds having an electron affinity of 4 eV or higher are preferred, and compounds having an electron affinity of 5 eV or higher are more preferred.

Examples of such electron-accepting compounds include onium salts substituted with organic groups, such as 4-isopropyl-4'-methyldiphenyliodonium tetrakis(pentafluorophenyl)borate, inorganic compounds having a high valence, such as iron(III) chloride (JP-A-11-251067) and ammonium peroxodisulfate, cyano compounds such as tetracyanoethylene, aromatic boron compounds such as tris(pentafluorophenyl) boran (JP-A-2003-31365), fullerene derivatives, and iodine.

From the standpoint of having high oxidizing ability, onium salts substituted with organic groups, inorganic compounds having a high valence, and the like are preferred of the compounds shown above. On the other hand, onium salts substituted with organic groups, cyano compounds, aromatic boron compounds, and the like are preferred from the standpoint that these compounds have high solubility in various solvents and are applicable to film formation by a wet film formation method.

Specific examples of the onium salts substituted with organic groups, cyano compounds, and aromatic boron compounds which are suitable for use as electron-accepting compounds include such salts and compounds given in International Publication No. 2005/089024, pamphlet, and preferred examples thereof also are the same. For example, the examples include the compounds represented by the following structural formulae, but the electron-accepting compounds should not be construed as being limited to the following examples.

[Chem. 31]

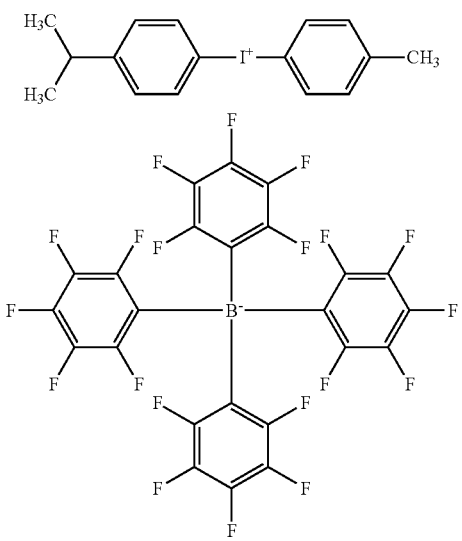

One electron-accepting compound may be used alone, or two or more electron-accepting compounds may be used in any desired combination and proportion.

The solvent to be contained in the composition for organic electroluminescent element of the invention is not particularly limited. However, since it is necessary to dissolve the charge-transporting polymer of the invention therein, preferred examples of the solvent include the following organic solvents: aromatic solvents such as toluene, xylene, mesitylene, and cyclohexylbenzene; halogen-containing solvents such as 1,2-dichloroethane, chlorobenzene, and o-dichlorobenzene; ether solvents including aliphatic ethers such as ethylene glycol dimethyl ether, ethylene glycol diethyl ether, and propylene glycol 1-monomethyl ether acetate (PGMEA) and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole; aliphatic esters such as ethyl acetate, n-butyl acetate, ethyl lactate, and n-butyl lactate; and ester solvents such as phenyl acetate, phenyl propionate, methyl benzoate, ethyl benzoate, isopropyl benzoate, propyl benzoate, and n-butyl benzoate. These compounds may be used alone, or two or more thereof may be used in combination.

In the composition for organic electroluminescent element of the invention, the solvent is contained therein in a concentration of generally 10% by weight or higher, preferably 50% by weight or higher, more preferably 80% by weight or higher.

It is widely known that moisture may cause a decrease in the performance of the organic electroluminescent element and, in particular, may accelerate the decrease in luminance which occurs with continuous driving. From the standpoint of minimizing moisture remaining in the coating film, solvents having a water solubility therein at 25° C. of 1% by weight or less are preferred of these solvents. More preferred are solvents which have a water solubility therein at 25° C. of 0.1% by weight or less.

Examples of solvents that can be contained in the composition for organic electroluminescent element of the invention include solvents having a surface tension at 20° C. of less than 40 dyn/cm, preferably 36 dyn/cm or less, more preferably 33 dyn/cm or less.

This is because in the case where a crosslinked layer according to the invention is to be formed by a wet film formation method, affinity for the underlying layer is important. Since evenness of film quality considerably affects the evenness and stability of luminescence of the organic electroluminescent element, the coating fluid to be applied by a wet film formation method is required to have a low surface tension so as to have higher leveling properties and be capable of forming an even coating film. By using such a solvent, an even crosslinked layer according to the invention can be formed.

Specific examples of such solvents having a low surface tension include the aforementioned aromatic solvents including toluene, xylene, mesitylene, and cyclohexylbenzene, ester solvents including ethyl benzoate, and ether solvents including anisole, and further include trifluoromethoxyanisole, pentafluoromethoxybenzene, 3-(trifluoromethyl)anisole, and ethyl pentafluorobenzoate.

The concentration of these solvents in the composition is generally 10% by weight or higher, preferably 30% by weight or higher, more preferably 50% by weight or higher.

Other examples of solvents that can be contained in the composition for organic electroluminescent element of the invention include solvents having a vapor pressure at 25° C. which is 10 mmHg or lower, preferably 5 mmHg or lower, and is generally 0.1 mmHg or higher. Use of such a solvent makes it possible to prepare a composition which is suitable for use in a process for producing an organic electroluminescent element by a wet film formation method and which is suitable for the properties of the charge-transporting polymer of the invention. Specific examples of such solvents include the aforementioned aromatic solvents including toluene, xylene, and mesitylene, ether solvents, and ester solvents. The concentration of these solvents in the composition is generally 10% by weight or higher, preferably 30% by weight or higher, more preferably 50% by weight or higher.

Examples of solvents that can be contained in the composition for organic electroluminescent element of the invention further include a mixed solvent composed of a solvent having a vapor pressure at 25° C. which is 2 mmHg or higher, preferably 3 mmHg or higher, more preferably 4 mmHg or higher (the upper limit is preferably 10 mmHg or lower) and a solvent having a vapor pressure at 25° C. of lower than 2 mmHg, preferably 1 mmHg or lower, more preferably 0.5 mmHg or lower. By using such a mixed solvent, a homogeneous layer containing the charge-transporting polymer of the invention and further containing an electron-accepting compound can be formed by a wet film formation method.

The concentration of such a mixed solvent in the composition is generally 10% by weight or higher, preferably 30% by weight or higher, more preferably 50% by weight or higher.

An organic electroluminescent element is formed by superposing a large number of layers including organic compounds. Evenness of film quality is therefore highly important. In the case where a layer is to be formed by a wet film formation method, methods of film formation such as coating techniques, e.g., spin coating and spraying, and printing techniques, e.g., ink-jet printing and screen printing, can be employed according to the material of the layer and the properties of the underlying layer. For example, spraying is effective in forming an even film on surfaces having irregularities and, hence, use of spraying is preferred when a layer including an organic compound is formed on a surface where irregularities due to a patterned electrode or due to partitions between pixels remain. In the case of application by spraying, it is preferred that droplets of the coating fluid ejected from the nozzle toward the surface to be coated should be as small as possible, because smaller droplets are more suitable for obtaining even film quality. For this purpose, it is preferred that a solvent having a high vapor pressure should be mixed with a coating fluid and part of the solvent should be allowed to volatilize from ejected coating-fluid droplets in the coating atmosphere to thereby generate minute droplets just before adhesion to the substrate. Furthermore, for obtaining more even film quality, it is necessary to ensure the time period required for the liquid film formed on the substrate just after application to level. For attaining this purpose, use is made of a method in which a solvent which dries slower, i.e., a solvent having a low vapor pressure, is incorporated to a certain degree.

Examples of the solvent having a vapor pressure at 25° C. of 2 mmHg to 10 mmHg include organic solvents such as xylene, anisole, cyclohexanone, and toluene. Examples of the solvent having a vapor pressure at 25° C. of lower than 2 mmHg include ethyl benzoate, methyl benzoate, tetralin, and phenetole.

With respect to proportions in a mixed solvent, the proportion of a solvent having a vapor pressure at 25° C. of 2 mmHg or higher is 5% by weight or higher, preferably 25% by weight or higher, but less than 50% by weight, based on the total amount of the mixed solvent, and the proportion of a solvent having a vapor pressure at 25° C. of lower than 2 mmHg is 30% by weight or higher, preferably 50% by weight or higher, especially preferably 75% by weight or higher, but less than 95% by weight, based on the total amount of the mixed solvent.

Since an organic electroluminescent element is formed by superposing a large number of layers including organic compounds, these layers each are required to be an even layer. In the case where a layer is to be formed by a wet film formation method, there is a possibility that moisture might come into the solution (composition) for layer formation and the resultant coating film might hence contain moisture, resulting in impaired film evenness. It is therefore preferred that the moisture content of the solution should be as low as possible. Specifically, the amount of water contained in the composition for organic electroluminescent element is preferably 1% by weight or less, more preferably 0.1% by weight or less, even more preferably 0.05% by weight or less.

Organic electroluminescent elements employ a large number of materials which deteriorate considerably by the action of moisture, e.g., the cathode. Consequently, the presence of moisture is undesirable also from the standpoint of deterioration of the element. Examples of methods for reducing the water content of a solution include sealing with nitrogen gas, use of a drying agent, solvent dehydration conducted beforehand, and use of a solvent in which water is poorly soluble. Use of a solvent in which water is poorly soluble is preferred of these methods because the phenomenon in which during a coating step, the coating film of the solution absorbs moisture from the air to blush can be prevented in this case.

From such a standpoint, it is preferred that the composition for organic electroluminescent element of the invention should contain a solvent having a water solubility therein at 25° C. of, for example, 1% by weight or less (preferably 0.1% by weight or less), in an amount of 10% by weight or more based on the composition. It is more preferred that the content of a solvent satisfying the solubility requirement should be 30% by weight or higher, and it is especially preferred that the content thereof should be 50% by weight or higher.

Besides the solvents described above, other various solvents may be contained in the composition for organic electroluminescent element of the invention according to need. Examples of such other solvents include amides, such as N,N-dimethylformamide and N,N-dimethylacetamide, and dimethyl sulfoxide.

Furthermore, the composition for organic electroluminescent element of the invention may contain various additives including applicability improvers, such as a leveling agent and a defoamer.

[Methods of Film Formation]

As stated above, since an organic electroluminescent element is formed by superposing a large number of layers including organic compounds, evenness of film quality is highly important. In the case where a layer is to be formed by a wet film formation method, methods of film formation such as coating techniques, e.g., spin coating and spraying, and printing techniques, e.g., ink-jet printing and screen printing, can be employed according to the material of the layer and the properties of the underlying layer.

In the case of using a wet film formation method, the charge-transporting polymer of the invention and other ingredients which are used according to need (e.g., an electron-accepting compound, an additive for accelerating crosslinking reaction, and an applicability improver) are dissolved in a suitable solvent to prepare the composition for organic electroluminescent element. This composition is applied to the layer which is to underlie the layer to be formed, by a technique such as spin coating or dip coating, and the composition applied is dried and then crosslinked to thereby form a crosslinked layer according to the invention.

In the case where the charge-transporting polymer of the invention is subjected to crosslinking reaction and thereby converted to a network high-molecular compound, heating and/or irradiation with actinic energy, e.g., light, is usually conducted.

Techniques for heating are not particularly limited, and examples thereof include drying by heating. With respect to conditions for the drying by heating, the layer formed from the composition for organic electroluminescent element of the invention is heated at a temperature which is generally 120° C. or higher and is preferably 400° C. or lower.

The heating period is generally 1 minute or longer but preferably 24 hours or shorter. Although methods for heating are not particularly limited, use may be made, for example, of a method in which the multilayer structure having the layer formed is put on a hot plate or heated in an oven. For example, use can be made of conditions under which the multilayer structure is heated on a hot plate at 120° C. or higher for 1 minute or longer.

Techniques for heating are not particularly limited. With respect to conditions for the drying by heating, the layer formed from the composition for organic electroluminescent element is heated at a temperature which is generally 100° C. or higher, preferably 120° C. or higher, more preferably 150° C. or higher, and is generally 400° C. or lower, preferably 350° C. or lower, more preferably 300° C. or lower. The heating period is generally 1 minute or longer but preferably 24 hours or shorter. Although methods for heating are not particularly limited, use may be made, for example, of a method in which the multilayer structure having the layer formed is put on a hot plate or heated in an oven. For example, use can be made of conditions under which the multilayer structure is heated on a hot plate at 120° C. or higher for 1 minute or longer.

In the case of irradiation with actinic energy such as light, examples of methods therefor include a method in which an ultraviolet, visible, or infrared light source, e.g., an ultrahigh-pressure mercury lamp, high-pressure mercury lamp, halogen lamp, or infrared lamp, is used to directly illuminate the layer and a method in which a mask aligner or conveyor type illuminator that has any of those light sources built therein is used to illuminate the layer. With respect to irradiation with actinic energy other than light, examples of methods therefor include a method in which an apparatus for irradiating with microwaves generated by a magnetron, i.e., the so-called electronic oven, is used for the irradiation.

With respect to irradiation period, it is preferred to set conditions necessary for allowing crosslinking reaction to proceed sufficiently. However, the film may be irradiated for a period of generally 0.1 sec or longer but preferably 10 hours or shorter.

Heating and irradiation with actinic energy, e.g., light, may be conducted alone or in combination. In the case where heating and the irradiation are conducted in combination, the sequence of performing these is not particularly limited.

It is preferred that heating and irradiation with actinic energy such as light should be conducted in an atmosphere containing no moisture, e.g., a nitrogen gas atmosphere, in order to reduce the amount of moisture contained in and/or adsorbed on the surface of the layer which has undergone the heating and irradiation. For the same purpose, in the case where heating and/or irradiation with actinic energy such as light are conducted in combination, it is especially preferred that at least the step immediately before the formation of a luminescent layer should be conducted in an atmosphere containing no moisture, e.g., a nitrogen gas atmosphere.

<Organic Electroluminescent Element>

The organic electroluminescent element of the invention is an organic electroluminescent element which includes a substrate and, disposed thereover, an anode, a cathode, and an organic layer interposed between the anode and the cathode, and in which the organic layer is a layer containing the network high-molecular compound according to the invention.

In the organic electroluminescent element of the invention, it is preferred that the crosslinked layer according to the invention should be a hole injection layer and/or a hole transport layer.

It is preferred that the crosslinked layer according to the invention should be formed from the composition for organic electroluminescent element of the invention by a wet film formation method.

It is preferred that the organic electroluminescent element should have, on the side of the hole transport layer facing the cathode, a luminescent layer formed by a wet film formation method and further have, on the side of the hole transport layer facing the anode, a hole injection layer formed by a wet film formation method. Namely, it is preferred that the organic electroluminescent element of the invention should include a hole injection layer, a hole transport layer, and a luminescent layer, all of which have been formed by a wet film formation method. In particular, this luminescent layer formed by a wet film formation method preferably is a layer constituted of a low-molecular material.

FIG. 1 is a sectional view diagrammatically illustrating an example of the structure of an organic electroluminescent element of the invention. The organic electroluminescent element shown in FIG. 1 is configured by superposing an anode, a hole injection layer, a hole transport layer, a luminescent layer, a hole blocking layer, an electron injection layer, and a cathode in this order on a substrate. In the case of this configuration, the hole transport layer usually is the organic-compound-containing layer according to the invention described above.

[1] Substrate

The substrate serves as the support of the organic electroluminescent element, and use may be made of a plate of quartz or glass, a metal plate, a metal foil, a plastic film or sheet, or the like. Especially preferred are a glass plate and a plate of a transparent synthetic resin such as a polyester, polymethacrylate, polycarbonate, or polysulfone. In the case of using a synthetic-resin substrate, it is necessary to take account of gas barrier properties. In case where the substrate has too low gas barrier properties, there are cases where the surrounding air might pass through the substrate to deteriorate the organic electroluminescent element. Too low gas barrier properties are hence undesirable. Consequently, one of preferred methods is to form a dense silicon oxide film on at least one surface of a synthetic-resin substrate to ensure gas barrier properties.

[2] Anode

The anode has the function of injecting holes into a layer located on the luminescent-layer side (e.g., the hole injection layer or the luminescent layer) which will be described later. This anode is usually constituted of a metal, e.g., aluminum, gold, silver, nickel, palladium, or platinum, a metal oxide, e.g., an indium and/or tin oxide, a metal halide, e.g., copper iodide, carbon black, a conductive polymer, e.g., poly(3-methylthiophene), polypyrrole, or polyaniline, or the like. Usually, the anode is frequently formed by sputtering, vacuum deposition, or the like. In the case of fine particles of a metal, e.g., silver, fine particles of copper iodide or the like, carbon black, fine particles of a conductive metal oxide, fine particles of a conductive polymer, or the like, use may be made of a method in which such fine particles are dispersed in an appropriate binder resin solution and the dispersion is applied to a substrate to form an anode. Furthermore, in the case of a conductive polymer, an anode can be formed by directly forming a thin film on a substrate through electrolytic polymerization or by coating the conductive polymer to a substrate (see *Applied Physics Letters*, Vol. 60, p. 2711, 1992). The anode can be formed by superposing different materials.

The thickness of the anode varies depending on the degree of transparency required. When transparency is required, it is desirable that the anode should be regulated so as to have a visible-light transmittance of generally 60% or higher, preferably 80% or higher. In this case, the thickness of the anode is generally 5 nm or more, preferably 10 nm or more, and is generally 1,000 nm or less, preferably 500 nm or less. When the anode may be opaque, this anode may be identical with the substrate. Furthermore, it is possible to superpose a different conductive material on the anode.

It is preferred that the surface of the anode should be subjected to an ultraviolet (UV)/ozone treatment or a treatment with an oxygen plasma or argon plasma for the purposes of removing impurities adherent to the anode and regulating ionization potential to improve hole injection properties.

[3] Hole Injection Layer

A hole injection layer is formed on the anode.

The hole injection layer is a layer for transporting holes to the layer located adjacently to the anode on the side facing the cathode.

Incidentally, the organic electroluminescent element of the invention may have a configuration in which the hole injection layer has been omitted.

It is preferred that the hole injection layer should contain a hole-transporting compound, and it is more preferred that the hole injection layer should contain a hole-transporting compound and an electron-accepting compound. Furthermore, it is preferred that the hole injection layer should contain a cation-radical compound, and it is especially preferred that the hole injection layer should contain a cation-radical compound and a hole-transporting compound.

The hole injection layer may contain a binder resin and an applicability improver according to need. The binder resin preferably is a resin which is less apt to function as a charge trap.

It is also possible to form a hole injection layer by forming a film of an electron-accepting compound alone on an anode by a wet film formation method and directly coating a charge transport material composition on the layer to superpose a layer thereon. In this case, part of the charge transport material composition interacts with the electron-accepting compound to thereby form a layer having excellent hole injection properties.

(Hole-Transporting Compound)

The hole-transporting compound preferably is a compound having an ionization potential of 4.5 eV to 6.0 eV. However, in the case of use in a wet film formation method, a hole-transporting compound having high solubility in the solvent to be used in the wet film formation method is more preferred.

It is preferred that the hole-transporting compound should be the charge-transporting polymer of the invention from the standpoint that this polymer has excellent film-forming properties and high charge-transporting ability. Namely, it is preferred to form a layer using the composition for organic electroluminescent element of the invention.

In the case where a compound other than the charge-transporting polymer of the invention is used as a hole-transporting compound, examples of the hole-transporting compound include aromatic amine compounds, phthalocyanine derivatives, porphyrin derivatives, oligothiophene derivatives, and polythiophene derivatives. Of these, aromatic amine compounds are preferred from the standpoints of noncrystallinity and visible-light transmittance.

The kind of aromatic amine compound is not particularly limited, and the aromatic amine compounds may be low-molecular compounds or high-molecular compounds. However, from the standpoint of the effect of surface smoothing, a high-molecular compound (polymeric hydrocarbon compound made up of consecutive repeating units) having a weight-average molecular weight of 1,000-1,000,000 is preferred.

Preferred examples of the aromatic amine compounds further include aromatic tertiary amine high-molecular compounds having a repeating unit represented by the following formula (1).

[Chem. 32]

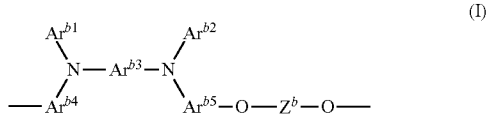
(I)

(In formula (1), $Ar^{b1}$ and $Ar^{b2}$ each independently represent a monovalent aromatic hydrocarbon group which may have a substituent or a monovalent aromatic heterocyclic group which may have a substituent. $Ar^{b3}$ to $Ar^{b5}$ each independently represent a divalent aromatic hydrocarbon group which may have a substituent or a divalent aromatic heterocyclic group which may have a substituent. $Z^b$ represents a linking group selected from the following linking groups. Of $Ar^{b1}$ to $Ar^{b5}$, two groups bonded to the same nitrogen atom may be bonded to each other to form a ring.)

[Chem. 33]

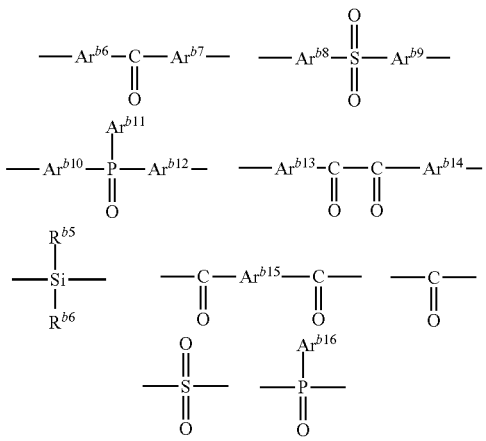

(In the formulae, $Ar^{b6}$ to $Ar^{b16}$ each independently represent a monovalent or divalent group derived from an aromatic hydrocarbon ring which may have a substituent or from an aromatic heterocycle which may have a substituent. $R^{b5}$ and $R^{b6}$ each independently represent a hydrogen atom or any desired substituent.)

$Ar^{b1}$ to $Ar^{b16}$ can be monovalent or divalent groups derived from any desired aromatic hydrocarbon rings or aromatic heterocycles. These groups may be the same or different. Furthermore, these groups may have any desired substituents.

Specific examples of the aromatic tertiary amine high-molecular compounds having a repeating unit represented by general formula (1) include the compounds described in International Publication No. 2005/089024, pamphlet.

Any one of such compounds may be contained as a hole-transporting compound used as a material for the hole injection layer, or two or more thereof may be contained as hole-transporting compounds.

In the case where two or more hole-transporting compounds are contained, any desired combination thereof may be used. However, it is preferred to use one or more aromatic tertiary amine high-molecular compounds in combination with one or more other hole-transporting compounds.

(Electron-Accepting Compound)

The electron-accepting compound is the same as described above in the section <Composition for organic electroluminescent element>. Preferred embodiments also are the same.

(Cation-Radical Compound)

The cation-radical compound preferably is an ionic compound constituted of a cation radical which is a chemical species formed by removing one electron from a hole-transporting compound and of a counter anion. However, in the case where the cation radical is a radical derived from a hole-transporting high-molecular compound, this cation radical has a structure formed by removing one electron from the repeating units of the high-molecular compound.

It is preferred that the cation radical should be a chemical species formed by removing one electron from any of the compounds shown above as hole-transporting compounds. The cation radical which is a chemical species formed by removing one electron from any of the compounds that are preferred hole-transporting compounds is suitable from the standpoints of noncrystallinity, visible-light transmittance, heat resistance, solubility, etc.

A cation-radical compound can be yielded by mixing any of the hole-transporting compounds described above with any of the electron-accepting compounds. Namely, when any of the hole-transporting compounds is mixed with any of the electron-accepting compounds, electron transfer from the hole-transporting compound to the electron-accepting compound occurs to yield a cation-ion compound constituted of a cation radical of the hole-transporting compound and a counter anion.

Cation-radical compounds derived from a high-molecular compound, such as PEDOT/PSS (*Adv. Mater.*, Vol. 12, p. 481, 2000) and emeraldine hydrochloride (*J. Phys. Chem.*, Vol. 94, p. 7716, 1990), are yielded also by oxidative polymerization (dehydrogenation polymerization).

The oxidative polymerization herein means polymerization in which a monomer is oxidized in an acidic solution either chemically using, for example, a peroxodisulfuric acid salt or electrochemically. In the case of this oxidative polymerization (dehydrogenation polymerization), the monomer is oxidized and thereby converted to a high-molecular compound, and a cation radical is also yielded by the removal of one electron from the repeating units of the high-molecular compound, the cation radical taking, as a counter anion, an anion derived from the acidic solution.

The hole injection layer can be formed either by a wet film formation method or by a dry film formation method, e.g., vacuum deposition. It is preferred to form the layer by a wet film formation method from the standpoint that this method has excellent film-forming properties.

The thickness of the hole injection layer is generally 5 nm or more, preferably 10 nm or more, and is generally 1,000 nm or less, preferably 500 nm or less.

In the hole injection layer, the content of the electron-accepting compound based on the hole-transporting compound is generally 0.1% by mole or higher, preferably 1% by mole or higher. However, the content thereof is generally 100% by mole or lower, preferably 40% by mole or lower.

(Other Constituent Materials)

Besides the hole-transporting compound and electron-accepting compound described above, other ingredients may be incorporated as materials for the hole injection layer unless the incorporation thereof considerably lessens the effects of the invention. Examples of the other ingredients include various luminescent materials, electron-transporting compounds, binder resins, and applicability improvers. One of such other ingredients may be used alone, or two or more thereof may be used in any desired combination and proportion.

(Solvent)

It is preferred that the solvent contained in the composition for use in hole injection layer formation by a wet film formation method should include at least one compound in which the constituent materials for the hole injection layer described above can dissolve. It is also preferred that the boiling point of the solvent should be generally 110° C. or higher, preferably 140° C. or higher, more preferably 200° C. or higher, and be generally 400° C. or lower, in particular 300° C. or lower. In case where the boiling point of the solvent is too low, there is a possibility that the composition might dry at too high a rate, resulting in impaired film quality. In case where the boiling point of the solvent is too high, it is necessary to use a higher temperature in the drying step and this may adversely affect other layers or the substrate.

Examples of the solvent include ether solvents, ester solvents, aromatic hydrocarbon solvents, and amide solvents.

Examples of the ether solvents include aliphatic ethers such as ethylene glycol dimethyl ether, ethylene glycol diethyl ether, and propylene glycol 1-monomethyl ether acetate (PGMEA); and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of the ester solvents include aromatic esters such as phenyl acetate, phenyl propionate, methyl benzoate, ethyl benzoate, propyl benzoate, and n-butyl benzoate.

Examples of the aromatic hydrocarbon solvents include toluene, xylene, cyclohexylbenzene, 3-iropropylbiphenyl, 1,2,3,4-tetramethylbenzene, 1,4-diisopropylbenzene, cyclohexylbenzene, and methylnaphthalene.

Examples of the amide solvents include N,N-dimethylformamide and N,N-dimethylacetamide.

Furthermore, dimethyl sulfoxide and the like are also usable.

One of these solvents may be used alone, or two or more thereof may be used in any desired combination and proportion.

(Methods of Film Formation)

After the composition for hole injection layer formation has been prepared, this composition is applied, by wet film formation, to the layer (usually, the anode) which is to underlie the hole injection layer, and the resultant coating film is dried. Thus, a hole injection layer is formed.

The temperature to be used in the film formation step is preferably 10° C. or higher and is preferably 50° C. or lower, from the standpoint of preventing crystals from generating in the composition and thereby causing film defects.

The relative humidity in the film formation step is not limited unless the effects of the invention are considerably lessened. However, the relative humidity is generally 0.01 ppm or higher and is generally 80% or less.

After the application, the film of the composition for hole injection layer formation is dried usually by heating, etc. For drying the film, a heating step is usually conducted. Examples of means for heating usable in the heating step include a clean oven, hot plate, infrared rays, halogen heater, and irradiation with microwaves. Of these, a clean oven and a hot plate are preferred from the standpoint of evenly heating the whole film.

With respect to heating temperature in the heating step, it is preferred to heat the film at a temperature not lower than the boiling point of the solvent used in the composition for hole injection layer formation, unless this drying considerably lessens the effects of the invention. Furthermore, in the case where the solvent used in the composition for hole injection layer formation is a mixed solvent including two or more solvents, it is preferred to heat the film at a temperature not lower than the boiling point of at least one of the solvents. When an increase in the boiling point of solvents is taken into account, it is preferred to heat the film in the heating step at a temperature which is preferably 120° C. or higher and is preferably 410° C. or lower.

In the heating step, the heating temperature preferably is not lower than the boiling point of the solvent of the composition for hole injection layer formation. The heating period is not limited so long as the coating film is not sufficiently crosslinked. However, the heating period is preferably 10 seconds or longer, and is generally 180 minutes or shorter. In case where the heating period is too long, components of other layers tend to diffuse. In case where the heating period is too short, the resultant hole injection layer tends to be inhomogeneous. Heating may be conducted two times.

<Formation of Hole Injection Layer by Vacuum Deposition>

In the case where a hole injection layer is to be formed by vacuum deposition, one or more constituent materials (e.g., the hole-transporting compound and electron-accepting compound described above) for the hole injection layer are placed in one or more crucibles disposed within a vacuum vessel (when two or more materials are used, the materials are placed in respective crucibles). The inside of the vacuum vessel is evacuated with an appropriate vacuum pump to about $10^{-4}$ Pa, and the crucibles are then heated (when two or more materials are used, the respective crucibles are heated) to vaporize the materials while controlling vaporization amount (when two or more materials are used, the materials are vaporized while independently controlling the amounts of the materials being vaporized) to form a hole injection layer on the anode of a substrate placed so as to face the crucibles. Incidentally, in the case where two or more materials are used, use may be made of a method in which a mixture of these materials is placed in a crucible, heated, and vaporized to form a hole injection layer.

The degree of vacuum during the deposition is not limited unless the effects of the invention are considerably lessened. However, the degree of vacuum is generally $0.1 \times 10^{-6}$ Torr ($0.13 \times 10^{-4}$ Pa) or higher, and is generally $9.0 \times 10^{-6}$ Torr ($12.0 \times 10^{-4}$ Pa) or lower. The rate of deposition is not limited unless the effects of the invention are considerably lessened. However, the rate of deposition is generally 0.1 Å/sec or higher, and is generally 5.0 Å/sec or lower. Film formation temperature during the deposition is not limited unless the effects of the invention are considerably lessened. However, the deposition is conducted at a temperature which is preferably 10° C. or higher and is preferably 50° C. or lower.

The thickness of the hole injection layer is generally 5 nm or more, preferably 10 nm or more, and is generally 1,000 nm or less, preferably 500 nm or less.

[4] Hole Transport Layer

In the case where there is a hole injection layer, a hole transport layer can be formed on the hole injection layer. When there is no hole injection layer, then a hole transport layer can be formed on the anode. The organic electroluminescent element of the invention may have a configuration in which the hole transport layer has been omitted.

For forming the hole transport layer, it is preferred to use a material which has high hole-transporting properties and can efficiently transport injected holes. In order for a material to have such properties, it is preferred that the material should have a low ionization potential, be highly transparent to visible light, and have a high hole mobility and excellent stability, and that impurities functioning as a trap do not generate during production of the material or during use. Furthermore, since the hole transport layer is in contact with the luminescent layer in many cases, it is preferred that the material constituting the hole transport layer should not function to cause extinction of luminescence from the luminescent layer or to form an exciplex with the luminescent layer and thereby reduce efficiency.

From those standpoints, it is especially preferred that the hole-transporting compound should be the charge-transporting polymer of the invention. In the case where a compound other than the charge-transporting polymer of the invention is used as a hole-transporting compound, use can be made of materials which have conventionally been used as constituent materials for hole transport layers. Examples of the materials which have conventionally been used include the hole-transporting compounds shown above as examples for use in the hole injection layer described above. Examples thereof further include aromatic diamines which contain two or more tertiary amines and in which the nitrogen atoms have two or more fused aromatic rings bonded thereto as substituents, the aromatic diamines being represented by 4,4'-bis[N-(1-naphthyl)-N-phenylamino]biphenyl (JP-A-5-234681), aromatic amine compounds having a starburst structure, such as 4,4', 4"-tris(1-naphthylphenylamino)triphenylamine (*J. Lumin.*, Vol. 72-74, p. 985, 1997), the aromatic amine compound constituted of the tetramer of triphenylamine (*Chem. Commun.*, p. 2175, 1996), spiro compounds such as 2,2',7,7'-tetrakis(diphenylamino)-9,9'-spirobifluorene (*Synth. Metals*, Vol. 91, p. 209, 1997), and carbazole derivatives such as 4,4'-N,N'-dicarbazolylbiphenyl. Other examples include polyvinylcarbazole, polyvinyltriphenylamine (JP-A-7-53953), and poly(arylene ether sulfone)s containing tetraphenylbenzidine (*Polym. Adv. Tech.*, Vol. 7, p. 33, 1996).

In the case where a hole transport layer is to be formed through wet film formation, a composition for hole transport layer formation is prepared, thereafter applied, and then dried by heated, in the same manner as in the formation of the hole injection layer.

Besides the hole-transporting compound described above, a solvent is contained in the composition for hole transport layer formation. The solvent to be used may be the same as that used in the composition for hole injection layer formation. Application conditions, heating/drying conditions, and the like may also be the same as in the formation of the hole injection layer.

Also in the case where a hole transport layer is to be formed by vacuum deposition, conditions for the deposition and other conditions may be the same as in the formation of the hole injection layer.

The hole transport layer may contain various luminescent materials, electron-transporting compounds, binder resins, applicability improvers, etc., besides the hole-transporting compound.

The hole transport layer may also be a layer formed by crosslinking a crosslinkable compound. The crosslinkable compound is a compound which has a crosslinkable group and forms a network high-molecular compound through crosslinking.

Examples of the crosslinkable group include cyclic ether groups such as an oxetane group and an epoxy group; groups containing an unsaturated double bond, such as vinyl, trifluorovinyl, styryl, acryloyl, methacryloyl, and cinnamoyl; and groups derived from a benzocyclobutene ring.

The crosslinkable compound may be any of a monomer, an oligomer, and a polymer. One crosslinkable compound may be contained alone, or two or more crosslinkable compounds may be contained in any desired combination and proportion.

As the crosslinkable compound, it is preferred to use a hole-transporting compound having a crosslinkable group. Examples of the hole-transporting compound include nitrogen-containing aromatic compound derivatives such as pyridine derivatives, pyrazine derivatives, pyrimidine derivatives, triazine derivatives, quinoline derivatives, phenanthroline derivatives, carbazole derivatives, phthalocyanine derivatives, and porphyrin derivatives; triphenylamine derivatives; silole derivatives; oligothiophene derivatives; fused-ring aromatic derivatives; and metal complexes. Preferred of these are: nitrogen-containing aromatic derivatives such as pyridine derivatives, pyrazine derivatives, pyrimidine derivatives, triazine derivatives, quinoline derivatives, phenanthroline derivatives, and carbazole derivatives; and triphenylamine derivatives, silole derivatives, fused-ring aromatic derivatives, metal complexes, and the like. In particular, triphenylamine derivatives are more preferred.

For forming a hole transport layer through crosslinking of a crosslinkable compound, use is generally made of a method which includes dissolving or dispersing the crosslinkable compound in a solvent to prepare a composition for hole transport layer formation, forming this composition into a film by a wet process, and crosslinking the crosslinkable compound.

The composition for hole transport layer formation may contain an additive which accelerates the crosslinking reaction, besides the crosslinkable compound. Examples of the additive which accelerates the crosslinking reaction include polymerization initiators and polymerization accelerators, such as alkylphenone compounds, acylphosphine oxide compounds, metallocene compounds, oxime ester compounds, azo compounds, and onium salts; and photosensitizers such as fused-ring hydrocarbons, porphyrin compounds, and diaryl ketone compounds.

The composition may further contain an applicability improver such as a leveling agent or a defoamer, an electron-accepting compound, a binder resin, and the like.

The amount of the crosslinkable compound contained in the composition for hole transport layer formation is generally 0.01% by weight or more, preferably 0.05% by weight or more, more preferably 0.1% by weight or more, and is generally 50% by weight or less, preferably 20% by weight or less, more preferably 10% by weight or less.

The composition for hole transport layer formation which contains a crosslinkable compound in such a concentration is applied to the layer to be an underlying layer (usually, the hole injection layer) to form a film. Thereafter, the crosslinkable compound is crosslinked by means of heating and/or irradiation with actinic energy, such as light, and thereby converted into a network high-molecular compound.

Conditions including temperature and humidity for the application and conditions for the heating to be conducted after the application are the same as in the methods described above in the section [Methods of Film Formation] under <Organic Electroluminescent Element>. Preferred embodiments also are the same.

The thickness of the hole transport layer is generally 5 nm or more, preferably 10 nm or more, and is generally 1,000 nm or less, preferably 500 nm or less.

[5] Luminescent Layer

When there is a hole transport layer, a luminescent layer is formed on the hole transport layer. When there is no hole transport layer and there is a hole injection layer, then a luminescent layer is formed on the hole injection layer. When there is neither a hole transport layer nor a hole injection layer, then a luminescent layer is formed on the anode.

The luminescent layer may be a layer which is independent of the hole injection layer and hole transport layer described above and of the hole blocking layer, electron transport layer, and other layers which will be described later. However, there is no need of forming an independent luminescent layer, and another organic layer such as, for example, the hole transport layer or the electron transport layer, may function as a luminescent layer.

The luminescent layer is a layer which, between the electrodes placed in an electric field, is excited by recombination of holes injected from the anode directly or through the hole injection layer, hole transport layer, or another layer with electrons injected from the cathode directly or through a cathode buffer layer or the electron transport layer, hole blocking layer, or another layer, and which thus functions as the main luminescence source.

The luminescent layer can be formed by any desired method unless the effects of the invention are considerably lessened. For example, the luminescent layer is formed over the anode by a wet film formation method or vacuum deposition. However, a wet film formation method is preferred in the case where a luminescent element having a large area is to be produced. For the wet film formation method and vacuum deposition, the same techniques as in the formation of the hole injection layer can be used.

The luminescent layer contains at least a material having the property of luminescing (luminescent material), and preferably further contains a material having the property of transporting holes (hole transport material) or a material having the property of transporting electrons (electron transport material). The luminescent layer may contain other ingredients so long as this is not counter to the spirit of the invention. It is preferred that these materials to be used should be materials each having a low molecular weight, from the standpoint of forming the luminescent layer by a wet film formation method as will be described later.

As the luminescent material, any desired known material can be applied. For example, the luminescent material may be either a fluorescent material or a phosphorescent material. However, a phosphorescent material is preferred from the standpoint of inner-quantum efficiency.

It is important to reduce the symmetry or rigidity of the molecule of a luminescent material or introduce an oleophilic substituent, e.g., an alkyl group, for the purpose of improving solubility in solvents.

Examples of fluorescent colorants among luminescent materials are shown below. However, usable fluorescent colorants should not be construed as being limited to the following examples.

Examples of fluorescent materials which give blue luminescence (blue fluorescent colorants) include naphthalene, chrysene, perylene, pyrene, anthracene, coumarin, p-bis(2-phenylethenyl)benzene, and derivatives of these.

Examples of fluorescent colorants which give green luminescence (green fluorescent colorants) include quinacridone derivatives, coumarin derivatives, and aluminum complexes such as Al($C_9H_6NO$)$_3$.

Examples of fluorescent materials which give yellow luminescence (yellow fluorescent colorants) include rubrene and perimidone derivatives.

Examples of fluorescent materials which give red luminescence (red fluorescent colorants) include DCM (4-(dicyanomethylene)-2-methyl-6-(p-dimethylaminostyryl)-4H-pyran) type compounds, benzopyran derivatives, Rhodamine derivatives, benzothioxanthene derivatives, and azabenzothioxanthene.

Specific examples of the phosphorescent materials include tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethylplatinum porphyrin, octaphenylplatinum porphyrin, octaethylpalladium porphyrin, and octaphenylpalladium porphyrin.

Examples of polymeric luminescent materials include polyfluorene type materials such as poly(9,9-dioctylfluorene-2,7-diyl), poly[(9,9-dioctylfluorene-2,7-diyl)-co-(4,4'-(N-4-sec-butylphenyl))diphenylamine)], and poly [(9,9-dioctylfluorene-2,7-diyl)-co-(1,4-benzo-2 {2,1'-3}-triazole)] and polyphenylenevinylene type materials such as poly[2-methoxy-5-(2-hethylhexyloxy)-1,4-phenylenevinylene].

It is possible to use the charge-transporting polymer of the invention as a luminescent material.

The molecular weight of the compound to be used as a luminescent material is not limited unless the effects of the invention are considerably lessened. However, the molecular weight thereof is generally 10,000 or lower, preferably 5,000 or lower, more preferably 4,000 or lower, even more preferably 3,000 or lower, and is generally 100 or higher, preferably 200 or higher, more preferably 300 or higher, even more preferably 400 or higher. When the molecular weight of the luminescent material is too low, there are cases where this luminescent material has considerably reduced heat resistance or is causative of gas generation or use of this luminescent material in film formation results in reduced film quality. There also are cases where the organic electroluminescent element suffers a morphological change due to migration, etc. On the other hand, in case where the molecular weight of the luminescent material is too high, there is a tendency that the organic compound is difficult to purify or dissolution of the compound in a solvent necessitates a prolonged time period.

Any one of the luminescent materials described above may be used alone, or two or more thereof may be used in any desired combination and proportion.

The proportion of the luminescent material in the luminescent layer is not limited unless the effects of the invention are considerably lessened. However, the proportion thereof is preferably 0.05% by weight or more and is preferably 35% by weight or less. When the amount of the luminescent material is too small, there is a possibility that unevenness of luminescence might result. When the amount thereof is too large, there is a possibility that a decrease in current efficiency might result. In the case where two or more luminescent materials are used in combination, these materials are incorporated so that the total content thereof is within that range.

Examples of the low-molecular hole transport material include the various compounds shown above as examples of the hole transport material of the hole transport layer described above, and further include aromatic diamines which contain two or more tertiary amines and in which the nitrogen atoms have two or more fused aromatic rings bonded thereto as substituents, the aromatic diamines being represented by 4,4'-bis[N-(1-naphthyl)-N-phenylamino]biphenyl (JP-A-5-234681), aromatic amine compounds having a starburst structure, such as 4,4',4''-tris(1-naphthylphenylamino) triphenylamine (*Journal of Luminescence*, Vol. 72-74, p. 985, 1997), the aromatic amine compound constituted of the tetramer of triphenylamine (*Chemical Communications*, p. 2175, 1996), spiro compounds such as 2,2',7,7'-tetrakis (diphenylamino)-9,9'-spirobifluorene (*Synthetic Metals*, Vol. 91, p. 209, 1997).

Examples of the low-molecular electron transport material include 2,5-bis(1-naphthyl)-1,3,4-oxadiazole (BND), 2,5-bis (6'-(2',2''-bipyridyl))-1,1-dimethyl-3,4-diphenylsilole (Py-PySPyPy), bathophenanthroline (BPhen), 2,9-dimethyl-4,7-diphenyl-1,10-phenanthroline (BCP, bathocuproine), 2-(4-biphenylyl)-5-(p-tert-butylphenyl)-1,3,4-oxadiazole (tBu-PBD), 4,4'-bis(9-carbazole)biphenyl (CBP), and 9,10-di(2-naphthyl)anthracene (ADN).

It is preferred that these hole transport materials and electron transport materials should be used as a host material in the luminescent layer. Examples of host materials include the host materials given in JP-A-2007-067383, JP-A-2007-88433, and JP-A-2007-110093, and preferred examples thereof also are the same.

Examples of methods for forming the luminescent layer include a wet film formation method and vacuum deposition. However, a wet film formation method is preferred from the standpoints that a homogeneous thin film having no defects is easily obtained, that the film can be formed in a short time period, and that the effect of crosslinking of the hole-transporting layer, which is due to the organic compound of the invention, can be produced. In the case where a luminescent layer is to be formed by a wet film formation method, the materials described above are dissolved in a suitable solvent to prepare a coating solution, and this coating solution is applied to the formed hole transport layer described above. The resultant coating film is dried to remove the solvent, thereby forming the luminescent layer. Techniques for the formation thereof are the same as the techniques for forming the hole transport layer.

The thickness of the luminescent layer is generally 3 nm or more, preferably 5 nm or more, and is generally 300 nm or less, preferably 100 nm or less.

[6] Hole Blocking Layer

A hole blocking layer 6 may be disposed between the luminescent layer 5 and the electron injection layer 8 which will be described later. The hole blocking layer 6 is a layer superposed on the luminescent layer 5 so as to be in contact with that interface of the luminescent layer 5 which faces the cathode 9.

This hole blocking layer 6 has the function of blocking holes sent from the anode 2 and preventing the holes from reaching the cathode 9, and further has the function of efficiently transporting, toward the luminescent layer 5, electrons injected from the cathode 9.

Examples of properties which are required of the material constituting the hole blocking layer 6 include a high electron mobility and a low hole mobility, a large energy gap (difference between HOMO and LUMO), and a high excited-triplet level (T1). Examples of materials for the hole blocking layer which satisfy such requirements include metal complexes such as mixed-ligand complexes, e.g., bis(2-methyl-8-quinolinolato)(phenolato)aluminum and bis(2-methyl-8-quinolinolato)(triphenylsilanolato)aluminum, and dinuclear metal complexes such as bis(2-methyl-8-quinolato)aluminum-μ-oxobis(2-methyl-8-quinolato)aluminum, styryl compounds such as distyrylbiphenyl derivatives (JP-A-11-242996), triazole derivatives such as 3-(4-biphenylyl)-4-phenyl-5-(4-tert-butylphenyl)-1,2,4-triazole (JP-A-7-41759), and phenanthroline derivatives such as bathocuproine (JP-A-10-79297). Furthermore, the compound having at least one pyridine ring substituted in the 2, 4, and 6 positions which is described in International Publication No. 2005-022962, pamphlet is also preferred as a material for the hole blocking layer 6.

One material only may be used for forming the hole blocking layer 6, or two or more materials may be used for forming the layer 6 in any desired combination and proportion.

Methods for forming the hole blocking layer 6 are not limited. Consequently, the hole blocking layer 6 can be formed by a wet film formation method, vapor deposition, or another method.

The thickness of the hole blocking layer 6 is not limited unless the effects of the invention are considerably lessened. However, the thickness thereof is generally 0.3 nm or more, preferably 0.5 nm or more, and is generally 100 nm or less, preferably 50 nm or less.

[7] Electron Transport Layer

An electron transport layer is disposed between the luminescent layer and the electron injection layer for the purpose of further improving the current efficiency of the element.

The electron transport layer is constituted of one or more compounds which, between the electrodes placed in an electric field, can efficiently transport, toward the luminescent layer, electrons injected from the cathode. As electron-transporting compounds for the electron transport layer, it is necessary to use compounds which attain a high efficiency of electron injection from the cathode or electron injection layer and which have a high electron mobility and can efficiently transport injected electrons.

Examples of compounds satisfying such requirements include metal complexes such as the aluminum complex of 8-hydroxyquinoline (JP-A-59-194393), metal complexes of 10-hydroxybenzo[h]quinoline, oxadiazole derivatives, distyrylbiphenyl derivatives, silole derivatives, 3- or 5-hydroxyflavone metal complexes, benzoxazole metal complexes, benzthiazole metal complexes, trisbenzimidazolylbenzene (U.S. Pat. No. 5,645,948), quinoxaline compounds (JP-A-6-207169), phenanthroline derivatives (JP-A-5-331459), 2-t-butyl-9,10-N,N'-dicyanoanthraquinonediimine, n-type amorphous silicon hydride carbide, n-type zinc sulfide, and n-type zinc selenide.

With respect to the thickness of the electron transport layer, the lower limit thereof is generally about 1 nm, preferably about 5 nm, and the upper limit thereof is generally about 300 nm, preferably about 100 nm.

The electron transport layer is formed by layer superposition on the hole blocking layer by a wet film formation method or vacuum deposition in the same manner as described above. Usually, vacuum deposition is used.

[8] Electron Injection Layer

The electron injection layer has the function of efficiency injecting, into the electron transport layer or the luminescent layer, electrons injected from the cathode.

From the standpoint of efficiently injecting electrons, it is preferred that the material constituting the electron injection layer should be a metal having a low work function. For example, an alkali metal such as sodium or cesium, an alkaline earth metal such as barium or calcium, or the like is used. The thickness thereof is generally 0.1 nm or more and is preferably 5 nm or less.

Furthermore, doping of an organic electron transport material represented by a nitrogen-containing heterocyclic compound, e.g., bathophenanthroline, which will be described later, or a metal complex, e.g., the aluminum complex of 8-hydroxyquinoline, with an alkali metal such as sodium, potassium, cesium, lithium, or rubidium (described in JP-A-10-270171, JP-A-2002-100478, JP-A-2002-100482, etc.) is preferred because this doping improves suitability for electron injection and transport and enables the layer to combine the improved suitability and excellent film quality. The thickness of the film in this case is generally 5 nm or more, preferably 10 nm or more, and is generally 200 nm or less, preferably 100 nm or less.

The electron injection layer is formed by layer superposition on the luminescent layer or the hole blocking layer, which overlies the luminescent layer, by a wet film formation method or vacuum deposition.

In the case of a wet film formation method, details thereof are the same as in the case of the hole injection layer and the luminescent layer.

On the other hand, in the case of vacuum deposition, the procedure may include placing a deposition source in a crucible or metal boat disposed in a vacuum vessel, evacuating the inside of the vacuum vessel with an appropriate vacuum pump to about $10^{-4}$ Pa, and then heating the crucible or metal boat to vaporize the deposition source and form an electron injection layer on the luminescent layer, hole blocking layer, or electron transport layer formed over the substrate placed so as to face the crucible or metal boat.

Deposition of an alkali metal as an electron injection layer may be conducted using an alkali metal dispenser constituted of nichrome filled with an alkali metal chromate and with a reducing agent. By heating this dispenser in a vacuum vessel, the alkali metal chromate is reduced and the alkali metal is vaporized. In the case where an organic electron transport material and an alkali metal are to be co-deposited, use may be made of a method including placing the organic electron transport material in a crucible disposed in a vacuum vessel, evacuating the inside of the vacuum vessel with an appropriate vacuum pump to about $10^{-4}$ Pa, and then simultaneously heating the crucible and the dispenser to vaporize the materials and form an electron injection layer over the substrate placed so as to face the crucible and the dispenser.

In this method, the alkali metal and the organic electron transport material are evenly co-deposited in the film thickness direction of the electron injection layer. However, the electron injection layer may have a concentration distribution along the film thickness direction.

[9] Cathode

The cathode has the function of injecting electrons into a layer located on the luminescent-layer side (e.g., the electron injection layer or the luminescent layer). As the material of the cathode, the materials usable for the anode can be used. However, metals having a low work function are preferred from the standpoint of efficiently injecting electrons. Suitable metals such as tin, magnesium, indium, calcium, aluminum, and silver and alloys of these are used. Specific examples thereof include electrodes of alloys having a low work function, such as magnesium-silver alloys, magnesium-indium alloys, and aluminum-lithium alloys.

The thickness of the cathode is generally the same as that of the anode.

For the purpose of protecting the cathode made of a metal having a low work function, a layer of a metal which has a high work function and is stable to the air may be formed on the cathode. This layer formation is preferred because the stability of the element is enhanced thereby. For this purpose, a metal such as, for example, aluminum, silver, copper, nickel, chromium, gold, or platinum is used.

[10] Others

Although an organic electroluminescent element having the layer configuration shown in FIG. 1 was explained above as an example, the organic electroluminescent element of the invention may have other configurations unless the configurations depart from the spirit of the invention. For example, the element may have any desired layer other than the layers explained above, between the anode and the cathode. Furthermore, any desired layer may have been omitted.

In the invention, when the charge-transporting polymer of the invention is used for the hole transport layer, then all of the hole injection layer, hole transport layer, and luminescent layer can be superposed and formed by a wet film formation method. As a result, a display having a large area can be produced.

Incidentally, the structure shown in FIG. 1 can be reversed. Namely, it is possible to superpose a cathode, an electron injection layer, a luminescent layer, a hole injection layer, and an anode in this order on a substrate. It is also possible as stated above to dispose an organic electroluminescent element of the invention between two substrates, at least one of which has high transparency.

Furthermore, a structure composed of a stack of stages each having the layer configuration shown in FIG. 1 (i.e., a structure composed of a plurality of stacked luminescent units) is also possible. In this case, when $V_2O_5$ or the like is used as a charge generation layer (CGL) in place of the interfacial layers located between the stages (i.e., between the luminescent units) (when the anode is ITO and the cathode is aluminum, the interfacial layers are these two layers), then the barrier between the stages is reduced. This configuration is more preferred from the standpoints of current efficiency and operating voltage.

The invention can be applied to each of: a single organic electroluminescent element; organic electroluminescent elements having a structure in which the elements have been disposed in an array arrangement; and a structure in which anodes and cathodes have been disposed in an X-Y matrix arrangement.

<Organic EL Display and Organic EL Lighting>

The organic EL display and organic EL lighting of the invention employ the organic electroluminescent element of the invention described above. The types and structures of the organic EL display and organic EL lighting of the invention are not particularly limited, and the display and the illuminator can be fabricated using the organic electroluminescent element of the invention according to ordinary methods.

For example, the organic EL display and organic EL lighting of the invention can be formed by the methods described in Yūki EL Dispurei (Ohmsha, Ltd., published on Aug. 20, 2004, written by TOKITO Shizuo, ADACHI Chihaya, and MURATA Hideyuki).

EXAMPLES

The invention will be explained below in more detail by reference to Examples, but the invention should not be construed as being limited to the following Examples unless the invention departs from the spirit thereof.

Synthesis of Monomers

Synthesis Example 1

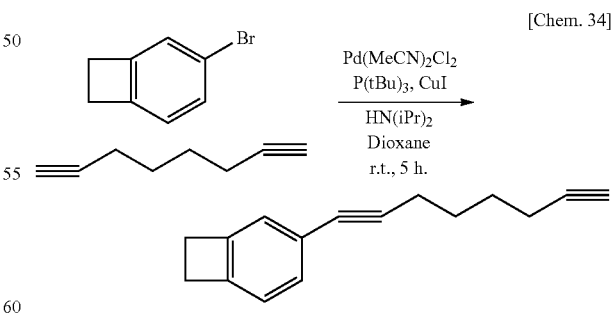

[Chem. 34]

Target Substance 1

Dichlorobis(acetonitrile)palladium(II) (212 mg; 0.03 equivalents) and copper iodide (104 mg; 0.02 equivalents) were introduced into a 200-mL four-necked flask through which nitrogen was kept passing. Dioxane (75 mL) which had been degassed beforehand by nitrogen bubbling was introduced thereinto, and the mixture was stirred. Tri-t-butylphosphine (331 mg; 0.06 equivalents) was added to the resultant liquid, and this mixture was stirred at room temperature for 15 minutes. To the resultant solution were added diisopropylamine (3.31 g; 1.2 equivalents), 4-bromobenzocyclobutene (5.00 g; 1.0 equivalent), and 1,7-octadiyne (20.3 g; 7.0 equivalents). The resultant mixture was reacted at room temperature for 9 hours. The reaction mixture obtained was heated at a bath temperature of 60° C. under a reduced pressure of 400 Pa to distill off low-boiling substances therefrom. Thereafter, saturated aqueous sodium chloride solution (50 mL) and 1-N hydrochloric acid (5 mL) were added to the residue, and the resultant mixture was extracted with ethyl acetate (30 mL×3 times). The ethyl acetate layer obtained was washed with saturated aqueous sodium chloride solution (30 mL×2 times). This ethyl acetate layer was concentrated. As a result, a crude product (7.7 g) was obtained. This crude product was purified by silica gel column chromatography (solvent: n-hexane/ethyl acetate), thereby obtaining target substance 1 (2.78 g) as a colorless oily substance (yield, 48.9%; purity determined by gas chromatography, 95.4%).

Synthesis Example 2

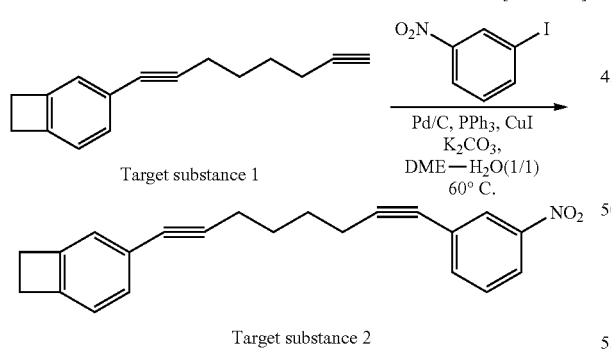

Target substance 1

Target substance 2 m-Iodonitrobenzene (3.64 g; 1.1 equivalent), potassium carbonate (5.06 g; 2.75 equivalents), copper iodide (111 mg; 0.044 equivalents), triphenylphosphine (307 mg; 0.088 equivalents), and 5% Pd/C (623 mg; 0.022 equivalents in terms of palladium amount) were introduced into a 100-mL four-necked flask through which nitrogen was kept passing. A dimethoxyethane/water=1/1 mixed solvent (95 mL) which had been degassed beforehand by nitrogen bubbling was introduced thereinto, and the mixture was stirred at room temperature for 1 hour. To this liquid was added a solution prepared by dissolving the target substance 1 (2.77 g; 1.0 equivalent) in dimethoxyethane (2 mL). The resultant mixture was reacted for 7 hours with heating on a 70° C. bath (internal temperature, 63° C.). The reaction mixture obtained was filtered through a Celite and then concentrated with an evaporator. To the concentrate was added 25 mL of 1-N hydrochloric acid. This mixture was extracted with ethyl acetate (30 mL×3 times), and the ethyl acetate layer obtained was washed with saturated aqueous sodium chloride solution (20 mL×3 times). The ethyl acetate layer was concentrated, and the resultant crude product was recrystallized from an ethyl acetate/n-hexane mixed solvent, thereby obtaining target substance 2 (2.50 g) as slightly yellowish acicular crystals (yield, 57.1%; purity determined by liquid chromatography, 99.5%).

Synthesis Example 3

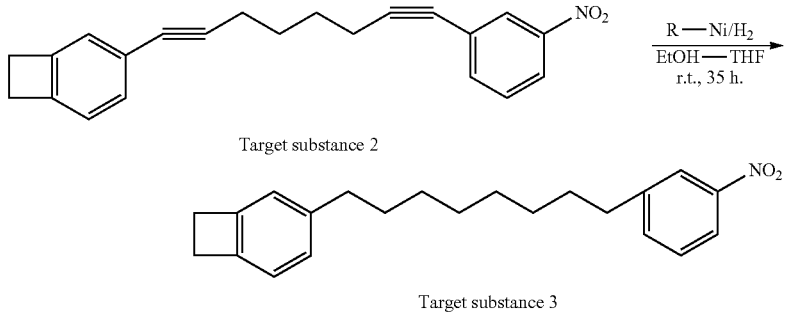

Target substance 2

Target substance 3

The target substance 2 (2.31 g), 15 mL of tetrahydrofuran, and 15 mL of ethanol were introduced into a 100-mL eggplant type flask, and the solid was dissolved. To this solution was added 1.07 g of Raney nickel (R-200, manufactured by Nikko Rica Corp.) as a hydrogenation catalyst. After the atmosphere in the flask was replaced with hydrogen three times, the mixture was reacted at room temperature for 35 hours in a hydrogen atmosphere. The liquid reaction mixture was filtered through a Celite and concentrated with an evaporator to obtain 2.8 g of a crude product. This crude product was purified by silica gel column chromatography (solvent: n-hexane/ethyl acetate mixed solvent), thereby obtaining target substance 3 (1.72 g) as white acicular crystals (yield, 80.1%; purity determined by liquid chromatography, 99.1%).

Synthesis Example 4

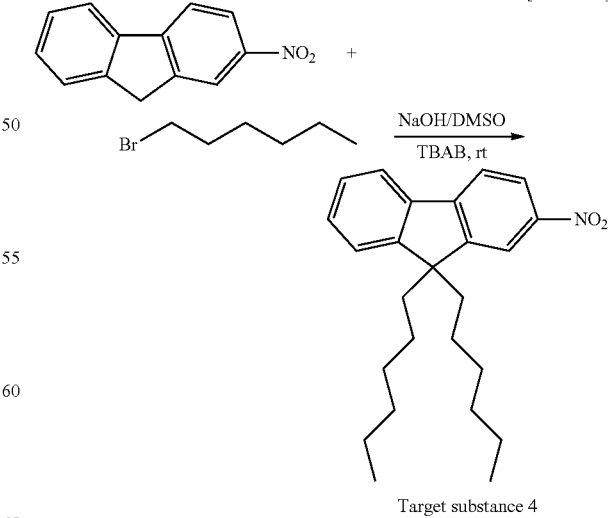

Target substance 4

Thirty-five milliliters of an aqueous sodium hydroxide solution (17 M) was gradually dropped into 2-nitrofluorene (25.0 g), 1-bromohexane (58.61 g), tetrabutylammonium bromide (TBAB) (7.63 g), and dimethyl sulfoxide (DMSO) (220 mL), and the mixture was reacted at room temperature for 3 hours. Thereto were added ethyl acetate (200 mL) and water (100 mL). This mixture was stirred and thereafter subjected to liquid separation. The aqueous layer was extracted with ethyl acetate (100 mL×2 times), and the extract was added to the organic layer. This organic layer was dried with magnesium sulfate and then concentrated. Furthermore, the concentrate was purified by silica gel column chromatography (n-hexane/ethyl acetate mixed liquid), thereby obtaining target substance 4 (44.0 g).

Synthesis Example 5

[Chem. 38]

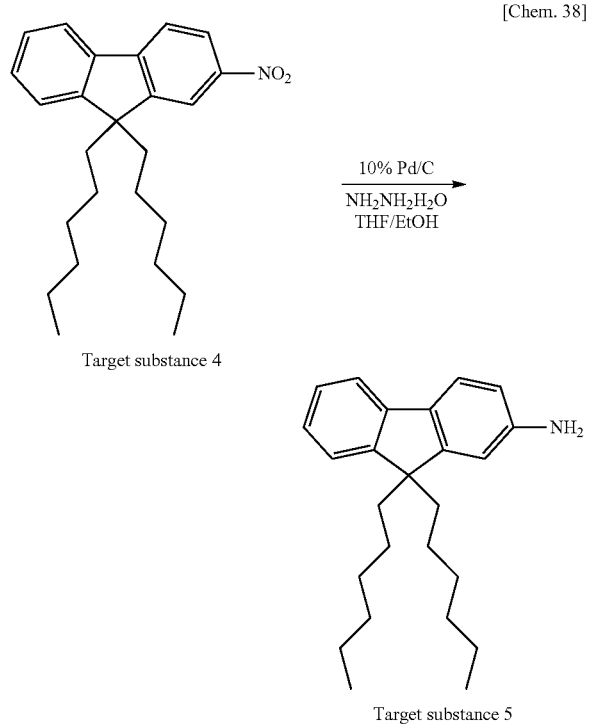

To the target substance 4 (44.0 g), tetrahydrofuran (THF) (120 mL), and ethanol (120 mL) was added 10% Pd/C (8.6 g). This mixture was heated to 50° C. Thereafter, hydrazine monohydrate (58.0 g) was gradually dropped thereinto, and this mixture was reacted at 50° C. for 3 hours. The resultant liquid reaction mixture was allowed to cool and then filtered through a Celite. The filtrate was concentrated, and the crystals precipitated were subjected to washing with methanol, vacuum filtration, and drying, thereby obtaining target substance 5 (34.9 g).

Synthesis Example 6

[Chem. 39]

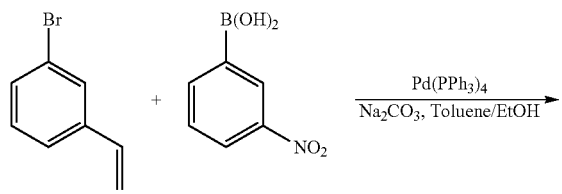

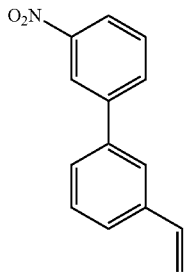

Target substance 6

3-Bromostyrene (5.0 g), 3-nitrophenylboronic acid (5.5 g), toluene/ethanol (80 mL/40 mL), and 20 mL of an aqueous sodium carbonate solution (2 M) were stirred from 30 minutes in a nitrogen stream with heating at 60° C. Tetrakis (triphenylphosphine)palladium(0) was added thereto, and this mixture was refluxed for 6 hours. After the resultant liquid reaction mixture was allowed to cool to room temperature, methylene chloride (100 mL) and water (100 mL) were added thereto. This mixture was stirred and then subjected to liquid separation. The aqueous layer was extracted with methylene chloride (100 mL×2 times), and the extract was added to the organic layer. This organic layer was dried with magnesium sulfate and then concentrated. Furthermore, the concentrate was purified by silica gel column chromatography (n-hexane/methylene chloride mixed liquid), thereby obtaining target substance 6 (5.5 g).

Synthesis Example 7

[Chem. 40]

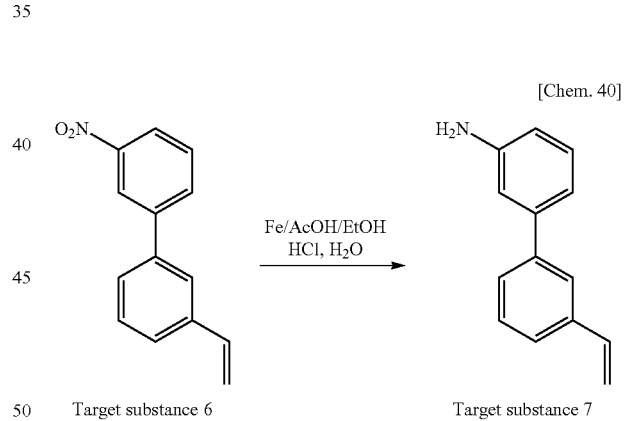

The target substance 6 (2.5 g), acetic acid (60 mL), ethanol (60 mL), hydrochloric acid (1 N; 2 mL), water (8 mL), and reduced iron (12.4 g) were refluxed for 1 hour in a nitrogen stream. The liquid reaction mixture was filtered at room temperature, and ethyl acetate (100 mL) and water (100 mL) were added thereto. This mixture was stirred, subsequently neutralized with saturated aqueous sodium hydrogen carbonate solution, and then subjected to liquid separation. The aqueous layer was extracted with ethyl acetate (100 mL×2 times), and the extract was added to the organic layer. This organic layer was dried with magnesium sulfate and then concentrated. Furthermore, the concentrate was purified by silica gel column chromatography (n-hexane/ethyl acetate mixed liquid), thereby obtaining target substance 7 (2.1 g).

Synthesis Example 8

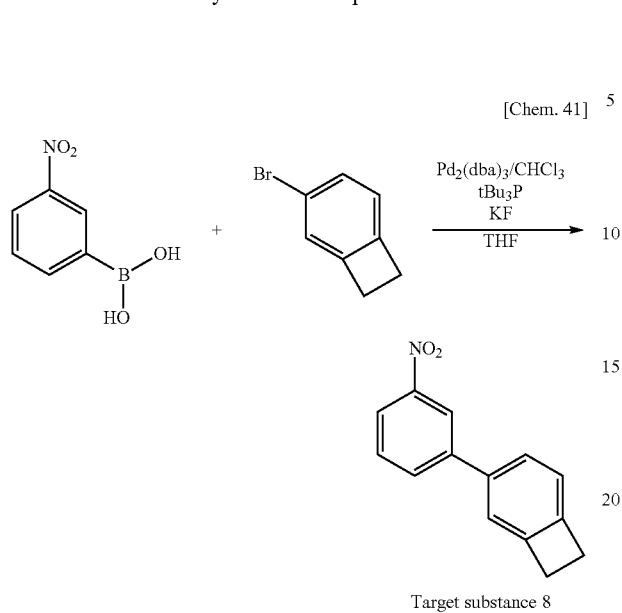

Target substance 8

Into a reaction vessel was introduced potassium fluoride (23.01 g). Under reduced pressure, drying by heating and replacement with nitrogen were repeated to form a nitrogen atmosphere within the system. 3-Nitrophenylboronic acid (6.68 g), 4-bromobenzocyclobutene (7.32 g), and dehydrated tetrahydrofuran (50 mL) were introduced into the reaction vessel and stirred. Thereto was added a tris(dibenzylideneacetone)dipalladium chloroform complex (0.21 g). The atmosphere in the system was further sufficiently replaced with nitrogen, and tri-t-butylphosphine (0.47 g) was added to the mixture at room temperature. After completion of the addition, the resultant mixture was stirred under the same conditions for 1 hour. After completion of the reaction, water was added to the liquid reaction mixture, and the resultant mixture was extracted with ethyl acetate. The organic layer obtained was washed with water twice, and sodium sulfate was added thereto to dehydrate and dry the organic layer. This organic layer was concentrated. The resultant crude product was purified by silica gel column chromatography (hexane/ethyl acetate), thereby obtaining target substance 8 (8.21 g).

Synthesis Example 9

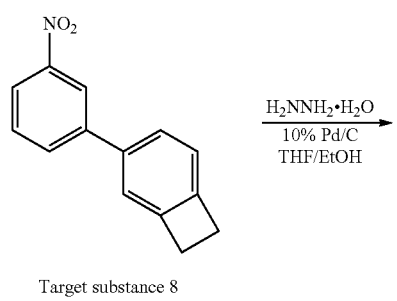

Target substance 8

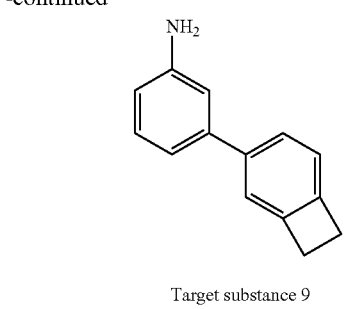

Target substance 9

The target substance 8 (8.11 g), 36 mL of tetrahydrofuran, 36 mL of ethanol, and 10% Pd/C (1.15 g) were introduced, and the mixture was stirred with heating at 70° C. Hydrazine monohydrate (10.81 g) was gradually dropped thereinto. The resultant mixture was reacted for 2 hours and then allowed to cool. The liquid reaction mixture was filtered through a Celite, and the filtrate was concentrated. To this filtrate was added ethyl acetate. The resultant mixture was washed with water, and the organic layer was concentrated. The crude product obtained was purified by column chromatography (hexane/ethyl acetate), thereby obtaining target substance 9 (4.90 g).

Synthesis Example 10

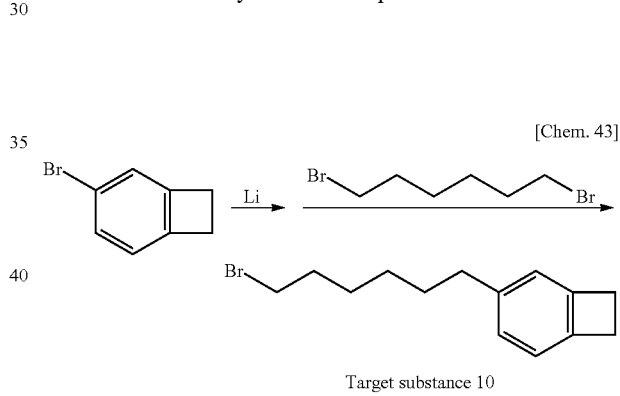

Target substance 10

Into a 300-mL four-necked flask filled with a nitrogen atmosphere were introduced 9.15 g of 4-bromobenzocyclobutene and 100 mL of dry ether. The reaction vessel was cooled to −70° C. in a dry-ice/acetone bath. Fifty milliliters of n-butyllithium (1.06 M) was added dropwise thereto over 30 minutes. After completion of the dropwise addition, the mixture was continuously stirred for 2 hours while being kept at −70° C. 1,6-Dibromohexane (24.4 g) was added dropwise thereto. After completion of the dropwise addition, the reaction mixture was stirred for 30 minutes under the cooling conditions. Thereafter, the cooling bath was removed, and the reaction mixture was allowed to warm up gradually to room temperature and allowed to stand overnight. This reaction mixture was washed with 100 mL of water, and the organic layer was concentrated. The oily matter obtained was purified by silica gel chromatography (hexane). Furthermore, the purified oily matter was subjected to vacuum distillation in order to remove low-boiling components, thereby obtaining target substance 10 (4.94 g).

Synthesis Example 11

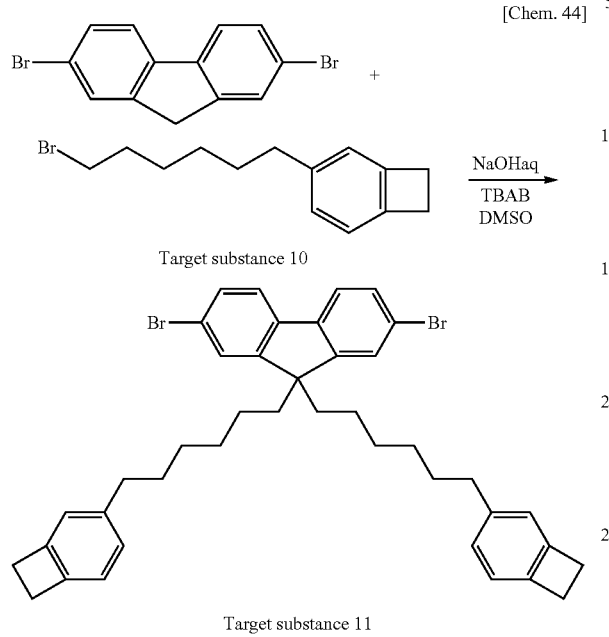

Target substance 10

Target substance 11

The target substance 10 (2.89 g), 2,7-dibromofluorene (1.17 g), and dimethyl sulfoxide (30 mL) were introduced into a 100-mL four-necked flask, and the mixture was stirred and heated to 60° C. To the resultant solution was added dropwise a solution prepared by dissolving pulverized sodium hydroxide (0.72 g) in 5 mL of water. The resultant mixture was reacted for 3 hours. Fifty milliliters of hexane was added to the liquid reaction mixture, and the resultant mixture was washed with 30 mL of water. The oily layer was concentrated and subjected to column purification. The oily matter obtained was purified by silica gel chromatography (hexane/ethyl acetate), thereby obtaining target substance 11 (1.47 g).

$^1$H NMR (CDCl$_3$, 400 MHz)

δ (ppm) 7.52-7.42 (m, 6H), 6.91 (s, 4H), 6.80 (s, 2H), 3.11 (s, 8H), 2.44 (m, 4H), 1.90 (m, 4H), 1.40 (m, 4H), 1.28 (m, 4H), 1.08 (m, 4H), 0.88 (m, 4H)

Synthesis Example 12

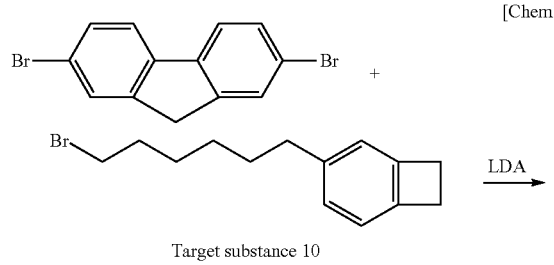

Target substance 10

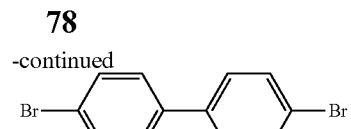

Target substance 12

In a nitrogen atmosphere, 2,7-dibromofluorene (6.93 g) was dissolved in tetrahydrofuran (100 mL), and the solution was cooled to −72° C. A hexane solution of lithium diisopropylamide (1.09 M; 19.6 mL) was added dropwise thereto. After the resultant mixture was stirred at −72° C. for 2 hours, a tetrahydrofuran solution (10 mL) of the target substance 10 (6.00 g) was added dropwise thereto. This mixture was stirred at −72° C. for 2.5 hours and then warmed to room temperature. Water (50 mL) and methylene chloride (150 mL) were added to the liquid reaction mixture, and the organic layer was concentrated. The oily matter obtained was purified by silica gel chromatography (hexane/methylene chloride), thereby obtaining target substance 12 (2.80 g).

Synthesis Example 13

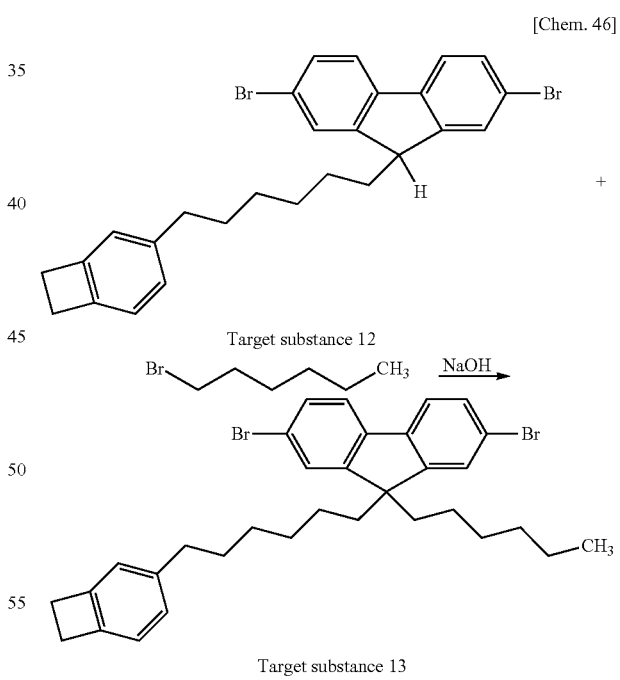

Target substance 12

Target substance 13

The target substance 12 (2.70 g), 1-bromohexane (1.31 g), tetra-n-butylammonium bromide (0.34 g), and dimethyl sulfoxide (30 mL) were introduced into a reaction vessel, and the mixture was heated at 60° C. and then returned to room temperature. An aqueous solution (1.2 mL) of sodium hydroxide (0.64 g) was added dropwise thereto. After this liquid reaction mixture was stirred for 1.5 hours, water (60 mL) and ethyl acetate (100 mL) were added thereto. The organic layer was concentrated, and the oily matter obtained was purified by silica gel chromatography (hexane/methylene chloride), thereby obtaining target substance 13 (1.80 g).

Synthesis Example 14

[Chem. 47]

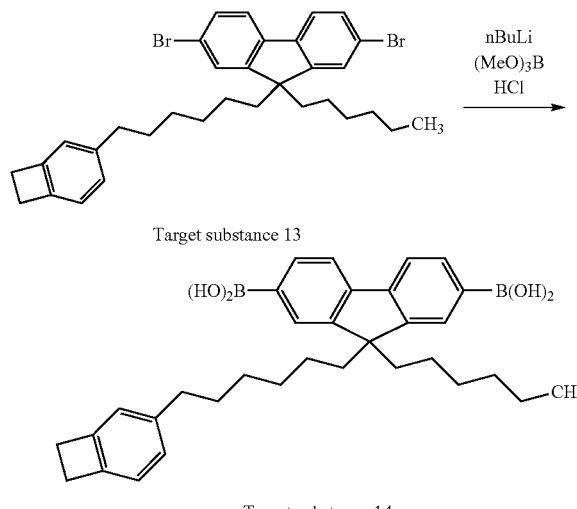

Target substance 13

Target substance 14

In a nitrogen atmosphere, the target substance 13 (5.0 g) was dissolved in tetrahydrofuran (100 mL), and the solution was cooled to −75° C. A hexane solution of n-butyllithium (1.66 M; 10.9 mL) was added dropwise thereto. After the resultant mixture was stirred at −70° C. for 2.5 hours, trimethyl borate (5.35 g) was added dropwise thereto. This mixture was stirred at −70° C. for 4 hours and then warmed to room temperature. Thereafter, 1-N hydrochloric acid (50 mL) was added to the liquid reaction mixture, and the resultant mixture was stirred for 2 hours. Ethyl acetate (150 mL) was added thereto, and the organic layer was concentrated. The solid obtained was suspended in and washed with hexane, thereby obtaining target substance 14 (3.90 g).

Synthesis Example 15

[Chem. 48]

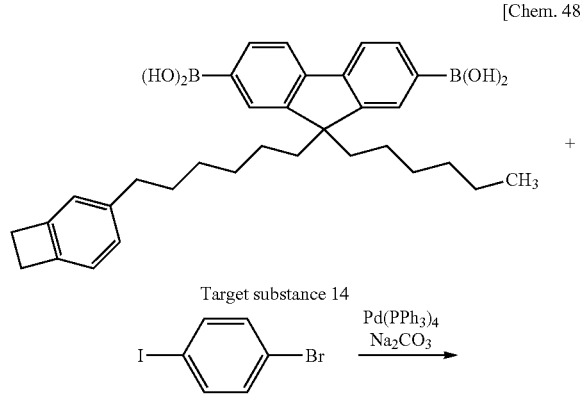

Target substance 14

Target substance 15

The target substance 14 (3.64 g), 4-bromoiodobenzene (3.97 g), toluene (60 mL), ethanol (30 mL), and 2-M aqueous sodium carbonate solution (30 mL) were introduced into a reaction vessel in a nitrogen atmosphere, and the mixture was heated to 50° C. Thereafter, tetrakis(triphenylphosphine)palladium (0.40 g) was added thereto. The resultant mixture was heated to 80° C. and stirred for 8 hours. Water (100 mL) and toluene (100 mL) were added to the liquid reaction mixture, and the organic layer was concentrated. The oily matter obtained was purified by silica gel chromatography (hexane/toluene), thereby obtaining target substance 15 (2.81 g).

Synthesis Example 16

[Chem. 49]

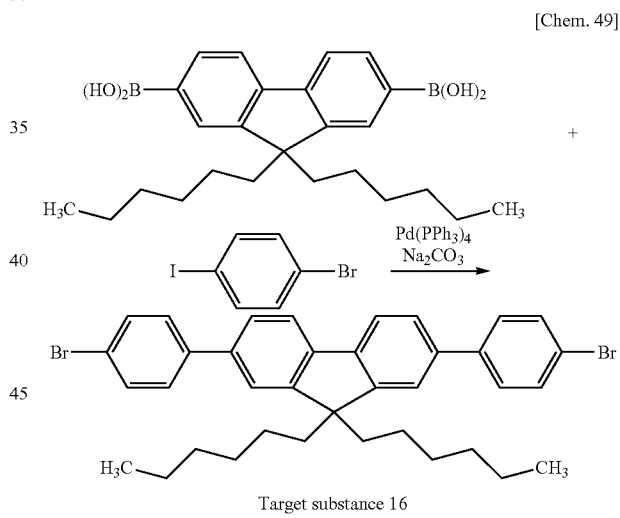

Target substance 16

Into a reaction vessel were introduced, in a nitrogen atmosphere, 9,9-dihexylfluorene-2,7-diboronic acid (3.00 g), 4-bromoiodobenzene (4.42 g; 15.6 mmol), toluene (45 mL), and ethanol (45 mL), followed by tetrakis(triphenylphosphine)palladium (0.54 g; 0.5 mmol) and by an aqueous solution (22 mL) of sodium carbonate (4.52 g; 43 mmol). The resultant mixture was reacted for 6 hours in the nitrogen atmosphere. After completion of the reaction, water was added to the liquid reaction mixture, and the resultant mixture was extracted with toluene. The organic layer obtained was washed with water twice, and sodium sulfate was added thereto to dehydrate and dry the organic layer. The resultant crude product was washed with n-hexane, purified by silica gel column chromatography (hexane/methylene chloride), and thereafter suspended in and washed with methylene chloride/methanol, thereby obtaining target substance 16 (3.15 g).

Synthesis of Polymers

Polymer Synthesis Example 1

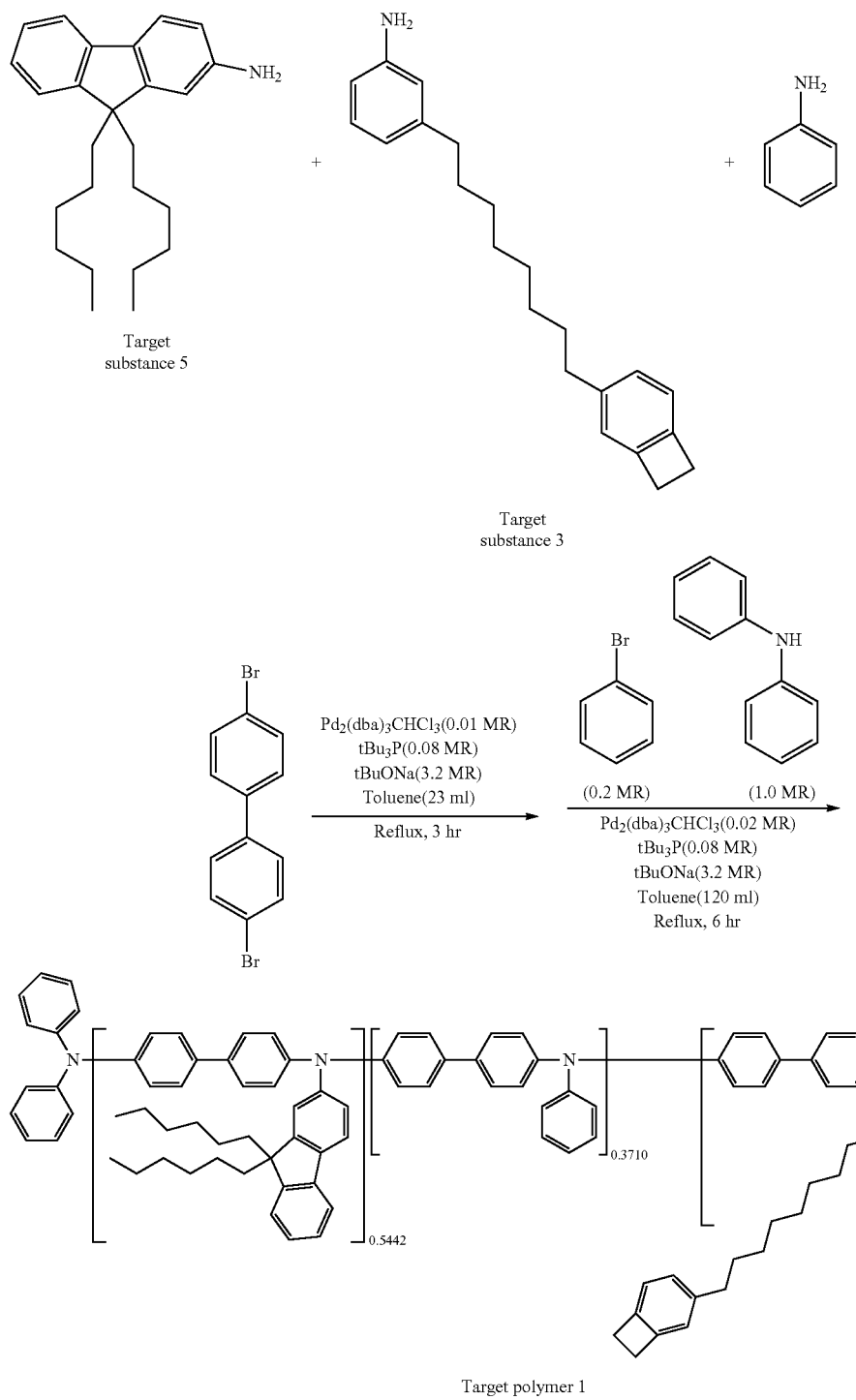

Target polymer 1

The target substance 5 (1.086 g; 3.1075 mmol), the target substance 3 (0.184 g; 0.5984 mmol), aniline (0.197 g; 2.1185 mmol), 4,4'-dibromobiphenyl (0.891 g; 2.8551 mmol), tert-butoxysodium (1.76 g; 18.27 mmol), and toluene (23 mL) were introduced, and the atmosphere in the system was sufficiently replaced with nitrogen. The contents were heated to 60° C. (solution A). Tri-t-butylphosphine (0.092 g; 0.457 mmol) was added to a solution of a tris(dibenzylideneacetone)dipalladium chloroform complex (0.059 g; 0.057 mmol) in 2 mL of toluene, and this mixture was heated to 60° C. (solution B). In a nitrogen stream, the solution B was added to the solution A, and the resultant mixture was reacted with heating and refluxing for 1.5 hours. After it was ascertained that the target substance 5, the target substance 3, the aniline, and the 4,4'-dibromobiphenyl had disappeared, 4,4'-dibromobiphenyl (0.8375 g; 2.684 mmol) was additionally added. The resultant mixture was heated and refluxed for 1 hour, and it was then able to be ascertained that polymerization had initiated. 4,4'-Dibromobiphenyl (0.015 g; 0.048 mmol) was hence additionally added three times in total at intervals of 40 minutes (total amount, 0.045 g). After addition of the whole 4,4'-dibromobiphenyl, the liquid reaction mixture was heated and refluxed for further 30 minutes, subsequently allowed to cool, and then dropped into 300 mL of ethanol to crystallize out crude polymer 1.

The crude polymer 1 obtained was dissolved in 120 mL of toluene. Bromobenzene (0.34 g; 2.17 mmol) and tert-butoxysodium (1.67 g; 17.40 mmol) were introduced, and the atmosphere in the system was sufficiently replaced with nitrogen. The contents were heated to 60° C. (solution C). Tri-t-butylphosphine (0.088 g; 0.435 mmol) was added to a solution of a tris(dibenzylideneacetone)dipalladium chloroform complex (0.056 g; 0.054 mmol) in 1 mL of toluene, and this mixture was heated to 60° C. (solution D). In a nitrogen stream, the solution D was added to the solution C, and the resultant mixture was reacted with heating and refluxing for 2 hours. To this liquid reaction mixture was added a toluene (3 mL) solution of N,N-diphenylamine (1.6 g; 8.16 mmol). The mixture was reacted with heating and refluxing for further 4 hours. The resultant liquid reaction mixture was allowed to cool and dropped into an ethanol/water (250 mL/50 mL) solution to obtain an end-capped crude polymer 1.

This end-capped crude polymer 1 was dissolved in toluene and reprecipitated from acetone, and the polymer precipitated was taken out by filtration. The polymer obtained was dissolved in toluene, and this solution was washed with dilute hydrochloric acid. The polymer was reprecipitated from ammonia-containing ethanol. This polymer was taken out by filtration and purified by column chromatography to obtain target polymer 1(2.2 g).

Weight-average molecular weight (Mw)=27,320
Number-average molecular weight (Mn)=14,435
Distribution (Mw/Mn)=1.89

Polymer Synthesis Example 2

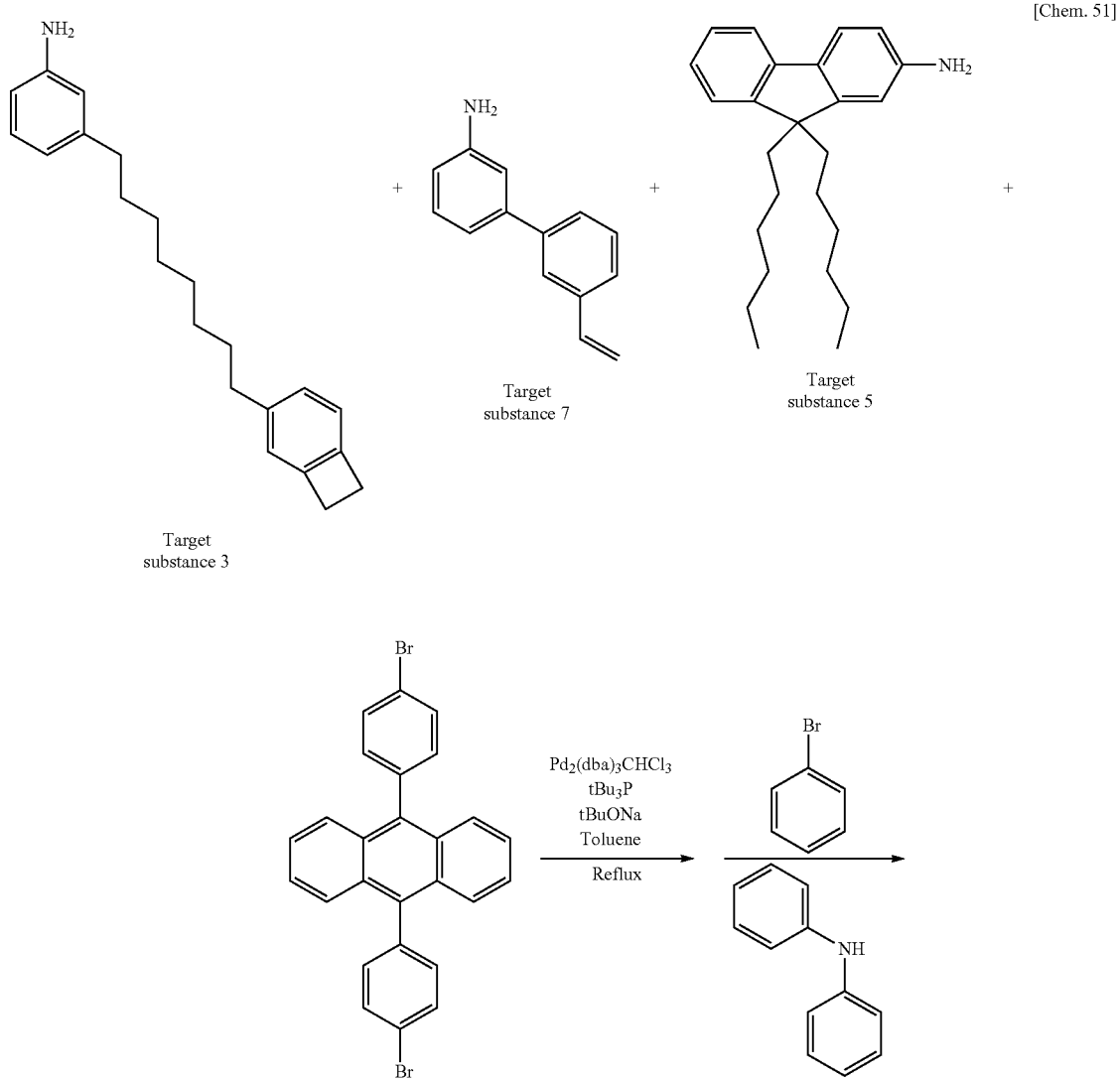

-continued

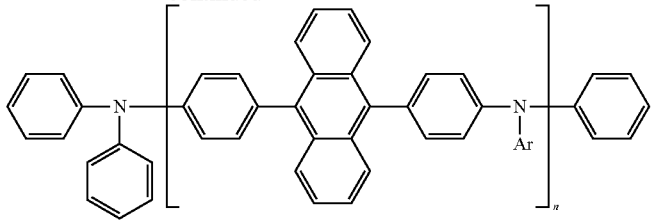

Target polymer 2

—Ar =

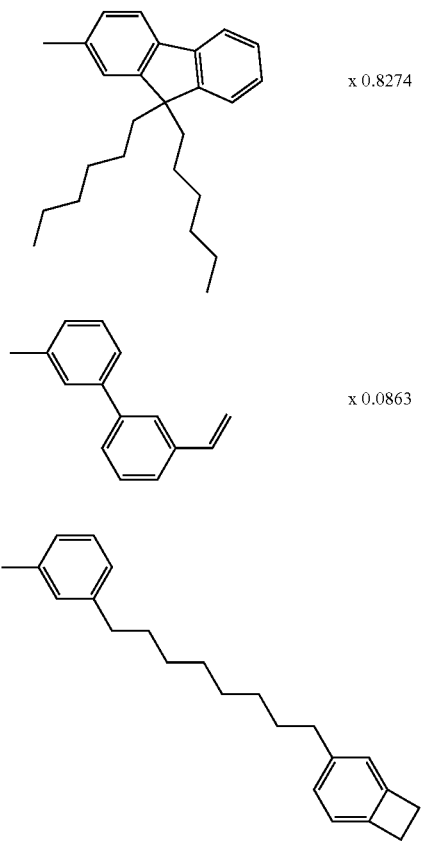

The target substance 3 (0.1087 g), the target substance 5 (1.185 g), the target substance 7 (0.069 g), 9,10-bis(4-bromophenyl)anthracene (1.000 g), tert-butoxysodium (1.26 g, and toluene (10 mL) were introduced, and the atmosphere in the system was sufficiently replaced with nitrogen. The contents were heated to 50° C. (solution E). Tri-t-butylphosphine (0.066 g) was added to a solution of a tris(dibenzylideneacetone)dipalladium chloroform complex (0.042 g) in 2 mL of toluene, and this mixture was heated to 50° C. (solution F). In a nitrogen stream, the solution F was added to the solution E, and the resultant mixture was reacted with heating at 90° C. for 1.5 hours. Subsequently, 9,10-bis(4-bromophenyl)anthracene (0.940 g) was additionally added. This liquid reaction mixture was heated and refluxed for 1 hour, subsequently allowed to cool, and then dropped into ethanol to crystallize out crude polymer 2.

The crude polymer 2 obtained was dissolved in 150 mL of toluene. Bromobenzene (0.52 g) and tert-butoxysodium (0.63 g) were introduced, and the atmosphere in the system was sufficiently replaced with nitrogen. The contents were heated to 50° C. (solution G). Tri-t-butylphosphine (0.033 g) was added to a solution of a tris(dibenzylideneacetone)dipalladium chloroform complex (0.021 g) in 2 mL of toluene, and this mixture was heated to 50° C. (solution H). In a nitrogen stream, the solution H was added to the solution G, and the resultant mixture was reacted with heating and refluxing for 3 hours. To this liquid reaction mixture was added N,N-diphenylamine (1.63 g; 9.6 mmol), followed by solution H prepared again. The mixture was reacted with heating and refluxing for further 4 hours. The resultant liquid reaction mixture was allowed to cool and dropped into ethanol to obtain an end-capped crude polymer 2.

This end-capped crude polymer 2 was dissolved in toluene and reprecipitated from acetone, and the polymer precipitated was taken out by filtration. The polymer obtained was dissolved in toluene, and this solution was washed with dilute hydrochloric acid. The polymer was reprecipitated from ammonia-containing ethanol. This polymer was taken out by filtration and purified twice by column chromatography to obtain target polymer 2 (1.63 g).

Weight-average molecular weight (Mw)=332,000
Number-average molecular weight (Mn)=36,300
Distribution (Mw/Mn)=9.17

Polymer Synthesis Example 3

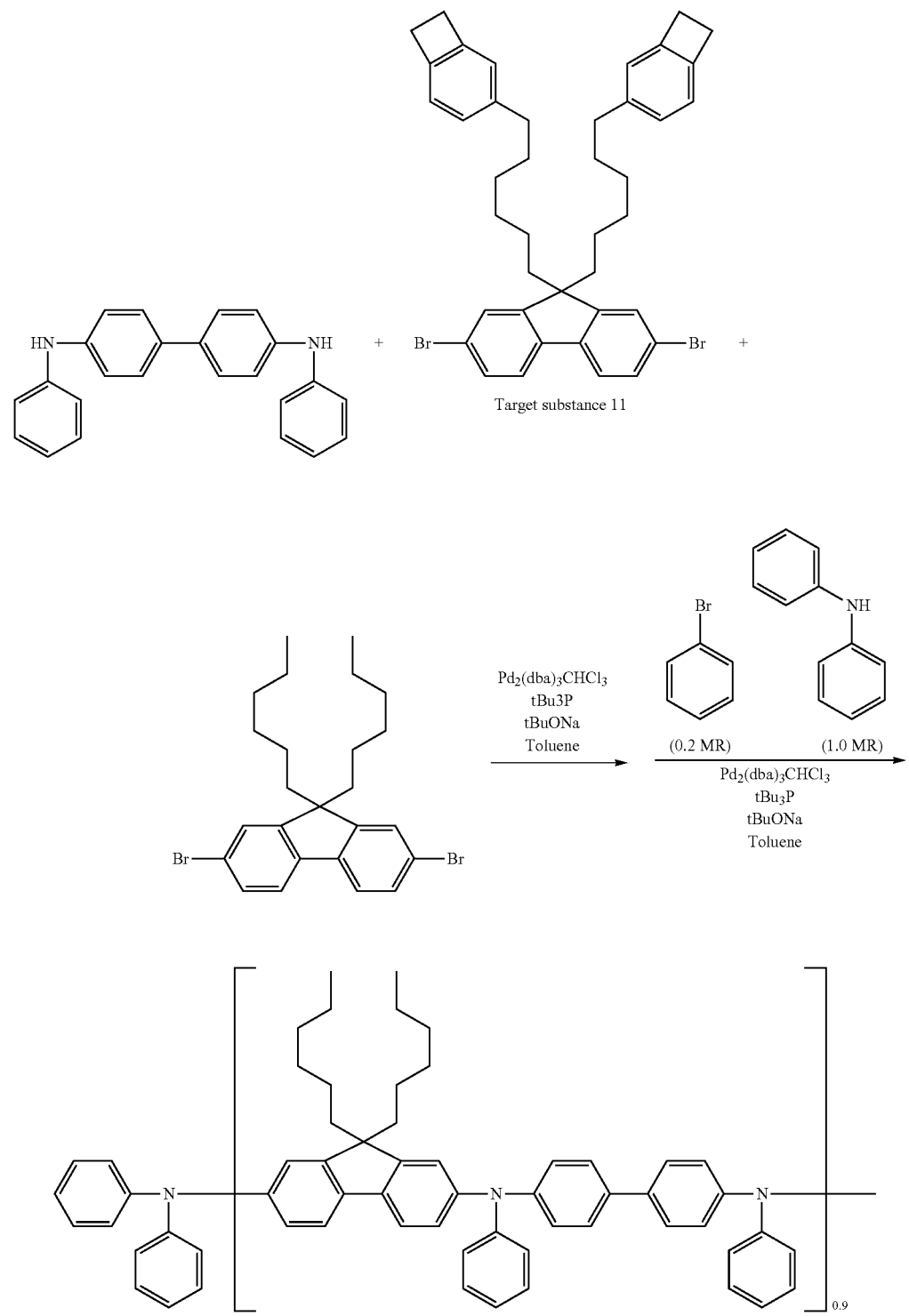

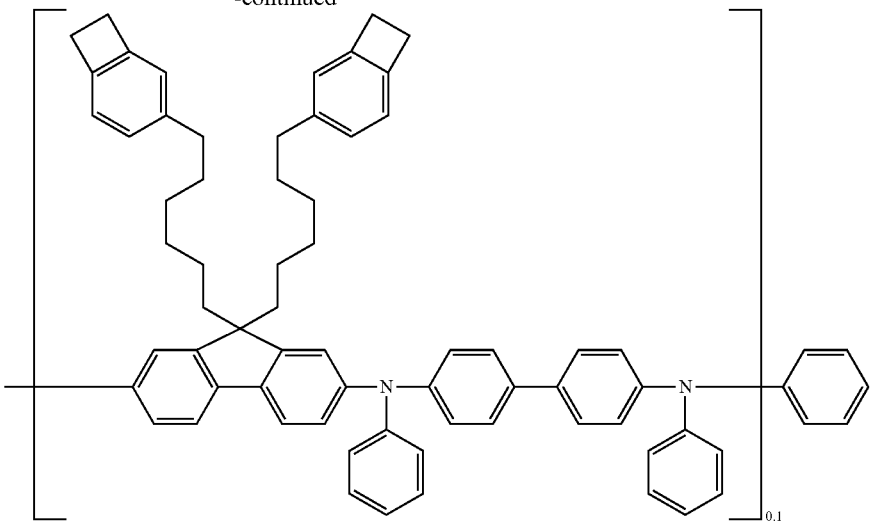

Target polymer 3

Diphenylbenzidine (2.07 g; 6.2 mmol), the target substance 11 (0.43 g; 0.6 mmol), 9,9'-dihexyl-2,7-dibromofluorene (2.63 g; 5.3 mmol), tert-butoxysodium (2.22 g; 23.0 mmol), and toluene (20 mL) were introduced, and the atmosphere in the system was sufficiently replaced with nitrogen. The contents were heated to 50° C. (solution I). Tri-t-butylphosphine (0.10 g; 0.049 mmol) was added to a solution of a tris(dibenzylideneacetone)dipalladium chloroform complex (0.07 g; 0.0068 mmol) in 15 mL of toluene, and this mixture was heated to 50° C. (solution J). In a nitrogen stream, the solution J was added to the solution I, and the resultant mixture was reacted with heating and refluxing for 1 hour. After it was ascertained that the diphenylbenzidine, the target substance 11, and the 9,9'-dihexyl-2,7-dibromofluorene had disappeared, 9,9'-dihexyl-2,7-dibromofluorene (1.91 g; 6.1 mmol) was additionally added. The resultant mixture was heated and refluxed for 1 hour, and it was then able to be ascertained that polymerization had initiated. 9,9'-Dihexyl-2,7-dibromofluorene (0.041 g; 0.13 mmol) was hence additionally added, and the mixture was reacted with heating and refluxing for further 1 hour. This liquid reaction mixture was allowed to cool and dropped into 200 mL of methanol to crystallize out crude polymer 3.

The crude polymer 3 obtained was dissolved in 100 mL of toluene. Bromobenzene (0.97 g; 6.2 mmol) and tert-butoxysodium (0.710 g; 7 mmol) were introduced, and the atmosphere in the system was sufficiently replaced with nitrogen. The contents were heated to 50° C. (solution K). Tri-t-butylphosphine (0.012 g; 0.0062 mmol) was added to a solution of a tris(dibenzylideneacetone)dipalladium chloroform complex (0.051 g; 0.0049 mmol) in 10 mL of toluene, and this mixture was heated to 50° C. (solution L). In a nitrogen stream, the solution L was added to the solution K, and the resultant mixture was reacted with heating and refluxing for 2 hours. To this liquid reaction mixture was added N,N-diphenylamine (1.041 g; 6.15 mmol). The mixture was reacted with heating and refluxing for further 2 hours. This liquid reaction mixture was allowed to cool and dropped into methanol to obtain an end-capped crude polymer 3.

This end-capped crude polymer 3 was dissolved in toluene and reprecipitated from acetone, and the polymer precipitated was taken out by filtration. The polymer obtained was dissolved in toluene, and this solution was washed with dilute hydrochloric acid. The polymer was reprecipitated from ammonia-containing ethanol. This polymer was taken out by filtration and purified by column chromatography four times to obtain target polymer 3 (0.740 g).

Weight-average molecular weight (Mw)=75,600
Number-average molecular weight (Mn)=32,700
Distribution (Mw/Mn)=2.31

Polymer Synthesis Example 4

[Chem. 53]

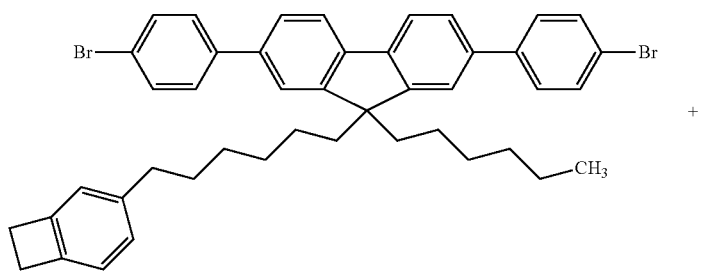

Target substance 15

-continued

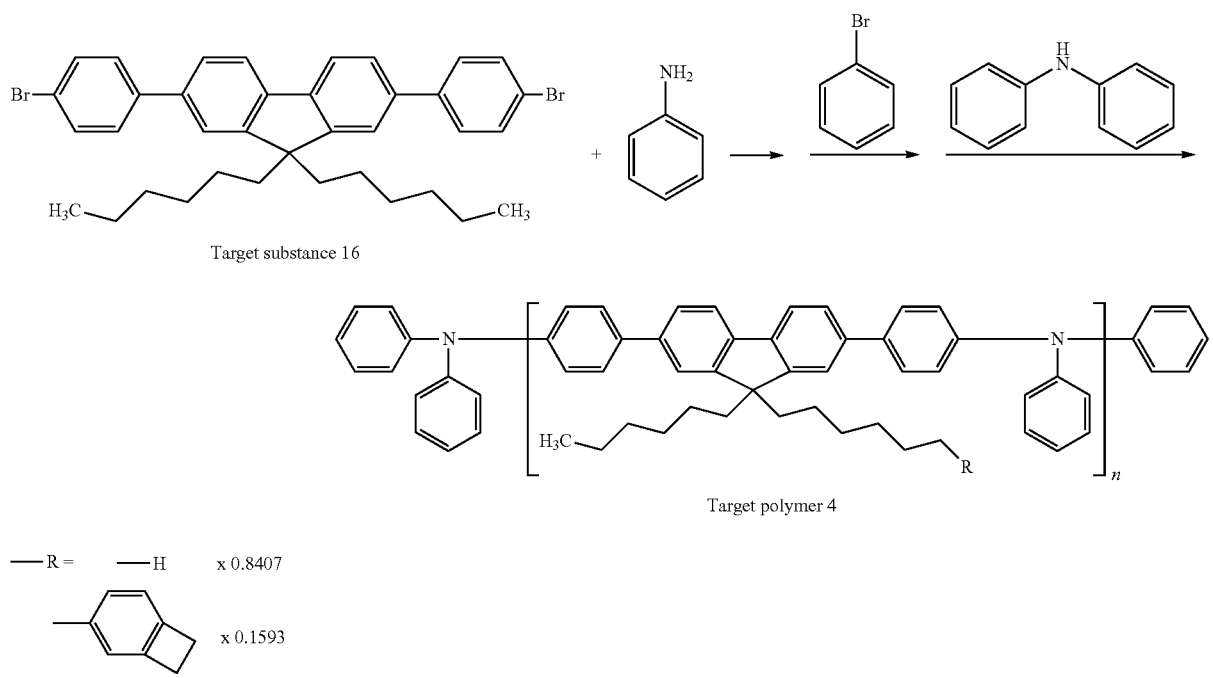

Target substance 16

Target polymer 4

—R = —H  x 0.8407 x 0.1593

The target substance 15 (0.659 g), the target substance 16 (1.22 g), aniline (0.516 g), tert-butoxysodium (1.70 g), and toluene (20 mL) were introduced into a reaction vessel in a nitrogen atmosphere, and the contents were heated to 50° C. (solution A). Tri-t-butylphosphine (0.089 g) was added to a solution of a tris(dibenzylideneacetone)dipalladium chloroform complex (0.0057 g) in 1 mL of toluene, and this mixture was heated to 50° C. (solution B).

In a nitrogen stream, the solution B was added to the solution A, and the resultant mixture was reacted with heating and refluxing for 1 hour. After it was ascertained that the starting materials had disappeared, the target substance 16 (1.78 g) was added. The resultant mixture was reacted with heating and refluxing for 40 minutes. This liquid reaction mixture was allowed to cool and dropped into 200 mL of ethanol to crystallize out crude polymer 4.

In a nitrogen atmosphere, the crude polymer obtained was dissolved in 130 mL of toluene. Bromobenzene (0.21 g) and tert-butoxysodium (1.70 g) were added thereto, and this mixture was heated to 50° C. (solution C). In a nitrogen stream, solution B prepared again was added to the solution C, and the resultant mixture was reacted with heating and refluxing for 2 hours. To this liquid reaction mixture was added N,N-diphenylamine (1.28 g). The mixture was reacted with heating and refluxing for further 4.5 hours. This liquid reaction mixture was allowed to cool and dropped into an ethanol/water mixture to obtain an end-capped crude polymer 4.

This end-capped crude polymer 4 was dissolved in toluene, and the resultant solution was washed with dilute hydrochloric acid. The polymer was reprecipitated from ammonia-containing ethanol. Subsequently, the polymer was dissolved in toluene and reprecipitated from acetone, and the polymer precipitated was taken out by filtration. The polymer recovered by filtration was purified by column chromatography to obtain target polymer 4 (1.80 g). The target polymer 4 was examined for weight-average molecular weight and number-average molecular weight (Mn). As a result, the weight-average molecular weight (Mw) and the distribution (Mw/Mn) thereof were found to be 56,000 and 1.6, respectively.

Polymer Synthesis Example 5

[Chem.54]

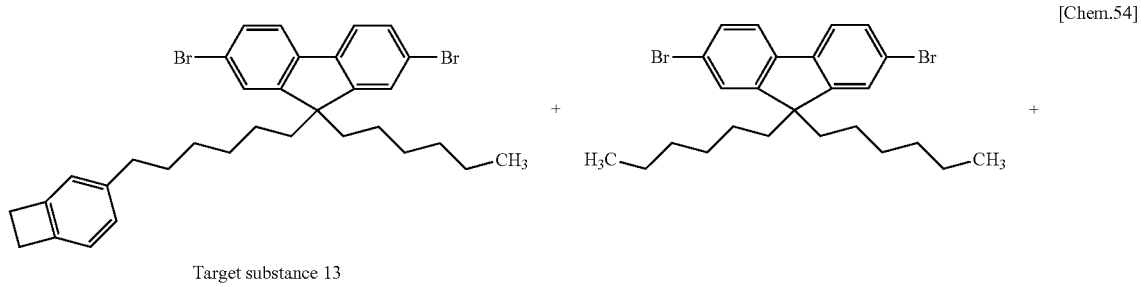

Target substance 13

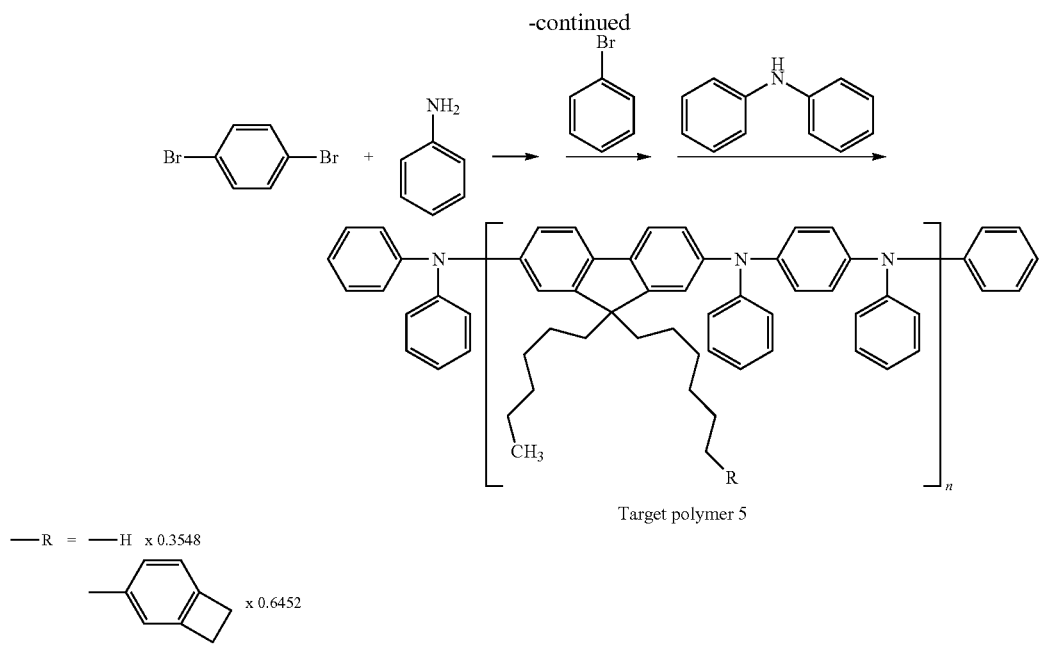

Target polymer 5

The target substance 13 (1.50 g), 2,7-dibromo-9,9-dihexylfluorene (0.683 g), aniline (0.728 g), tert-butoxysodium (2.41 g), and toluene (15 mL) were introduced into a reaction vessel in a nitrogen atmosphere, and the contents were heated to 50° C. (solution A). Tri-t-butylphosphine (0.126 g) was added to a solution of a tris(dibenzylideneacetone)dipalladium chloroform complex (0.080 g) in 1 mL of toluene, and this mixture was heated to 50° C. (solution B). In a nitrogen stream, the solution B was added to the solution A, and the resultant mixture was reacted with heating and refluxing for 1 hour. After it was ascertained that the starting materials had disappeared, p-dibromobenzene (0.905 g) was added. This mixture was heated and refluxed for 2 hours. Thereafter, p-dibromobenzene (0.018 g) was added thereto. This liquid reaction mixture was heated and refluxed for 2 hours, subsequently allowed to cool, and then dropped into 200 mL of ethanol to crystallize out a crude polymer.

In a nitrogen atmosphere, the crude polymer obtained was dissolved in 100 mL of toluene. Bromobenzene (0.25 g) and tert-butoxysodium (2.40 g) were added thereto, and this mixture was heated to 50° C. (solution C). In a nitrogen stream, solution B prepared again was added to the solution C, and the resultant mixture was reacted with heating and refluxing for 2 hours. To this liquid reaction mixture was added N,N-diphenylamine (1.50 g). The mixture was reacted with heating and refluxing for further 4 hours. This liquid reaction mixture was allowed to cool and dropped into an ethanol/water mixture to obtain an end-capped crude polymer 5.

This end-capped crude polymer 5 was dissolved in toluene, and the resultant solution was washed with dilute hydrochloric acid. The polymer was reprecipitated from ammonia-containing ethanol. Subsequently, the polymer was dissolved in toluene and reprecipitated from acetone, and the polymer precipitated was taken out by filtration. The polymer recovered by filtration was purified by column chromatography to obtain target polymer 5 (1.80 g). The target polymer 5 was examined for weight-average molecular weight and number-average molecular weight (Mn). As a result, the weight-average molecular weight (Mw) and the distribution (Mw/Mn) thereof were found to be 33,000 and 1.9, respectively.

Synthesis of Comparative Polymers

Comparative-Polymer Synthesis Example 1

[Chem. 55]

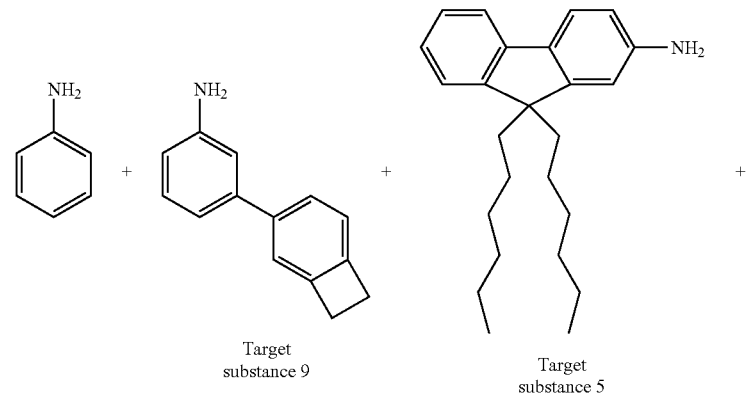

Target substance 9

Target substance 5

-continued

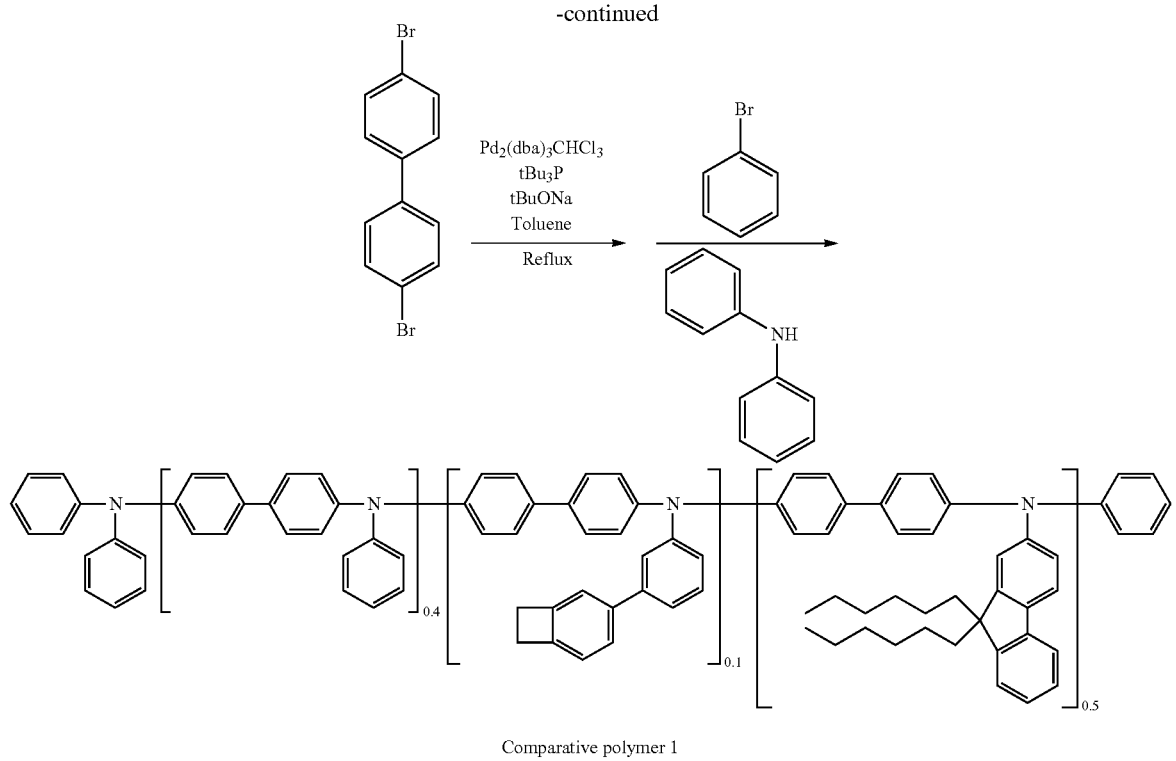

Comparative polymer 1

Aniline (0.36 g; 3.8 mmol), the target substance 9 (0.19 g; 0.96 mmol), the target substance 5 (1.68 g; 4.8 mmol), 4,4'-dibromobiphenyl (1.5 g; 4.8 mmol), tert-butoxysodium (2.96 g; 30.8 mmol), and toluene (22 mL) were introduced, and the atmosphere in the system was sufficiently replaced with nitrogen. The contents were heated to 50° C. (solution M). Tri-t-butylphosphine (0.16 g; 0.8 mmol) was added to a solution of a tris(dibenzylideneacetone)dipalladium chloroform complex (0.10 g; 0.1 mmol) in 6 mL of toluene, and this mixture was heated to 50° C. (solution N). In a nitrogen stream, the solution N was added to the solution M, and the resultant mixture was reacted with heating and refluxing for 1 hour. After it was ascertained that the aniline, the target substance 9, the target substance 5, and the 4,4'-dibromobiphenyl had disappeared, 4,4'-dibromobiphenyl (1.41 g; 4.5 mmol) was additionally added. The resultant mixture was heated and refluxed for 1 hour, and it was then able to be ascertained that polymerization had initiated. 4,4'-Dibromobiphenyl (0.03 g; 0.1 mmol) was hence additionally added three times in total at intervals of 1 hour (total amount, 0.09 g). After addition of the whole target substance 9, the liquid reaction mixture was heated and refluxed for further 30 minutes, subsequently allowed to cool, and then dropped into an aqueous ethanol solution (150 mL of ethanol and 25 mL of water) to crystallize out crude polymer 6.

The crude polymer 6 obtained was dissolved in 70 mL of toluene. Bromobenzene (0.30 g; 1.9 mmol) and tert-butoxysodium (1.48 g; 15.3 mmol) were introduced, and the atmosphere in the system was sufficiently replaced with nitrogen. The contents were heated to 50° C. (solution O). Tri-t-butylphosphine (0.08 g; 0.4 mmol) was added to a solution of a tris(dibenzylideneacetone)dipalladium chloroform complex (0.05 g; 0.05 mmol) in 4 mL of toluene, and this mixture was heated to 50° C. (solution P). In a nitrogen stream, the solution P was added to the solution O, and the resultant mixture was reacted with heating and refluxing for 2 hours. To this solution was added N,N-diphenylamine (1.63 g; 9.6 mmol).

The mixture was reacted with heating and refluxing for further 4 hours. This liquid reaction mixture was allowed to cool and dropped into an aqueous ethanol solution (150 mL of ethanol and 25 mL of water) to obtain an end-capped crude polymer 6.

This end-capped crude polymer 6 was dissolved in toluene and reprecipitated from acetone, and the polymer precipitated was taken out by filtration. The polymer obtained was dissolved in toluene, and this solution was washed with dilute hydrochloric acid. The polymer was reprecipitated from ammonia-containing ethanol. This polymer was taken out by filtration and purified twice by column chromatography to obtain comparative polymer 1 (1.71 g).

Weight-average molecular weight (Mw)=46,770
Number-average molecular weight (Mn)=20,100
Distribution (Mw/Mn)=2.33

Comparative-Polymer Synthesis Example 2

[Chem. 56]

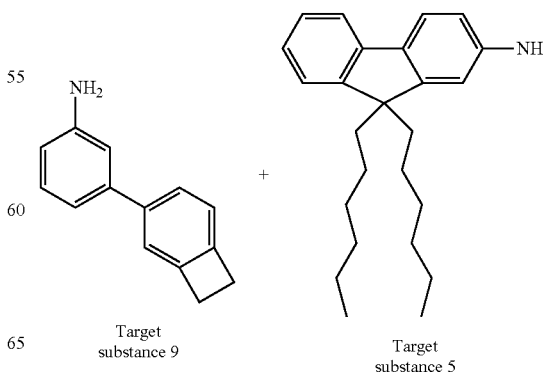

Target substance 9     Target substance 5

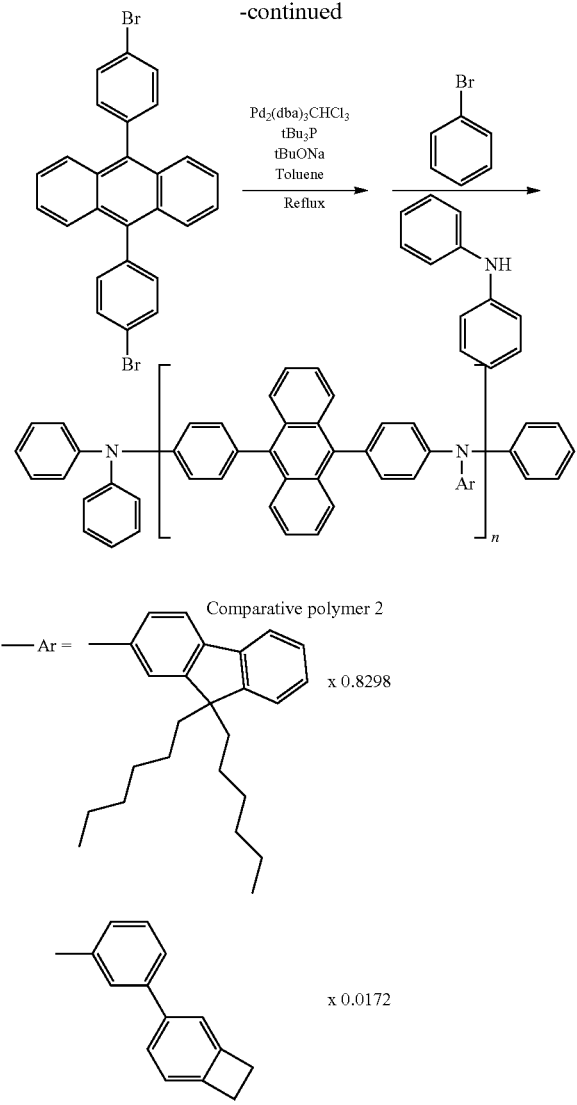

Comparative polymer 2

The target substance 9 (0.1702 g), the target substance 5 (1.485 g), 9,10-bis(4-bromophenyl)anthracene (1.250 g), tert-butoxysodium (1.58 g), and toluene 12 mL were introduced, and the atmosphere in the system was sufficiently replaced with nitrogen. The contents were heated to 50° C. (solution Q). Tri-t-butylphosphine (0.083 g) was added to a solution of a tris(dibenzylideneacetone)dipalladium chloroform complex (0.053 g) in 3 mL of toluene, and this mixture was heated to 50° C. (solution R). In a nitrogen stream, the solution R was added to the solution Q, and the resultant mixture was reacted with heating at 90° C. for 1 hour. Subsequently, 9,10-bis(4-bromophenyl)anthracene (1.175 g) was additionally added. The resultant liquid reaction mixture was heated and refluxed for 1.5 hours, subsequently allowed to cool, and then dropped into ethanol to crystallize out crude polymer 7.

The crude polymer 7 obtained was stirred in 500 mL of toluene with heating, and the insoluble matter was removed by filtration. The filtrate was concentrated, and the polymer was reprecipitated from ethanol. The crude polymer 7 (1.12 g) recovered by filtration, bromobenzene (0.057 g), and tert-butoxysodium (0.28 g) were introduced, and the atmosphere in the system was sufficiently replaced with nitrogen. The contents were heated to 50° C. (solution S). Tri-t-butylphosphine (0.030 g) was added to a solution of a tris(dibenzylideneacetone)dipalladium chloroform complex (0.019 g) in 3 mL of toluene, and this mixture was heated to 50° C. (solution T). In a nitrogen stream, the solution T was added to the solution S, and the resultant mixture was reacted with heating and refluxing for 2 hours. To this liquid reaction mixture was added N,N-diphenylamine (0.30 g), followed by solution T prepared again. The mixture was reacted with heating and refluxing for further 5 hours. The resultant liquid reaction mixture was allowed to cool and dropped into ethanol to obtain an end-capped crude polymer 7.

This end-capped crude polymer 7 was dissolved in toluene and reprecipitated from acetone, and the polymer precipitated was taken out by filtration. The polymer obtained was dissolved in toluene, and this solution was washed with dilute hydrochloric acid. The polymer was reprecipitated from ammonia-containing ethanol. This polymer was taken out by filtration and purified twice by column chromatography to obtain comparative polymer 2 (0.27 g).

Weight-average molecular weight (Mw)=68,000
Number-average molecular weight (Mn)=27,400
Distribution (Mw/Mn)=2.48

Reference Example 1

A composition containing the charge-transporting polymer (H1) of the invention which had the structure shown below (the target polymer 1 synthesized in Polymer Synthesis Example 1) was prepared and applied to a slide glass by spin coating under the following conditions, and the polymer was crosslinked by heating to form a film having a thickness of 50 nm.

[Chem. 57]

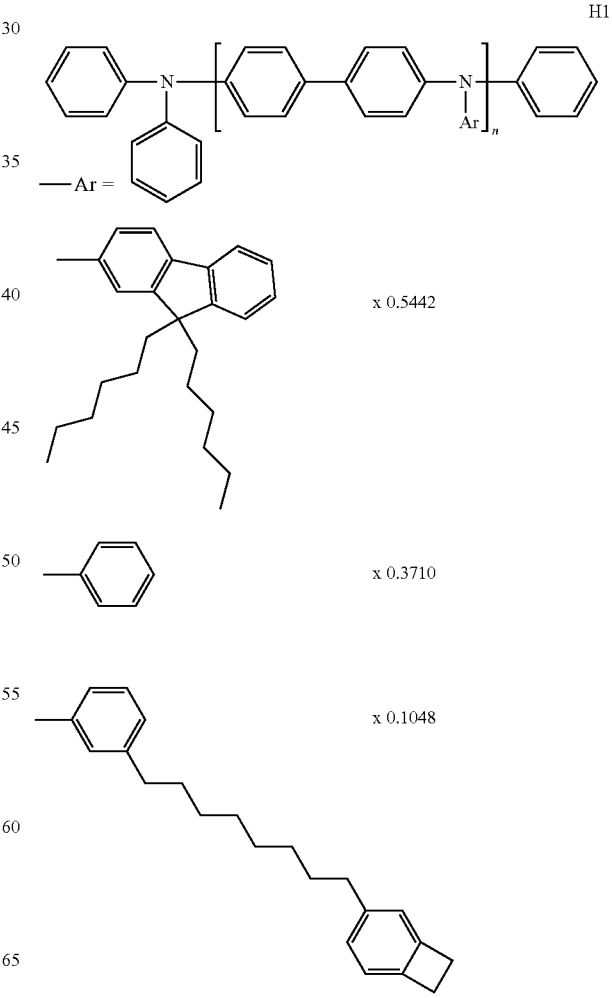

<Composition for Organic Electroluminescent Element>
 Solvent toluene
 Solid concentration 1.0 wt %
<Conditions for Forming Hole Transport Layer>
 Spinner rotation speed 1,500 rpm
 Spinner rotation period 30 sec
 Spin coating atmosphere in nitrogen
 Heating conditions in nitrogen; 230° C.; 1 hr The film thus obtained was examined for fluorescence spectrum at an excitation light wavelength of 375 nm using spectrophotometer F-4500 (manufactured by Hitachi, Ltd.). As a result, the wavelength at which the fluorescence intensity was highest was found to be 430 nm.

Comparative Reference Example 1

A composition containing the compound (H2) which had the structure shown below (the comparative polymer 1 synthesized in Comparative-Polymer Synthesis Example 1) was prepared and applied to a slide glass by spin coating under the following conditions, and the polymer was crosslinked by heating to form a film having a thickness of 50 nm.

[Chem. 58]

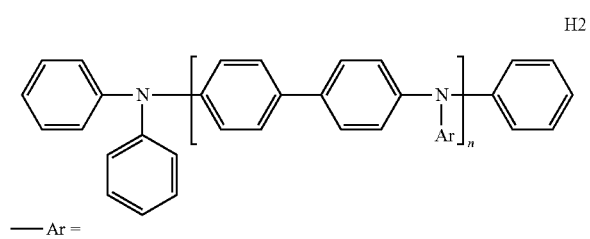

H2

—Ar =

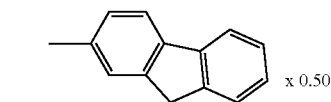

x 0.50

x 0.40

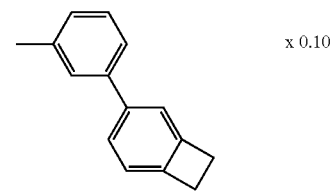

x 0.10

<Composition for Organic Electroluminescent Element>
 Solvent toluene
 Solid concentration 1.0 wt %
<Conditions for Forming Hole Transport Layer>
 Spinner rotation speed 1,500 rpm
 Spinner rotation period 30 sec
 Spin coating atmosphere in nitrogen
 Heating conditions in nitrogen; 230° C.; 1 hr The film thus obtained was examined for fluorescence spectrum at an excitation light wavelength of 375 nm using spectrophotometer F-4500 (manufactured by Hitachi, Ltd.). As a result, the wavelength at which the fluorescence intensity was highest was found to be 462 nm.

The fluorescence wavelengths of the films produced in Reference Example 1 and Comparative Reference Example 1 are shown in Table 1.

TABLE 1

|  | Excitation wavelength [nm] | Wavelength at which fluorescence intensity was highest [nm] |
| --- | --- | --- |
| Reference Example 1 | 375 | 430 |
| Comparative Reference Example 1 | 375 | 462 |

Table 1 shows that the film formed using the charge-transporting polymer of the invention has a fluorescence wavelength appearing on the shorter-wavelength side. Namely, it can be seen that the film formed using the charge-transporting polymer of the invention has little segregation or aggregation.

Production of Organic Electroluminescent Elements

Example 1

An organic electroluminescent element of the structure shown in FIG. 1 was produced.

A substrate constituted of a glass substrate and, formed thereon, a transparent conductive film of indium-tin oxide (ITO) deposited in a thickness of 120 nm (deposited by sputtering; manufactured by Sanyo Vacuum Industries Co., Ltd.) was subjected to processing by an ordinary technique of photolithography and etching with hydrochloric acid to pattern the transparent conductive film into stripes having a width of 2 mm. Thus, an anode was formed. The ITO substrate which had undergone the patterning was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried with compressed air, and finally subjected to ultraviolet/ozone cleaning.

First, a composition for hole injection layer formation including a hole-transporting high-molecular material having the repeating structure represented by the following structural formula (P1) (weight-average molecular weight, 26,500; number-average molecular weight, 12,000), 4-isopropyl-4'-methyldiphenyliodonium tetrakis(pentafluorophenyl) borate, which is represented by structural formula (A-1), and ethyl benzoate was prepared. This composition was applied to the anode by spin coating under the following conditions to obtain a hole injection layer having a thickness of 30 nm.

[Chem 59]

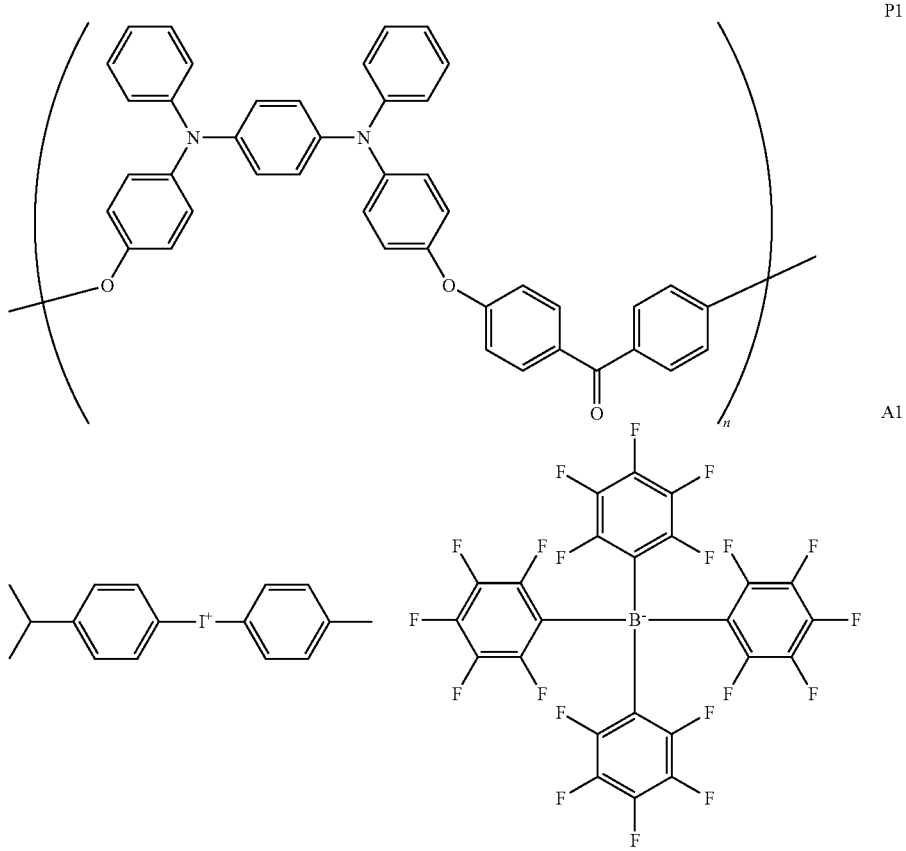

<Composition for Hole Injection Layer Formation>
  Solvent ethyl acetate
  Concentrations of composition P1: 2.0 wt %
  A1: 0.8 wt %<
<Conditions for Depositing Hole Injection Layer>
  Spinner rotation speed 1,500 rpm
  Spinner rotation period 30 sec
  Spin coating atmosphere in the air
  Heating conditions in the air; 230° C.; 3 hr Subsequently, a composition for organic electroluminescent element that contained the charge-transporting polymer (H1) of the invention (the target polymer 1 synthesized in Polymer Synthesis Example 1), which is represented by the following structural formula, was prepared and applied by spin coating under the following conditions. The polymer was crosslinked by heating, thereby forming a hole transport layer having a thickness of 20 nm.

[Chem. 60]

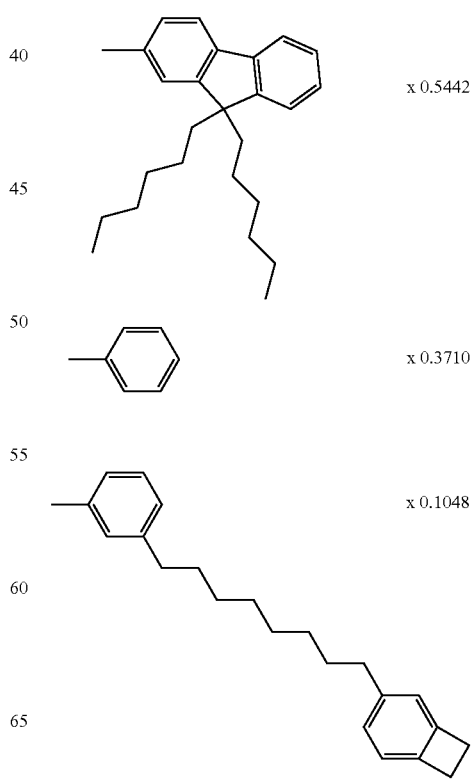

<Composition for Organic Electroluminescent Element>
  Solvent toluene
  Concentration of the composition 0.4 wt %
<Conditions for Depositing Hole Transport Layer>
  Spinner rotation speed 1,500 rpm
  Spinner rotation period 30 sec
  Spin coating atmosphere in nitrogen
  Heating conditions in nitrogen; 230° C.; 1 hr Next, in preparation for the formation of a luminescent layer, the organic compounds (C1) and (D1) shown below were used to prepare the composition for organic electroluminescent element shown below. This composition was applied to the hole transport layer by spin coating under the following conditions to obtain a luminescent layer having a thickness of 40 nm.

[Chem. 61]

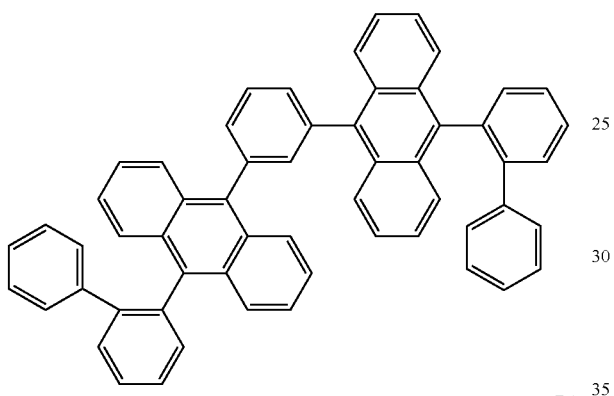

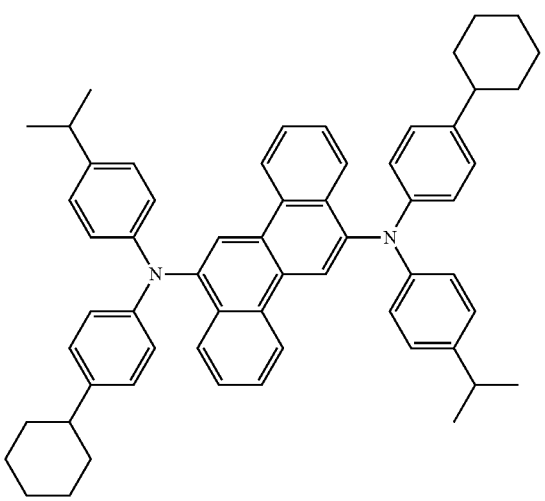

<Composition for Luminescent-Layer Formation>
  Solvent toluene
  Concentrations of the composition C1: 0.75 wt %
  D1: 0.08 wt %
<Conditions for Depositing Luminescent Layer>
  Spinner rotation speed 1,500 rpm
  Spinner rotation period 30 sec
  Spin coating atmosphere in nitrogen
  Heating conditions under vacuum (0.1 MPa); 130° C.; 1 hr The substrate on which the layers including the luminescent layer had been formed was transferred to a vacuum deposition apparatus connected to a gloved nitrogen box, and the apparatus was evacuated to a degree of vacuum within the apparatus of at least $1.7 \times 10^{-4}$ Pa. Thereafter, a layer of BAlq (C2) was deposited by vacuum deposition to obtain a hole blocking layer. The rate of deposition was regulated to 0.5-1.1 Å/sec and a hole blocking layer having a thickness of 10 nm was formed on the luminescent layer. The degree of vacuum during the deposition was $2.6 \times 10^{-5}$ to $3.9 \times 10^{-5}$ Pa.

[Chem. 62]

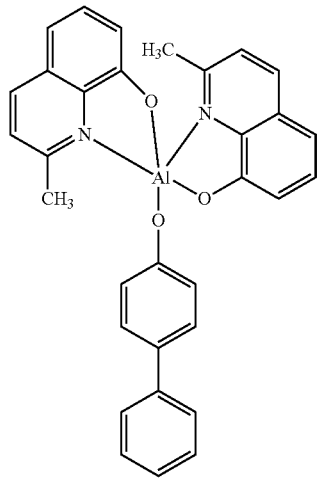

Subsequently, Alq3 (C3) was heated and deposited to form an electron transport layer. The degree of vacuum during the deposition was regulated to $2.8 \times 10^{-5}$ to $3.7 \times 10^{-5}$ Pa, and the rate of deposition was regulated to 0.7-1.2 Å/sec. Thus, a film having a thickness of 30 nm was formed on the hole blocking layer, thereby forming an electron transport layer.

[Chem. 63]

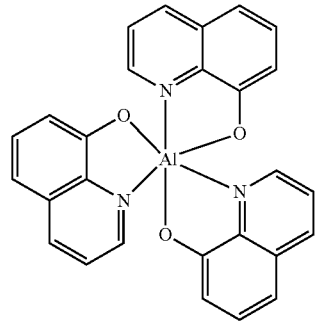

Here, the element in which the layers including the electron transport layer had been deposited was conveyed in a vacuum to a chamber connected to the chamber in which the hole blocking layer and the electron transport layer had been deposited. A shadow mask in the form of stripes with a width of 2 mm was brought, as a mask for cathode deposition, into close contact with the element so that these stripes were perpendicular to the ITO stripes of the anode.

First, lithium fluoride (LiF) was deposited as an electron injection layer in a thickness of 0.5 nm on the electron transport layer using a molybdenum boat, while regulating the rate of deposition to 0.09-0.14 Å/sec and the degree of vacuum to 2.7×10⁻⁵ to 5.4×10⁻⁵ Pa. Next, aluminum was likewise heated using a molybdenum boat and an aluminum layer having a thickness of 80 nm was formed as a cathode while regulating the rate of deposition to 0.5-1.3 Å/sec and the degree of vacuum to 2.1×10⁻⁵ to 5.4×10⁻⁵ Pa. During the deposition of these two layers, the temperature of the substrate was kept at room temperature.

Subsequently, sealing was conducted in the following manner in order to prevent the element from being deteriorated by the action of atmospheric moisture, etc. during storage.

In a gloved nitrogen box, photocurable resin 30Y-437 (manufactured by ThreeBond Co., Ltd.) was applied in a width of about 1 mm to the periphery of a glass plate having a size of 23 mm×23 mm, and a moisture getter sheet (manufactured by Dynic Corp.) was disposed in a central part. The substrate on which the cathode had been formed was laminated to the getter sheet so that the side having the deposited layers faced the desiccant sheet. Thereafter, only the region where the photocurable resin had been applied was irradiated with ultraviolet light to cure the resin.

Thus, an organic electroluminescent element having a luminescent area with a size of 2 mm×2 mm was obtained. The luminescent characteristics of this element are as follows.

Luminance during voltage application at 10 mA/cm²: 5,204 cd/m²

Voltage during voltage application at 10 mA/cm²: 5.8 V

Electric-power efficiency at 100 cd/m²: 1.2 μm/W

The element showed a luminescence spectrum which had a maximum-luminance wavelength of 461 nm, and the luminescence was found to be attributable to the compound (D1). The chromaticity of the luminescence was: CIE (x, y)= (0.140, 0.136).

Comparative Example 1

An organic electroluminescent element of the structure shown in FIG. 1 was produced in the same manner as in Example 1, except that a hole transport layer was formed by the following method.

A composition for organic electroluminescent element that contained the compound (H2) represented by the following structural formula (the comparative polymer 1 synthesized in Comparative-Polymer Synthesis Example 1) was prepared and applied by spin coating under the following conditions. The compound (H2) was crosslinked by heating, thereby forming a hole transport layer having a thickness of 20 nm.

[Chem. 64]

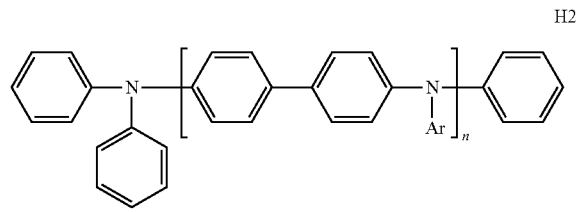

H2

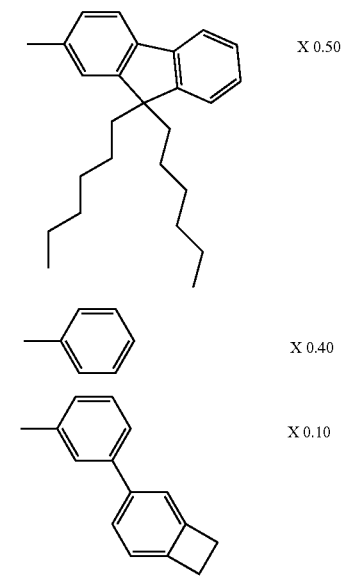

<Composition for Organic Electroluminescent Element>
Solvent toluene
Concentration of the composition 0.4 wt %
<Conditions for Depositing Hole Transport Layer>
Spinner rotation speed 1,500 rpm
Spinner rotation period 30 sec
Spin coating atmosphere in nitrogen
Heating conditions in nitrogen; 230° C.; 1 hr The luminescent characteristics of the organic electroluminescent element thus obtained, which had a luminescent area with a size of 2 mm×2 mm, are as follows.

Luminance during voltage application at 10 mA/cm²: 4,693 cd/m²

Voltage during voltage application at 10 mA/cm²: 7.5 V

Electric-power efficiency at 100 cd/m²: 0.9 lm/W

The element showed a luminescence spectrum which had a maximum-luminance wavelength of 465 nm, and the luminescence was found to be attributable to the compound (D1). The chromaticity of the luminescence was: CIE (x, y)= (0.137, 0.175).

The characteristics of the organic electroluminescent elements produced in Example 1 and Comparative Example 1 are summarized in Table 2 together with the time period required for each element to decrease in luminance to 800 cd/m² in a direct-current driving test in which the element was operated at an initial luminance of 1,000 cd/m² (life regarding luminance attenuation to 80%).

TABLE 2

|  | Luminance during voltage application at 10 mA/cm² [cd/m²] | Voltage during voltage application at 10 mA/cm² [V] | Electric-power efficiency at 100 cd/m² [lm/W] | Normalized life regarding luminance attenuation to 80%, the life in the Comparative Example being 1 |
|---|---|---|---|---|
| Example 1 | 5204 | 5.8 | 1.2 | 1.2 |
| Comparative Example 1 | 4693 | 7.5 | 0.9 | 1.0 |

It can be seen from Table 2 that the organic electroluminescent element having a layer formed by crosslinking the charge-transporting polymer of the invention has a low operating voltage, a high electric-power efficiency, and a long working life.

Example 2

An organic electroluminescent element of the structure shown in FIG. 1 was produced in the same manner as in Example 1, except that a hole transport layer and a luminescent layer were formed by the following methods.

A composition for organic electroluminescent element that contained the charge-transporting polymer (H3) according to the invention (the target polymer 2 synthesized in Polymer Synthesis Example 2), which is represented by the following structural formula, was prepared and applied by spin coating under the following conditions. The polymer was crosslinked by heating, thereby forming a hole transport layer having a thickness of 20 nm.

<Composition for Organic Electroluminescent Element>
Solvent toluene
Concentration of the composition 0.4 wt %
<Conditions for Depositing Hole Transport Layer>
Spinner rotation speed 1,500 rpm
Spinner rotation period 30 sec
Spin coating atmosphere in nitrogen
Heating conditions in nitrogen; 230° C.; 1 hr Next, in preparation for the formation of a luminescent layer, the organic compounds (C4) and (D1) shown below were used to prepare the composition for organic electroluminescent element shown below. This composition was applied to the hole transport layer by spin coating under the following conditions to obtain a luminescent layer having a thickness of 40 nm.

[Chem. 65]

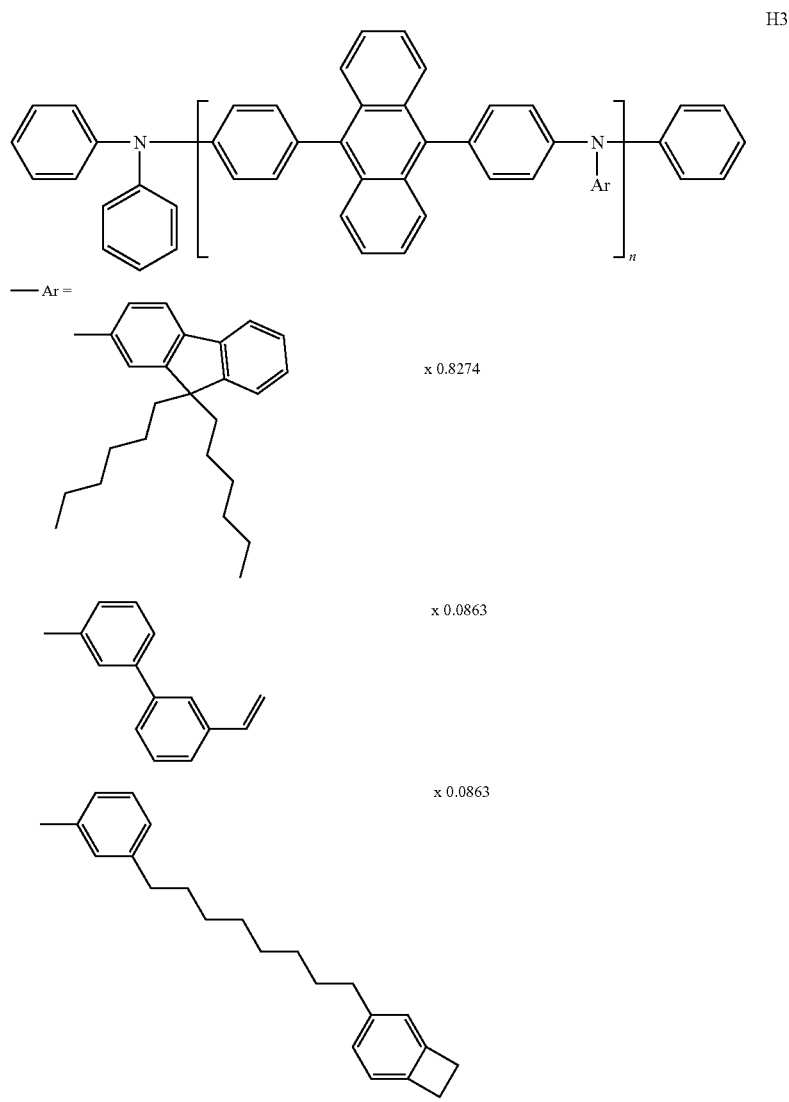

[Chem. 66]

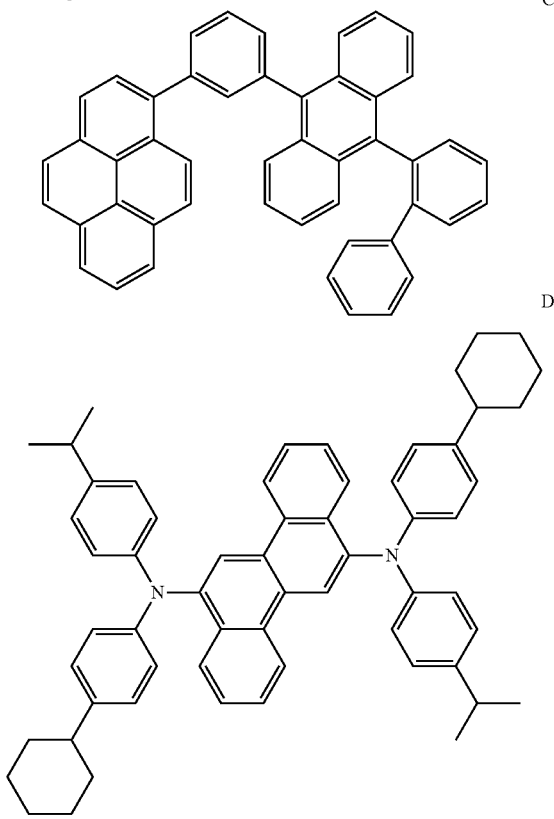

<Composition for Luminescent-Layer Formation>
Solvent toluene
Concentrations of the composition C4: 0.75 wt %
D1: 0.08 wt %
<Conditions for Depositing Luminescent Layer>
Spinner rotation speed 1,500 rpm
Spinner rotation period 30 sec
Spin coating atmosphere in nitrogen
Heating conditions under vacuum (0.1 MPa); 130° C.; 1 hr The luminescent characteristics of the organic electroluminescent element thus obtained, which had a luminescent area with a size of 2 mm×2 mm, are as follows.

Luminance during voltage application at 10 mA/cm$^2$: 9,477 cd/m$^2$

Voltage during voltage application at 10 mA/cm$^2$: 7.5 V

Electric-power efficiency at 100 cd/m$^2$: 2.0 μm/W

The element showed a luminescence spectrum which had a maximum-luminance wavelength of 465 nm, and the luminescence was found to be attributable to the compound (D1). The chromaticity of the luminescence was: CIE (x, y)= (0.141, 0.165).

Comparative Example 2

An organic electroluminescent element of the structure shown in FIG. 1 was produced in the same manner as in Example 2, except that a hole transport layer was formed by the following method.

A composition for organic electroluminescent element that contained the compound (H4) represented by the following structural formula (the comparative polymer 2 synthesized in Comparative-Polymer Synthesis Example 2) was prepared and applied by spin coating under the following conditions. The compound (H4) was crosslinked by heating, thereby forming a hole transport layer having a thickness of 20 nm.

[Chem. 67]

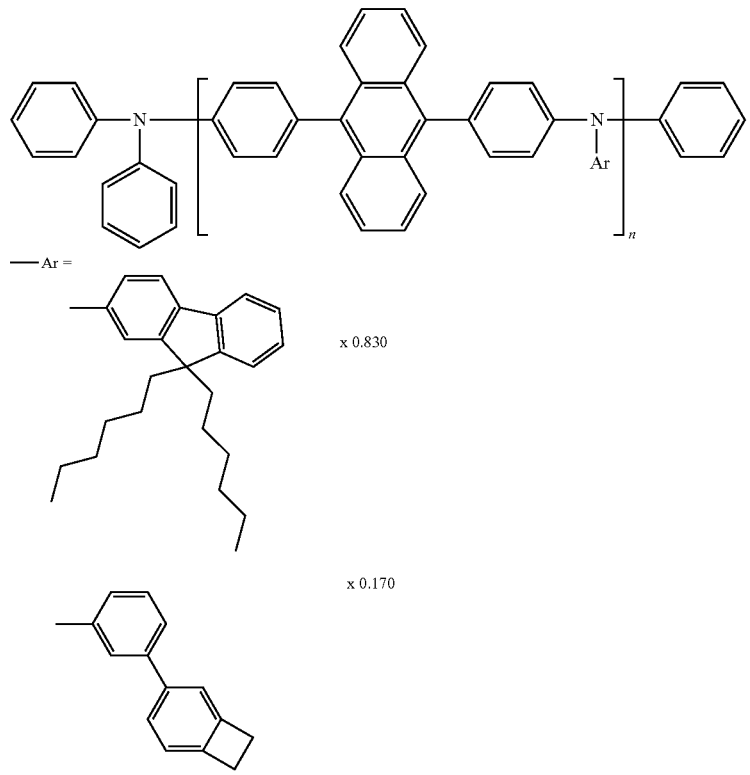

<Composition for Organic Electroluminescent Element>
  Solvent toluene
  Concentration of the composition 0.4 wt %
<Conditions for Depositing Hole Transport Layer>
  Spinner rotation speed 1,500 rpm
  Spinner rotation period 30 sec
  Spin coating atmosphere in nitrogen
  Heating conditions in nitrogen; 230° C.; 1 hr The luminescent characteristics of the organic electroluminescent element thus obtained, which had a luminescent area with a size of 2 mm×2 mm, are as follows.

Luminance during voltage application at 10 mA/cm$^2$: 8,670 cd/m$^2$

[Chem. 68]

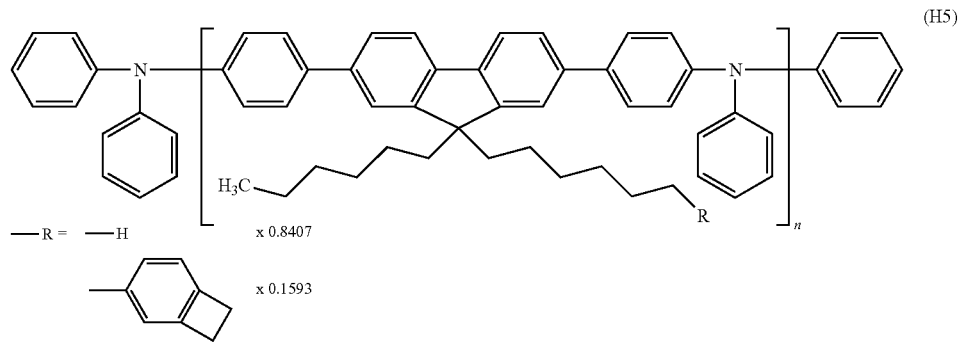

Voltage during voltage application at 10 mA/cm$^2$: 7.4 V

Electric-power efficiency at 100 cd/m$^2$: 1.8 μm/W

The element showed a luminescence spectrum which had a maximum-luminance wavelength of 464 nm, and the luminescence was found to be attributable to the compound (D1). The chromaticity of the luminescence was: CIE (x, y)= (0.137, 0.155).

The characteristics of the organic electroluminescent elements produced in Example 2 and Comparative Example 2 are summarized in Table 3 together with the time period required for each element to decrease in luminance to 800 cd/m$^2$ in a direct-current driving test in which the element was operated at an initial luminance of 2,000 cd/m$^2$ (life regarding luminance attenuation to 80%).

TABLE 3

|  | Luminance during voltage application at 10 mA/cm$^2$ [cd/m$^2$] | Voltage during voltage application at 10 mA/cm$^2$ [V] | Electric-power efficiency at 100 cd/m$^2$ [lm/W] | Normalized life regarding luminance attenuation to 80%, the life in Comparative Example 2 being 1 |
|---|---|---|---|---|
| Example 2 | 9477 | 7.5 | 2.0 | 1.3 |
| Comparative Example 2 | 8670 | 7.4 | 1.8 | 1.0 |

It can be seen from Table 3 that the organic electroluminescent element having a layer formed by crosslinking the charge-transporting polymer of the invention has a high electric-power efficiency and a long working life.

Example 3

An organic electroluminescent element of the structure shown in FIG. 1 was produced in the same manner as in Example 2, except that a hole transport layer was formed by the following method.

A composition for organic electroluminescent element that contained the charge-transporting polymer (H5) according to the invention (the target polymer 4 synthesized in Polymer Synthesis Example 4), which is represented by the following structural formula, was prepared and applied by spin coating under the following conditions. The polymer was crosslinked by heating, thereby forming a hole transport layer having a thickness of 20 nm.

<Composition for Organic Electroluminescent Element>
  Solvent toluene
  Concentration of the composition 0.4 wt %
<Conditions for Depositing Hole Transport Layer>
  Spinner rotation speed 1,500 rpm
  Spinner rotation period 30 sec
  Spin coating atmosphere in nitrogen
  Heating conditions in nitrogen; 230° C.; 1 hr The luminescent characteristics of the organic electroluminescent element thus obtained, which had a luminescent area with a size of 2 mm×2 mm, are as follows.

Voltage at 100 cd/m$^2$: 6.0 V

Voltage at 1,000 cd/m$^2$: 8.3 V

Current efficiency at 100 cd/m$^2$: 3.6 cd/A

Current efficiency at 1,000 cd/m$^2$: 3.7 cd/A

The element showed a luminescence spectrum which had a maximum-luminance wavelength of 465 nm, and the luminescence was found to be attributable to the compound (D1). The chromaticity of the luminescence was: CIE (x, y)= (0.137, 0.176).

Comparative Example 3

An organic electroluminescent element of the structure shown in FIG. 1 was produced in the same manner as in Example 3, except that a hole transport layer was formed by the following method.

A composition for organic electroluminescent element that contained the charge-transporting polymer (H6) represented by the following structural formula (weight-average molecular weight (Mw)=67,850; number-average molecular weight (Mn)=35,400) was prepared and applied by spin coating under the following conditions. The polymer was crosslinked by heating, thereby forming a hole transport layer having a thickness of 20 nm.

[Chem. 69]

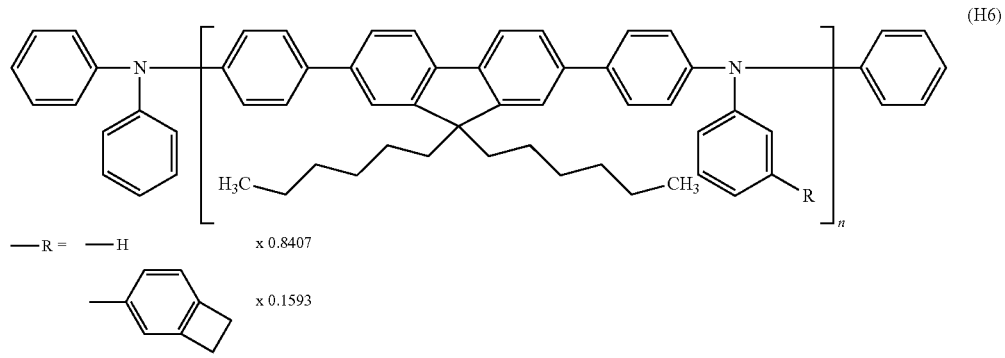

(H6)

<Composition for Organic Electroluminescent Element>
Solvent toluene
Concentration of the composition 0.4 wt %
<Conditions for Depositing Hole Transport Layer>
Spinner rotation speed 1,500 rpm
Spinner rotation period 30 sec
Spin coating atmosphere in nitrogen
Heating conditions in nitrogen; 230° C.; 1 hr The luminescent characteristics of the organic electroluminescent element thus obtained, which had a luminescent area with a size of 2 mm×2 mm, are as follows.

Voltage at 100 cd/m²: 6.2 V
Voltage at 1,000 cd/m²: 8.7 V
Current efficiency at 100 cd/m²: 3.4 cd/A
Current efficiency at 1,000 cd/m²: 3.5 cd/A The element showed a luminescence spectrum which had a maximum-luminance wavelength of 467 nm, and the luminescence was found to be attributable to the compound (D1). The chromaticity of the luminescence was: CIE (x, y)= (0.134, 0.180).

The characteristics of the organic electroluminescent elements produced in Example 3 and Comparative Example 3 are summarized in Table 4 together with the time period required for each element to decrease in luminance to 800 cd/m² in a direct-current driving test in which the element was operated at an initial luminance of 2,000 cd/m² (life regarding luminance attenuation to 80%).

TABLE 4

| | Voltage at 100 cd/m² [V] | Voltage at 1000 cd/m² [V] | Current efficiency at 100 cd/m² [cd/A] | Current efficiency at 1000 cd/m² [cd/A] | Normalized life regarding luminance attenuation to 80%, the life in the Comparative Example being 1 |
|---|---|---|---|---|---|
| Example 3 | 6.0 | 8.3 | 3.6 | 3.7 | 1.9 |
| Comparative Example 3 | 6.2 | 8.7 | 3.4 | 3.5 | 1.0 |

It can be seen from Table 4 that the organic electroluminescent element having a layer formed by crosslinking the charge-transporting polymer of the invention has a low operating voltage, a high current efficiency, and a long life.

Example 4

An organic electroluminescent element of the structure shown in FIG. 1 was produced in the same manner as in Example 2, except that a hole transport layer was formed by the following method.

A composition for organic electroluminescent element that contained the charge-transporting polymer (H7) according to the invention (the target polymer 3 synthesized in Polymer Synthesis Example 3), which is represented by the following structural formula, was prepared and applied by spin coating under the following conditions. The polymer was crosslinked by heating, thereby forming a hole transport layer having a thickness of 20 nm.

[Chem. 70]

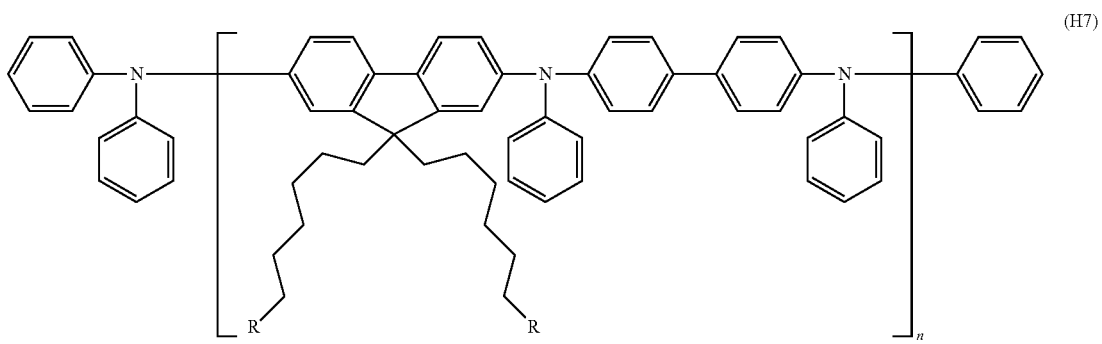

(H7)

—R = —H  x 0.9

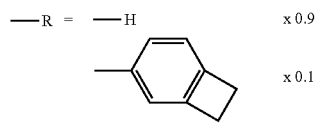  x 0.1

<Composition for Organic Electroluminescent Element>
  Solvent toluene
  Concentration of the composition 0.4 wt %
<Conditions for Depositing Hole Transport Layer>
  Spinner rotation speed 1,500 rpm
  Spinner rotation period 30 sec
  Spin coating atmosphere in nitrogen
  Heating conditions in nitrogen; 230° C.; 1 hr
  The luminescent characteristics of the organic electroluminescent element thus obtained, which had a luminescent area with a size of 2 mm×2 mm, are as follows.
  Voltage at 100 cd/m$^2$: 5.6 V
  Current efficiency at 100 cd/m$^2$: 2.6 cd/A
  The element showed a luminescence spectrum which had a maximum-luminance wavelength of 465 nm, and the luminescence was found to be attributable to the compound (D1). The chromaticity of the luminescence was: CIE (x, y)= (0.137, 0.160).

Comparative Example 4

An organic electroluminescent element of the structure shown in FIG. 1 was produced in the same manner as in Example 4, except that a hole transport layer was formed by the following method.

A composition for organic electroluminescent element that contained the charge-transporting polymer (H8) represented by the following structural formula (Mw, 55,000; Mn, 28,900; Mw/Mn, 1.9) was prepared and applied by spin coating under the following conditions. The polymer was crosslinked by heating, thereby forming a hole transport layer having a thickness of 20 nm.

<Composition for Organic Electroluminescent Element>
  Solvent toluene
  Concentration of the composition 0.4 wt %
<Conditions for Depositing Hole Transport Layer>
  Spinner rotation speed 1,500 rpm
  Spinner rotation period 30 sec
  Spin coating atmosphere in nitrogen
  Heating conditions in nitrogen; 230° C.; 1 hr
  The luminescent characteristics of the organic electroluminescent element thus obtained, which had a luminescent area with a size of 2 mm×2 mm, are as follows.
  Voltage at 100 cd/m$^2$: 5.8 V
  Current efficiency at 100 cd/m$^2$: 2.2 cd/A
  The element showed a luminescence spectrum which had a maximum-luminance wavelength of 467 nm, and the luminescence was found to be attributable to the compound (D1). The chromaticity of the luminescence was: CIE (x, y)= (0.136, 0.168).

The characteristics of the organic electroluminescent elements produced in Example 4 and Comparative Example 4 are summarized in Table 5 together with the time period required for each element to decrease in luminance to 800 cd/m$^2$ in a direct-current driving test in which the element was operated at an initial luminance of 2,000 cd/m$^2$ (life regarding luminance attenuation to 80%).

[Chem. 71]

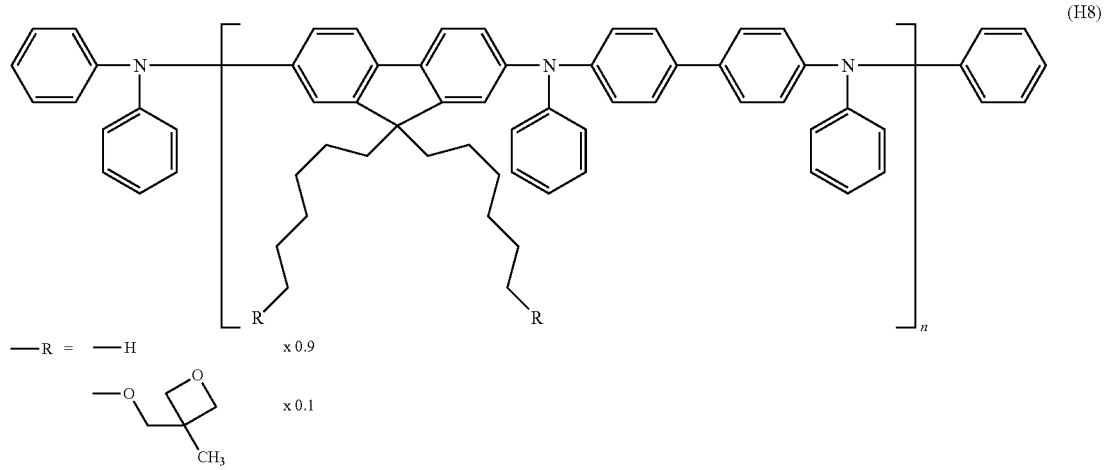

TABLE 5

|  | Voltage at 100 cd/m$^2$ [V] | Current efficiency at 100 cd/m$^2$ [cd/A] | Normalized life regarding luminance attenuation to 80%, the life in the Comparative Example being 3 |
|---|---|---|---|
| Example 4 | 5.6 | 2.6 | 2.2 |
| Comparative Example 4 | 5.8 | 2.2 | 1.0 |

It can be seen from Table 5 that the organic electroluminescent element having a layer formed by crosslinking the charge-transporting polymer of the invention has a low operating voltage, a high current efficiency, and a long working life.

Example 5

A test element having a single-layer structure was produced in the manner explained below.

A substrate constituted of a glass substrate 1 and, formed thereon, a transparent conductive film of indium-tin oxide (ITO) deposited in a thickness of 120 nm (deposited by sputtering; manufactured by Sanyo Vacuum Industries Co., Ltd.) was subjected to processing by an ordinary technique of photolithography and etching with hydrochloric acid to pattern the transparent conductive film into stripes having a width of 2 mm. Thus, an anode 2 was formed and an ITO substrate was obtained.

The ITO substrate which had undergone the patterning was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried with compressed air, and finally subjected to ultraviolet/ozone cleaning.

In toluene as a solvent were dissolved 2% by weight the charge-transporting polymer (H9) (the target polymer 5 synthesized in Polymer Synthesis Example 5) and 0.06% by weight 4-isopropyl-4'-methyldiphenyliodonium tetrakis (pentafluorophenyl) borate, which is represented by structural formula (A-1). The resultant solution was filtered through a membrane filter made of PTFE (polytetrafluoroethylene) having a pore diameter of 0.2 μm to produce a coating composition. This coating composition was applied to the ITO substrate by spin coating. The spin coating was conducted in the air having a temperature of 23° C. and a relative humidity of 60%, under the conditions of a spinner rotation speed of 1,500 rpm and a spinner period of 30 seconds. After the spin coating, the coating film was heated at 230° C. for 1 hour in an oven in the ordinary-pressure air atmosphere. Thus, a sample layer (corresponding to the hole injection layer of an organic electroluminescent element) 10 was formed.

[Chem. 72]

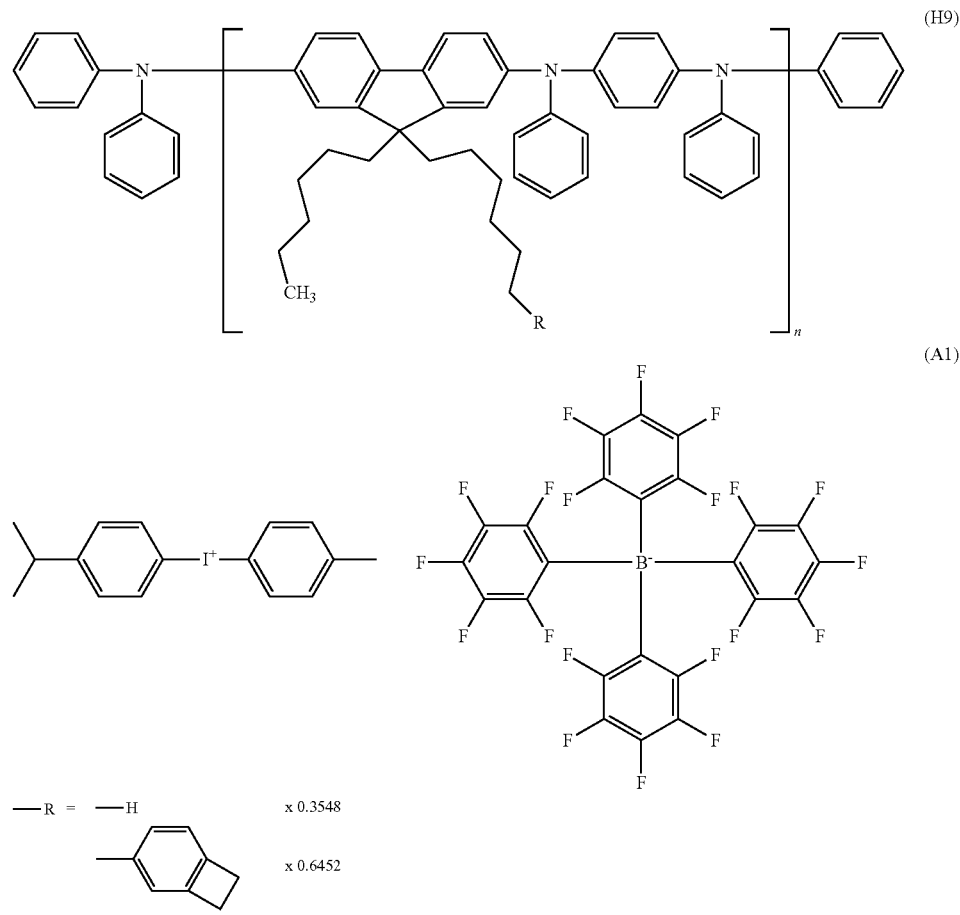

Subsequently, a shadow mask in the form of stripes with a width of 2 mm, as a mask for cathode deposition, was brought into close contact with the element so that these stripes were perpendicular to the ITO stripes of the anode 2. The apparatus was roughly evacuated with an oil-sealed rotary pump and then evacuated with a cryopump until the degree of vacuum within the apparatus became at least $3\times10^{-4}$ Pa.

Aluminum was heated in a molybdenum boat to form an aluminum layer having a thickness of 80 nm as a cathode 9 while regulating the rate of deposition to 0.5-5 Å/sec and the degree of vacuum to $2\times10^{-4}$ to $3\times10^{-4}$ Pa. During the deposition of the cathode 9, the substrate temperature was kept at room temperature.

Thus, a test element having an element area with a size of 2 mm×2 mm was obtained.

The test element obtained was connected to Source Meter Type 2400 (manufactured by Keithley Inc.). Gradually increasing values of voltage were applied to the element, and the resultant current values were read out. As a result, the voltage at a current density of 100 mA/cm$^2$ was as low as 5.6 V.

Comparative Example 5

A test element was produced in the same manner as in Example 5, except that the charge-transporting polymer (H9) was replaced with (H10) represented by the following structural formula (weight-average molecular weight (Mw)=63,600; number-average molecular weight (Mn)=35,100).

[Chem. 73]

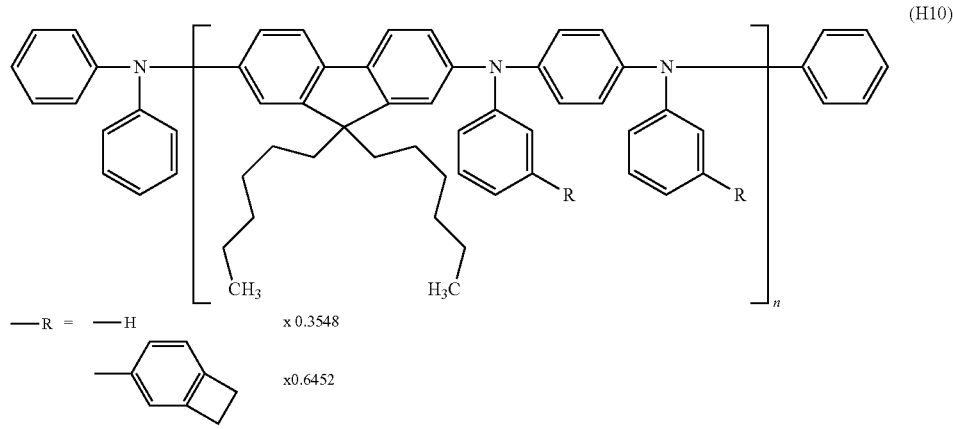

The test element obtained was connected to Source Meter Type 2400 (manufactured by Keithley Inc.). Gradually increasing values of voltage were applied to the element, and the resultant current values were read out. As a result, the voltage at a current density of 100 mA/cm$^2$ was 8.3 V.

It can be seen that the organic electroluminescent element in which the layer formed by crosslinking a charge-transporting polymer of the invention further contains an electron-accepting compound has a low operating voltage.

While the invention has been described in detail and with reference to specific embodiments thereof, it will be apparent to one skilled in the art that various changes and modifications can be made therein without departing from the spirit and scope thereof.

This application is based on a Japanese patent application filed on Aug. 11, 2008 (Application No. 2008-207411), the contents thereof being incorporated herein by reference.

INDUSTRIAL APPLICABILITY

The charge-transporting polymer of the invention has excellent electrochemical stability, film-forming properties, charge-transporting ability, luminescent characteristics, and heat resistance, and is hence applicable as a hole injection material, hole transport material, luminescent material, host material, electron injection material, electron transport material, etc. according to the layer configurations of elements.

Organic electroluminescent elements having a layer (crosslinked layer) obtained by crosslinking the charge-transporting polymer of the invention are thought to be applicable to flat panel displays (e.g., displays for OA computers and wall-mounted TV receivers), vehicle-mounted display elements, cell phone displays, light sources taking advantage of the feature of a surface light emitter (e.g., the light source of a copier and the backlight of a liquid-crystal display or instrument), display panels, and marker lights, and have a high technical value.

Furthermore, the charge-transporting polymer of the invention is useful not only in organic electroluminescent elements but also in the whole organic devices including electrophotographic photoreceptors and organic solar cells, because the polymer essentially has excellent oxidation-reduction resistance.

DESCRIPTION OF THE REFERENCE NUMERALS

1 Substrate
2 Anode
3 Hole injection layer
4 Hole transport layer
5 Luminescent layer
6 Hole blocking layer
7 Electron transport layer
8 Electron injection layer
9 Cathode

The invention claimed is:
1. A charge-transporting polymer, comprising a side chain represented by formula (1):

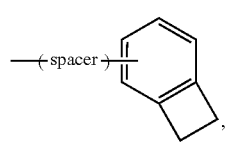

wherein
the benzocyclobutene ring optionally has one or more substituents, and the substituents are optionally bonded to each other to form a ring; and
the spacer represents a group which links the benzocyclobutene ring to a main chain of the charge-transporting polymer through three or more single bonds.

2. The charge-transporting polymer according to claim 1, wherein the side chain represented by formula (1) is a group represented by formula (2):

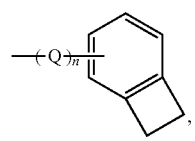
(2)

wherein the divalent group Q represents a group selected from the group consisting of —CR$^1$R$^2$—, —O—, —CO—, —NR$^3$—, and —S—, and n represents a natural number of 2-30,
R$^1$ to R$^3$ each independently represent a hydrogen atom or an alkyl group which optionally has a substituent,
the number n of Qs are the same or different, and
the benzocyclobutene ring in formula (2) optionally has a substituent besides the divalent group Q.

3. The charge-transporting polymer according to claim 2, wherein the group represented by formula (2) is a group represented by formula (3):

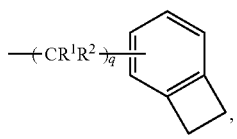
(3)

wherein R$^1$ and R$^2$ each independently represent a hydrogen atom or an alkyl group which optionally has a substituent, and q represents a natural number of 2-30,
the number q of R$^1$s and the number q of R$^2$s each independently are the same or different, and
the benzocyclobutene ring in formula (3) optionally has a substituent besides the —(CR$^1$R$^2$)$_q$— group.

4. The charge-transporting polymer according to claim 1, which comprises, as a partial structure, a monovalent or higher valent group which comprises a triarylamine structure.

5. The charge-transporting polymer according to claim 1, which comprises, as a partial structure, a monovalent or higher valent group which comprises a fluorene ring.

6. The charge-transporting polymer according to claim 1, which has a weight-average molecular weight (Mw) of 20,000 or higher and a distribution (Mw/Mn) of 2.5 or less, in which Mn represents the number-average molecular weight.

7. The charge-transporting polymer according to claim 1, which comprises a repeating unit represented by formula (4):

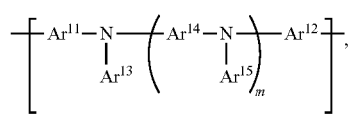
(4)

wherein
m represents an integer of 0-3,
Ar$^{11}$ and Ar$^{12}$ each independently represent a direct bond, an aromatic hydrocarbon group which optionally has a substituent, or an aromatic heterocyclic group which optionally has a substituent,
Ar$^{13}$ to Ar$^{15}$ each independently represent an aromatic hydrocarbon group which optionally has a substituent or an aromatic heterocyclic group which optionally has a substituent, and
Ar$^{11}$ and Ar$^{12}$ are not simultaneously direct bonds.

8. The charge-transporting polymer according to claim 1, wherein a number of groups represented by formula (1) per molecule weight of 1,000 of the polymer is from 0.01 to 3, wherein the molecular weight is a value which is calculated from a molar ratio and a structural formula of feed monomers for the charge-transporting polymer excluding end groups.

9. The charge-transporting polymer according to claim 8, comprising a group represented by formula (5):

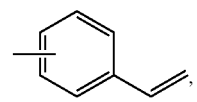
(5)

wherein the styryl group optionally has one or more substituents, and the one or more substituents optionally bond to each other to form a ring.

10. A composition for organic electroluminescent element, comprising the charge-transporting polymer according to claim 1 and a solvent.

11. The composition for organic electroluminescent element according to claim 10, further comprising an electron-accepting compound.

12. An organic electroluminescent element, comprising:
a substrate and, provided thereon,
an anode,
a cathode, and
an organic layer interposed between the anode and the cathode,
wherein the organic layer comprises a layer formed by coating an underlying layer of the organic layer with the composition of claim 10 and then crosslinking the charge-transporting polymer.

13. The organic electroluminescent element according to claim 12, wherein the layer formed by crosslinking of the charge-transporting polymer is at least one of a hole injection layer and a hole transport layer.

14. The organic electroluminescent element according to claim 12, further comprising:
a hole injection layer,
a hole transport layer, and
a luminescent layer,
wherein all of the hole injection layer, the hole transport layer, and the luminescent layer are formed by a wet film formation method.

15. An organic EL display, comprising the organic electroluminescent element according to claim 12.

16. An organic EL lighting, comprising the organic electroluminescent element according to claim 12.

17. A charge-transporting polymer comprising, a side chain selected from the group consisting of

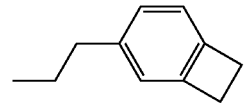

123
-continued
124
-continued
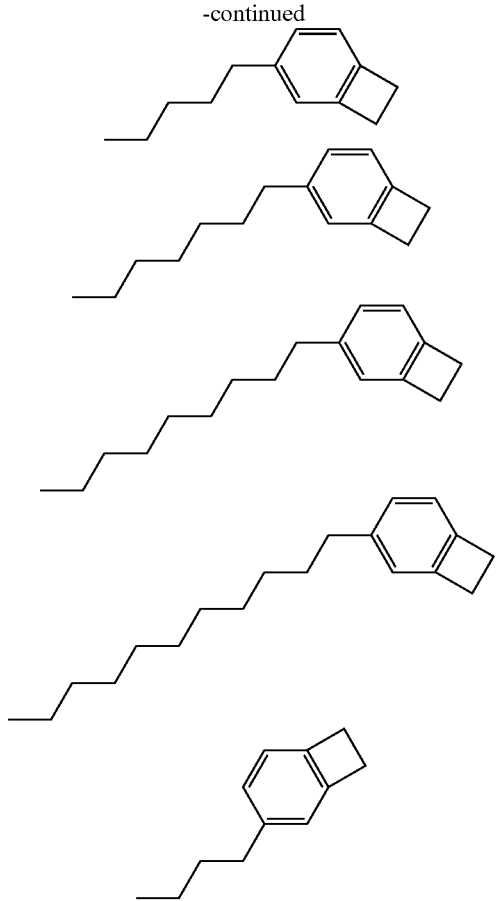
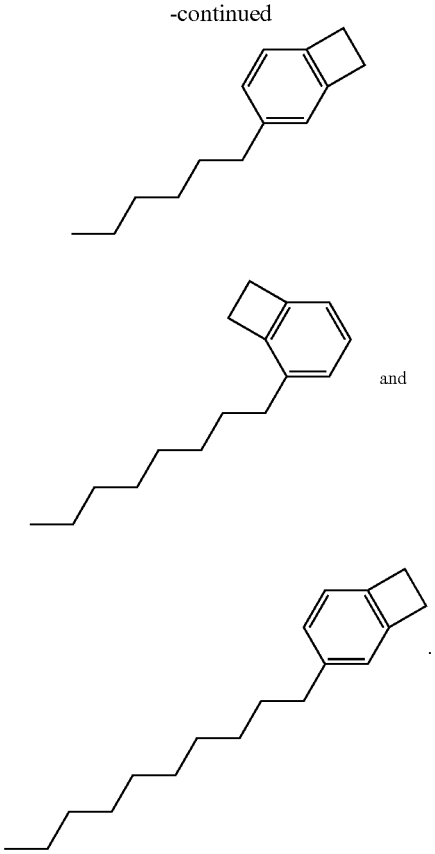
and
* * * * *